(12) United States Patent
Chiu

(10) Patent No.: US 12,439,613 B2
(45) Date of Patent: Oct. 7, 2025

(54) MANUFACTURING METHOD MEMORY DEVICE HAVING LATERALLY EXTENDING CAPACITORS OF DIFFERENT LENGTHS AND LEVELS

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 753 days.

(21) Appl. No.: 17/856,458

(22) Filed: Jul. 1, 2022

(65) Prior Publication Data

US 2024/0006471 A1 Jan. 4, 2024

(51) Int. Cl.
H10D 1/00 (2025.01)
H10B 12/00 (2023.01)
H10D 1/68 (2025.01)

(52) U.S. Cl.
CPC ......... H10D 1/042 (2025.01); H10B 12/0335 (2023.02); H10D 1/043 (2025.01); H10D 1/714 (2025.01); H10D 1/716 (2025.01)

(58) Field of Classification Search
CPC ........ H10D 1/042; H10D 1/716; H10D 1/714; H10D 1/043; H10B 12/0335
See application file for complete search history.

(56) References Cited

U.S. PATENT DOCUMENTS

| | | |
|---|---|---|
| 9,455,313 B1 | 9/2016 | Christensen et al. |
| 2011/0241167 A1 | 10/2011 | Feustel et al. |
| 2017/0250243 A1 | 8/2017 | Lee et al. |
| 2018/0254218 A1 | 9/2018 | Cheng et al. |
| 2020/0083227 A1 | 3/2020 | Leobandung |
| 2021/0005381 A1 | 1/2021 | Lu et al. |
| 2023/0085846 A1 | 3/2023 | Li |
| 2023/0299126 A1 | 9/2023 | Chen et al. |
| 2024/0008250 A1* | 1/2024 | Chiu ................ H10B 12/03 |

FOREIGN PATENT DOCUMENTS

| | | |
|---|---|---|
| CN | 109148443 A | 1/2019 |
| FR | 2890783 A1 | 3/2007 |
| JP | 2000216362 A | 8/2000 |
| KR | 20200138638 A | 12/2020 |
| TW | 202006926 A | 2/2020 |
| TW | 202114156 A | 4/2021 |
| WO | WO2021/053957 A1 | 3/2021 |

* cited by examiner

*Primary Examiner* — Richard A Booth
(74) *Attorney, Agent, or Firm* — MUNCY, GEISSLER, OLDS & LOWE, P.C.

(57) ABSTRACT

The present application provides a method of manufacturing a memory device. The method includes steps of providing a semiconductor substrate; disposing a first insulating layer over the semiconductor substrate; disposing a first bottom electrode over the first insulating layer; disposing a first dielectric layer over the first bottom electrode; removing a portion of the first dielectric layer to form a first recess extending through the first dielectric layer; disposing a first capacitor dielectric conformal to the first recess and over the first bottom electrode; and forming a first top electrode within the first recess and surrounded by the first capacitor dielectric, wherein the first capacitor dielectric and the first top electrode extend laterally over the first bottom electrode and the semiconductor substrate.

14 Claims, 56 Drawing Sheets

MANUFACTURING METHOD MEMORY DEVICE HAVING LATERALLY EXTENDING CAPACITORS OF DIFFERENT LENGTHS AND LEVELS

TECHNICAL FIELD

The present disclosure relates to a manufacturing method of a memory device, and more particularly, to a manufacturing method of a memory device having capacitors extending laterally along the memory device and configured in different lengths and in different levels.

DISCUSSION OF THE BACKGROUND

Dynamic random-access memory (DRAM) is a type of semiconductor arrangement for storing bits of data in separate capacitors within an integrated circuit (IC). DRAM is commonly formed as capacitor DRAM cells. A DRAM memory circuit is manufactured by replicating DRAM cells on a single semiconductor wafer. Each DRAM cell can store a bit of data. The DRAM cell consists of a storage capacitor and an access transistor.

Over the past few decades, as semiconductor fabrication technology has continuously improved, sizes of DRAM memory circuits have been correspondingly reduced. As a size of the DRAM cell is reduced to a few nanometers in length, strength of a structure of the DRAM cell is a concern. Collapse or wobbling may happen during manufacturing. It is therefore desirable to develop improvements that address related manufacturing challenges.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device. The memory device includes a semiconductor substrate; a first insulating layer disposed over the semiconductor substrate; a first bottom electrode disposed over the first insulating layer; a first dielectric layer disposed over the first bottom electrode; a first recess extending through the first dielectric layer; a first capacitor dielectric conformal to the first recess and in contact with the first bottom electrode; and a first top electrode disposed within the first recess and surrounded by the first capacitor dielectric, wherein the first capacitor dielectric and the first top electrode extend laterally over the first bottom electrode and the semiconductor substrate.

In some embodiments, the first capacitor dielectric includes a first nitride liner conformal to the first recess and a first high-k liner disposed over the first nitride liner.

In some embodiments, the first top electrode and the first bottom electrode include tungsten (W).

In some embodiments, the memory device further comprises a second insulating layer disposed over the first top electrode and the first dielectric layer; a second bottom electrode disposed over the second insulating layer; a second dielectric layer disposed over the second bottom electrode; a second recess extending through the second dielectric layer; a second capacitor dielectric conformal to the second recess and in contact with the second bottom electrode; and a second top electrode disposed within the second recess and surrounded by the second capacitor dielectric, wherein the second capacitor dielectric and the second top electrode extend laterally over the second bottom electrode and the semiconductor substrate.

In some embodiments, the second top electrode is offset from the first top electrode.

In some embodiments, the memory device further comprises a third insulating layer disposed over the second top electrode and the second dielectric layer; a third bottom electrode disposed over the third insulating layer; a third dielectric layer disposed over the third bottom electrode; a third recess extending through the third dielectric layer; a third capacitor dielectric conformal to the third recess and in contact with the third bottom electrode; and a third top electrode disposed within the third recess and surrounded by the third capacitor dielectric, wherein the third capacitor dielectric and the third top electrode extend laterally over the third bottom electrode and the semiconductor substrate.

In some embodiments, the third top electrode is disposed above the first top electrode and the second top electrode.

In some embodiments, the third top electrode is vertically aligned with the first top electrode.

In some embodiments, the second top electrode is offset from the third top electrode.

In some embodiments, the third top electrode and the first top electrode are electrically connected in parallel.

In some embodiments, a portion of the second dielectric layer disposed between the first top electrode and the third top electrode.

In some embodiments, a length of the first top electrode is substantially greater than a length of the third top electrode.

In some embodiments, the memory device further comprises a fourth recess extending through the first dielectric layer; a fourth capacitor dielectric conformal to the fourth recess and in contact with the first bottom electrode; and a fourth top electrode disposed within the fourth recess and surrounded by the fourth capacitor dielectric, wherein the fourth capacitor dielectric and the fourth top electrode extend laterally over the first bottom electrode and the semiconductor substrate.

In some embodiments, the first top electrode and the fourth top electrode are electrically connected to the first bottom electrode.

In some embodiments, a length of the first top electrode is substantially equal to a length of the fourth top electrode.

Another aspect of the present disclosure provides a memory device. The memory device includes a semiconductor substrate; a first insulating layer disposed over the semiconductor substrate; a first bottom electrode disposed over the first insulating layer; a first dielectric layer disposed over the first bottom electrode; a first recess extending through the first dielectric layer; a second recess extending through the first dielectric layer; a first capacitor dielectric conformal to the first recess and in contact with the first bottom electrode; a second capacitor dielectric conformal to the second recess and in contact with the first bottom electrode; a first top electrode disposed within the first recess and surrounded by the first capacitor dielectric; and a second top electrode disposed within the second recess and surrounded by the second capacitor dielectric, wherein the first capacitor dielectric, the first top electrode, the second capacitor dielectric and the second top electrode extend laterally over the first bottom electrode and the semiconductor substrate.

In some embodiments, the first capacitor dielectric and the second capacitor dielectric are electrically connected in parallel, and the first top electrode and the second top electrode are electrically connected in parallel.

In some embodiments, a top surface of the first top electrode is substantially coplanar with a top surface of the second top electrode.

In some embodiments, the memory device further comprises a second insulating layer disposed over the first dielectric layer, the first top electrode and the second top electrode; and a second bottom electrode disposed over the second insulating layer.

In some embodiments, the first top electrode and the second top electrode are disposed between the first bottom electrode and the second insulating layer.

Another aspect of the present disclosure provides a method of manufacturing a memory device. The method includes steps of providing a semiconductor substrate; disposing a first insulating layer over the semiconductor substrate; disposing a first bottom electrode over the first insulating layer; disposing a first dielectric layer over the first bottom electrode; removing a portion of the first dielectric layer to form a first recess extending through the first dielectric layer; disposing a first capacitor dielectric conformal to the first recess and over the first bottom electrode; and forming a first top electrode within the first recess and surrounded by the first capacitor dielectric, wherein the first capacitor dielectric and the first top electrode extend laterally over the first bottom electrode and the semiconductor substrate.

In some embodiments, the disposing of the first capacitor dielectric includes disposing a first nitride liner conformal to the first recess, and then disposing a first high-k liner over the first nitride liner.

In some embodiments, the removal of the portion of the first dielectric layer includes removing a first portion of the first dielectric layer to form an opening partially through the first dielectric layer, and then removing a second portion of the first dielectric layer exposed through the opening to form the first recess.

In some embodiments, the second portion of the first dielectric layer is removed by an isotropic wet etching process.

In some embodiments, at least a portion of the first bottom electrode is exposed through the first dielectric layer after the formation of the first recess.

In some embodiments, the method further comprises disposing a second insulating layer over the first top electrode and the first dielectric layer; disposing a second bottom electrode over the second insulating layer; disposing a second dielectric layer over the second bottom electrode; removing a portion of the second dielectric layer to form a second recess extending through the second dielectric layer; disposing a second capacitor dielectric conformal to the second recess and over the second bottom electrode; and forming a second top electrode within the second recess and surrounded by the second capacitor dielectric, wherein the second capacitor dielectric and the second top electrode extend laterally over the second bottom electrode and the semiconductor substrate.

In some embodiments, the portion of the second dielectric layer is offset from the portion of the first dielectric layer, and the first recess is offset from the second recess.

In some embodiments, the method further comprises disposing a first patterned photoresist layer over the second insulating layer; and removing portions of the second insulating layer, the second bottom electrode and the second dielectric layer exposed through the first patterned photoresist layer to expose at least a portion of the first top electrode.

In some embodiments, the method further comprises disposing a dielectric material over the portion of the first top electrode; and forming a conductive plug extending through the dielectric material and contacting the first top electrode.

In some embodiments, the method further comprises disposing a second photoresist layer over the second dielectric layer; disposing a mask over the second photoresist layer; providing a predetermined electromagnetic radiation over the mask; irradiating the mask with the predetermined electromagnetic radiation; and forming a first patterned photoresist layer from the second photoresist layer.

In some embodiments, the predetermined electromagnetic radiation is ultraviolet (UV).

In some embodiments, the mask includes a first region having a first transmission rate equal to an amount of the predetermined electromagnetic radiation allowed to pass through the first region, and a second region having a second transmission rate equal to an amount of the predetermined electromagnetic radiation allowed to pass through the second region, wherein the first transmission rate is substantially different from the second transmission rate.

In some embodiments, the first transmission rate is substantially greater than the second transmission rate.

In some embodiments, the formation of the first patterned photoresist layer includes removing a portion of the second photoresist layer under the first region of the mask to form a third recess and removing another portion of the second photoresist layer under the second region of the mask to form a fourth recess.

In some embodiments, the method further comprises removing portions of the first dielectric layer, the second bottom electrode and the second dielectric layer under the third recess to form a first trench exposing a portion of the first bottom electrode, and removing a portion of the second dielectric layer under the fourth recess to form a second trench exposing a portion of the second bottom electrode.

In conclusion, because each of the capacitors extends laterally over a semiconductor substrate instead of standing upright over the semiconductor substrate, collapse of the capacitors can be prevented. Further, the top electrodes of the capacitors arranged in different levels and vertically aligned with each other are configured in different lengths, and the bottom electrodes of the capacitors extend over the semiconductor substrate and are configured in planar shapes. As such, all of the capacitors can be electrically connected in parallel instead of in series. Therefore, performance of the memory device and a process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
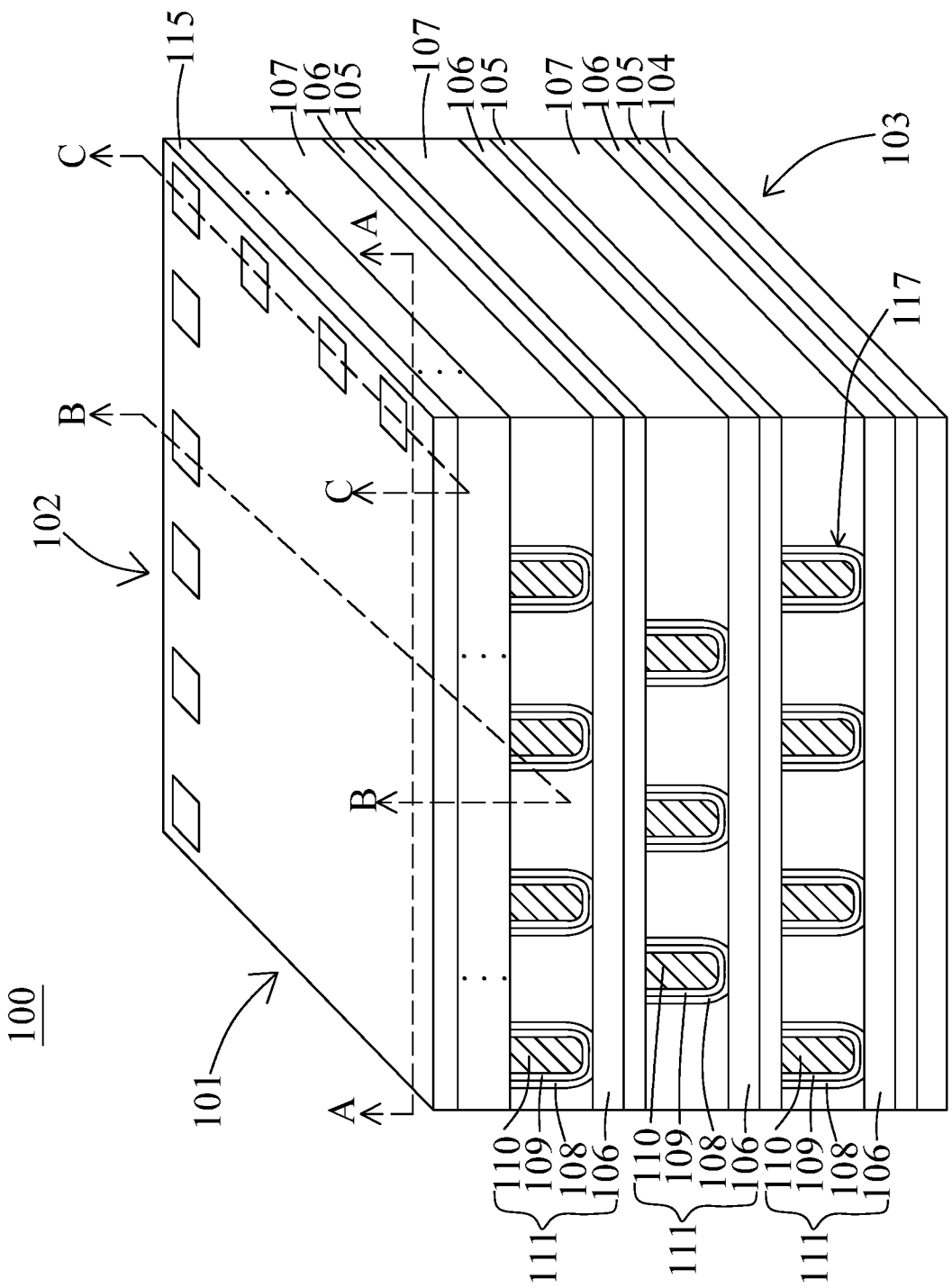
FIG. 1 is an isometric view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
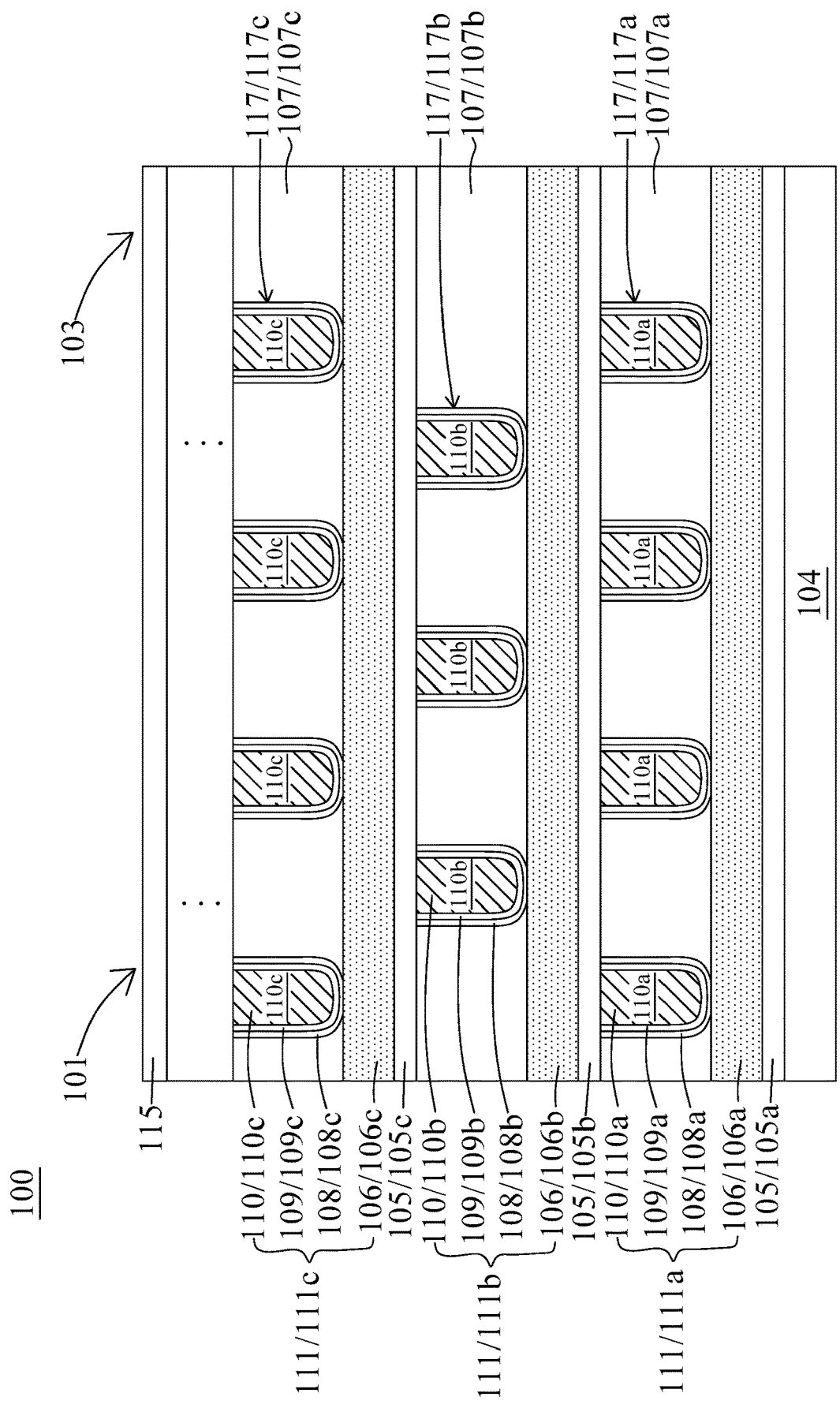
FIG. 2 is a cross-sectional side view of the memory device along a line A-A in FIG. 1.
Figure 3:
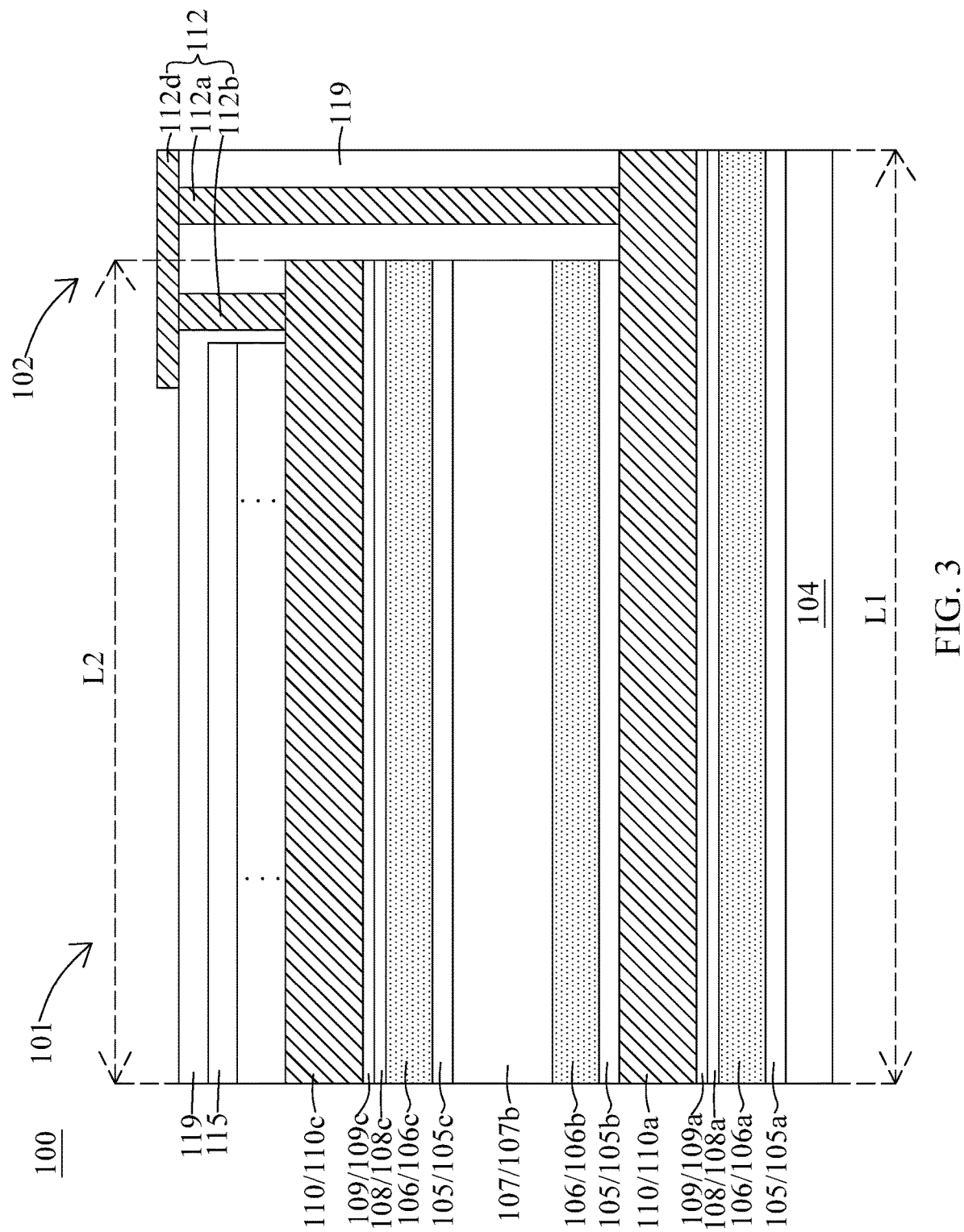
FIG. 3 is a cross-sectional side view of the memory device along a line B-B in FIG. 1.
Figure 5:
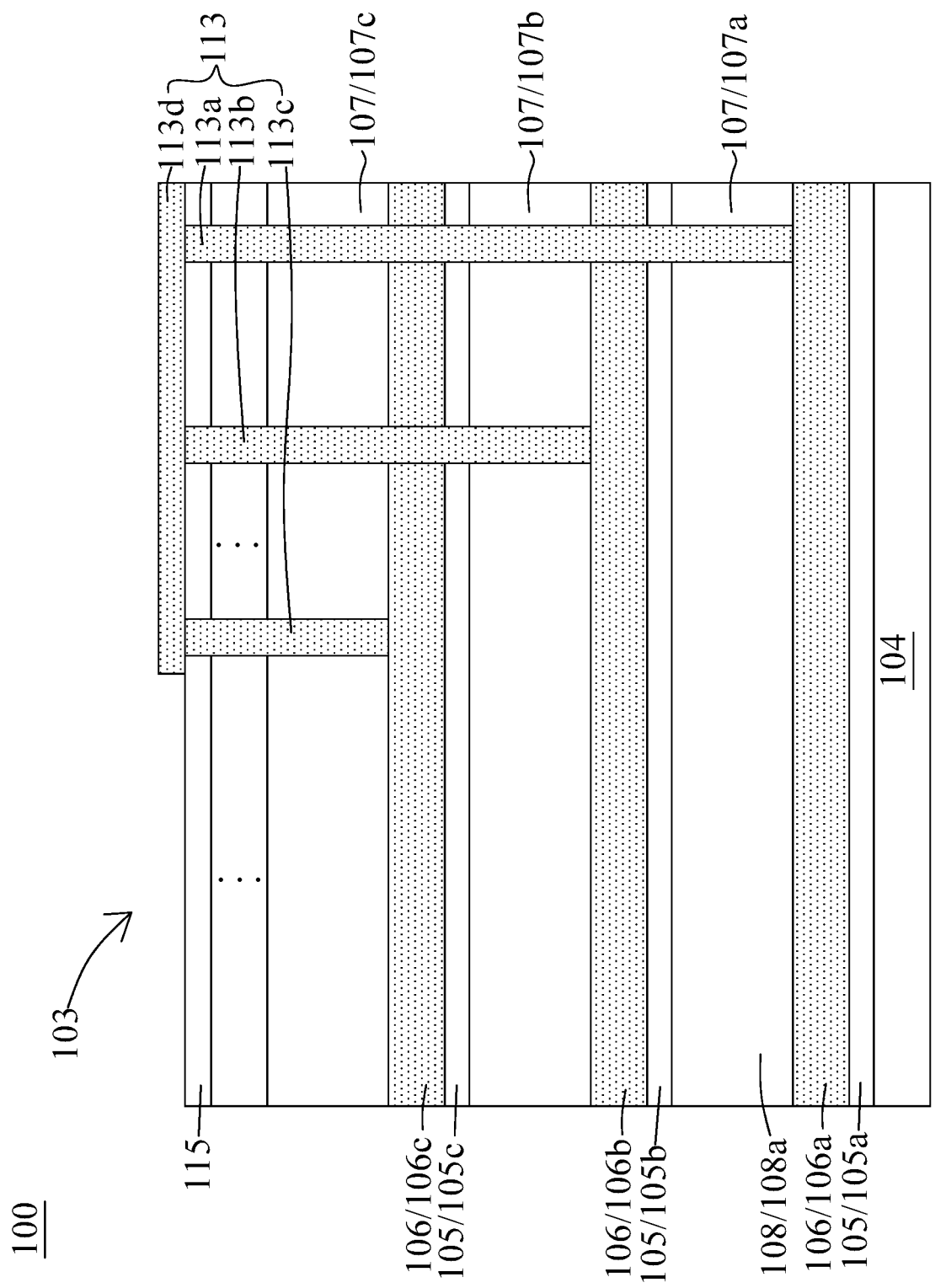
FIG. 5 is a cross-sectional side view of the memory device along a line C-C in FIG. 1.

FIG. 1 is a schematic isometric view of a memory device 100 in accordance with some embodiments of the present disclosure. FIG. 2 is a schematic cross-sectional side view of the memory device 100 along a line A-A in FIG. 1. FIG. 3 is a schematic cross-sectional side view of the memory device 100 along a line B-B in FIG. 1. FIG. 5 is a schematic cross-sectional side view of the memory device 100 along a line C-C in FIG. 1. In some embodiments, the memory device 100 includes several unit cells arranged in rows and columns.

In some embodiments, the memory device 100 includes a semiconductor substrate 104. In some embodiments, the semiconductor substrate 104 is semiconductive in nature. In some embodiments, the semiconductor substrate 104 is a semiconductor wafer (e.g., a silicon wafer) or a semiconductor-on-insulator (SOI) wafer (e.g., a silicon-on-insulator wafer). In some embodiments, the semiconductor substrate 104 is a silicon substrate.

In some embodiments, the semiconductor substrate 104 is defined with a peripheral region (not shown) and an array region 101. In some embodiments, the array region 101 is at least partially surrounded by the peripheral region. In some embodiments, the peripheral region is adjacent to a periphery of the semiconductor substrate 104, and the array region 101 is adjacent to a central area of the semiconductor substrate 104. In some embodiments, the array region 101 may include electronic components such as capacitors, transistors or the like. In some embodiments, several capacitors 111 are disposed within the array region 101. In some embodiments, a boundary is disposed between the peripheral region and the array region 101.

In some embodiments, a top electrodes pick up region 102 and a bottom electrodes pick up region 103 are further defined in the array region 101. In some embodiments, top electrodes 110 of the capacitors 111 are connected to the top electrodes pick up region 102, such that electrical signals from the top electrodes 110 can be gathered and picked up at the top electrodes pick up region 102. In some embodiments, bottom electrodes 106 of the capacitors 111 are connected to the bottom electrodes pick up region 103, such that electrical signals from the bottom electrodes 106 can be gathered and picked up at the bottom electrodes pick up region 103.

In some embodiments, the memory device 100 includes an insulating layer 105 disposed over the semiconductor substrate 104. In some embodiments, the insulating layer 105 is formed of a dielectric material, such as silicon oxide or the like. In some embodiments, a first insulating layer 105a is disposed on the semiconductor substrate 104.

In some embodiments, the memory device 100 includes a bottom electrode 106 disposed over the insulating layer 105. In some embodiments, the bottom electrode 106 includes conductive material such as tungsten (W) or the like. In some embodiments, a first bottom electrode 106a is disposed on the first insulating layer 105a. In some embodiments, the first bottom electrode 106a covers the first insulating layer 105a.

In some embodiments, the memory device 100 includes a dielectric layer 107 disposed over the bottom electrode 106. In some embodiments, the dielectric layer 107 is formed of a dielectric material, such as silicon oxide or the like. In some embodiments, a first dielectric layer 107a is disposed on the first bottom electrode 106a. In some embodiments, the memory device 100 includes a recess 117 extending through and laterally within the dielectric layer 107. In some embodiments, the recess 117 exposes at least a portion of the bottom electrode 106. In some embodiments, the portion of the bottom electrode 106 is in a strip shape. In some embodiments, a first recess 117a extends through the first dielectric layer 107a and exposes at least a portion of the first bottom electrode 106a. In some embodiments, the first recess 117a extends laterally within the first dielectric layer 107a.

In some embodiments, the memory device 100 includes a capacitor dielectric (108 and 109) disposed conformal to the recess 117 and in contact with the bottom electrode 106. In some embodiments, the capacitor dielectric (108 and 109) is disposed along a sidewall of the recess 117 and on the bottom electrode 106 exposed through the dielectric layer 107. In some embodiments, the capacitor dielectric (108 and 109) extends laterally within and along the recess 117. In some embodiments, the capacitor dielectric (108 and 109) has a cross-section in a U shape. In some embodiments, the capacitor dielectric (108 and 109) extends laterally over the bottom electrode 106 and the semiconductor substrate 104.

In some embodiments, the capacitor dielectric (108 and 109) includes a nitride liner 108 conformal to the recess 117 and a high-k (high dielectric constant) liner 109 over the nitride liner 108. In some embodiments, the nitride liner 108 includes titanium nitride (TiN) or the like, and the high-k liner 109 includes high-k dielectric material such as hafnium dioxide ($HfO_2$), zirconium oxide ($ZrO_2$), titanium dioxide ($TiO_2$) or the like. In some embodiments, a first capacitor dielectric (108a and 109a) is disposed conformal to the first recess 117a and on the first bottom electrode 106a exposed through the first dielectric layer 107a. In some embodiments, the first capacitor dielectric (108a and 109a) extends laterally over the first bottom electrode 106a and the semiconductor substrate 104.

In some embodiments, the first capacitor dielectric (108a and 109a) includes a first nitride liner 108a conformal to the first recess 117a and a first high-k liner 109a over the first nitride liner 108a. In some embodiments, the first nitride liner 108a is in contact with the first bottom electrode 106a exposed through the first dielectric layer 107. In some embodiments, the first nitride liner 108a and the first high-k liner 109a extend laterally within and along the first recess 117a.

In some embodiments, the memory device 100 includes a top electrode 110 disposed within the recess 117 and surrounded by the capacitor dielectric (108 and 109). In some embodiments, the top electrode 110 extends laterally within and along the recess 117. In some embodiments, the top electrode 110 extends laterally over the bottom electrode 106 and the semiconductor substrate 104. In some embodiments, the top electrode 110 includes conductive material such as tungsten (W) or the like. In some embodiments, a first top electrode 110a is disposed within the first recess 117a and is surrounded by the first capacitor dielectric (108a and 109a). In some embodiments, the first top electrode 110a extends laterally over the first bottom electrode 106a and the semiconductor substrate 104.

In some embodiments, a first capacitor 111a is disposed at a first level. In some embodiments, the first capacitor 111a includes the first bottom electrode 106a, the first capacitor dielectric (108a and 109a) and the first top electrode 110a. In some embodiments, the first capacitor 111a is disposed on the first insulating layer 105a. In some embodiments, the first capacitor 111a and the first insulating layer 105a are deemed as a first level of the memory device 100.

In some embodiments, the memory device 100 includes a second insulating layer 105b disposed over the first top electrode 110a and the first dielectric layer 107a. In some embodiments, the second insulating layer 105b is formed of a dielectric material, such as silicon oxide or the like. In some embodiments, the first insulating layer 105a and the second insulating layer 105b include same material. In some embodiments, the first insulating layer 105a and the second insulating layer 105b are in similar configurations.

In some embodiments, the memory device 100 includes a second bottom electrode 106b disposed over the second insulating layer 105b. In some embodiments, the second bottom electrode 106b includes conductive material such as tungsten (W) or the like. In some embodiments, the second bottom electrode 106b covers the second insulating layer 105b. In some embodiments, the first bottom electrode 106a and the second bottom electrode 106b are in similar configurations.

In some embodiments, the memory device 100 includes a second dielectric layer 107b disposed over the second bottom electrode 106b. In some embodiments, the second dielectric layer 107b is formed of a dielectric material, such as silicon oxide or the like. In some embodiments, the first dielectric layer 107a and the second dielectric layer 107b are in similar configurations. In some embodiments, the memory device 100 includes a second recess 117b extending through the second dielectric layer 107b and exposing at least a portion of the second bottom electrode 106b. In some embodiments, the second recess 117b extends laterally within the second dielectric layer 107b. In some embodiments, the first recess 117a and the second recess 117b are in similar configurations.

In some embodiments, the memory device 100 includes a second capacitor dielectric (108b and 109b) conformal to the second recess 117b and in contact with the second bottom electrode 106b. In some embodiments, the second capacitor dielectric (108b and 109b) extends laterally over the second bottom electrode 106b and the semiconductor substrate 104. In some embodiments, the second capacitor dielectric (108b and 109b) includes a second nitride liner 108b conformal to the second recess 117b and a second high-k liner 109b over the second nitride liner 108b. In some embodiments, the second nitride liner 108b includes titanium nitride (TiN) or the like, and the second high-k liner 109b includes high-k dielectric material such as hafnium dioxide ($HfO_2$), zirconium oxide ($ZrO_2$), titanium dioxide ($TiO_2$) or the like. In some embodiments, the first capacitor dielectric (108a and 109a) and the second capacitor dielectric (108b and 109b) are in similar configurations.

In some embodiments, the memory device 100 includes a second top electrode 110b disposed within the second recess 117b and surrounded by the second capacitor dielectric (108b and 109b). In some embodiments, the second top electrode 110b extends laterally over the second bottom electrode 106b and the semiconductor substrate 104. In some embodiments, the second top electrode 110b includes conductive material such as tungsten (W) or the like. In some embodiments, the first top electrode 110a and the second top electrode 110b are in similar configurations. In some embodiments, the second top electrode 110b is above the first top electrode 110a. In some embodiments, the second top electrode 110b is offset from the first top electrode 110a.

In some embodiments, a second capacitor 111b is disposed at a second level. In some embodiments, the second capacitor 111b includes the second bottom electrode 106b, the second capacitor dielectric (108b and 109b) and the second top electrode 110b. In some embodiments, the second capacitor 111b is disposed on the second insulating layer 105b. In some embodiments, the second capacitor 111b and the second insulating layer 105b are deemed as a second level of the memory device 100.

In some embodiments, the memory device 100 includes a third insulating layer 105c, a third bottom electrode 106c, a third dielectric layer 107c, a third recess 117c, a third capacitor dielectric (108c and 109c) and a third top electrode 110c. In some embodiments, the third insulating layer 105 is disposed over the second top electrode 110b and the second dielectric layer 107b. In some embodiments, the third bottom electrode 106c is disposed over the third insulating layer 105c. In some embodiments, the third dielectric layer 107c is disposed over the third bottom electrode 106c. In some embodiments, the third recess 117c extends through the third dielectric layer 107c. In some embodiments, the third capacitor dielectric (108c and 109c) is conformal to the third recess 117c and in contact with the third bottom electrode 106c. In some embodiments, the third top electrode 110c is disposed within the third recess 117c and surrounded by the third capacitor dielectric (108c and 109c). In some embodiments, the third capacitor dielectric (108c and 109c) and the third top electrode 110c extend laterally over the third bottom electrode 106c and the semiconductor substrate 104.

In some embodiments, the third insulating layer 105c, the third bottom electrode 106c, the third dielectric layer 107c, the third recess 117c, the third capacitor dielectric (108c and 109c) and the third top electrode 110c are in configurations similar to those of the first insulating layer 105a, the first bottom electrode 106a, the first dielectric layer 107a, the first recess 117a, the first capacitor dielectric (108a and 109a) and the first top electrode 110a, respectively. In some embodiments, the third insulating layer 105c, the third bottom electrode 106c, the third dielectric layer 107c, the third recess 117c, the third capacitor dielectric (108c and 109c) and the third top electrode 110c are in configurations similar to those of the second insulating layer 105b, the second bottom electrode 106b, the second dielectric layer 107b, the second recess 117b, the second capacitor dielectric (108b and 109b) and the second top electrode 110b, respectively.

In some embodiments, the third top electrode 110c is disposed above the first top electrode 110a and the second top electrode 110b. In some embodiments, the third top electrode 110c is vertically aligned with the first top electrode 110a. In some embodiments, the third top electrode 110c is offset from the second top electrode 110b. In some embodiments, a portion of the second dielectric layer 107b is disposed between the first top electrode 110a and the third top electrode 110c.

In some embodiments, a third capacitor 111c is disposed at a third level. In some embodiments, the third capacitor 111c includes the third bottom electrode 106c, the third capacitor dielectric (108c and 109c) and the third top electrode 110c. In some embodiments, the third capacitor 111c is disposed on the third insulating layer 105c. In some embodiments, the third capacitor 111c and the third insulating layer 105c are deemed as a third level of the memory device 100.

In some embodiments, the memory device 100 includes several of the first recesses 117a extending through the first dielectric layer 107a, several of the first capacitor dielectrics (108a and 109a) conformal to the first recesses 117a, respectively, and in contact with the first bottom electrode 106a, and several of the first top electrodes 110a disposed within the first recesses 117a, respectively, and surrounded by the first capacitor dielectrics (108a and 109a), respectively. In some embodiments, the first top electrodes 110a are electrically connected to the first bottom electrode 106a. In some embodiments, the first capacitor dielectrics (108a and 109a) are electrically connected in parallel. In some embodiments, the first top electrodes 110a are electrically connected in parallel. In some embodiments, top surfaces of the first top electrodes 110a are substantially coplanar with each other. In some embodiments, the first top electrodes 110a are disposed between the first bottom electrode 106a and the second insulating layer 105b. In some embodiments, lengths L1 of the first top electrodes 110a are substantially equal.

Figure 4:
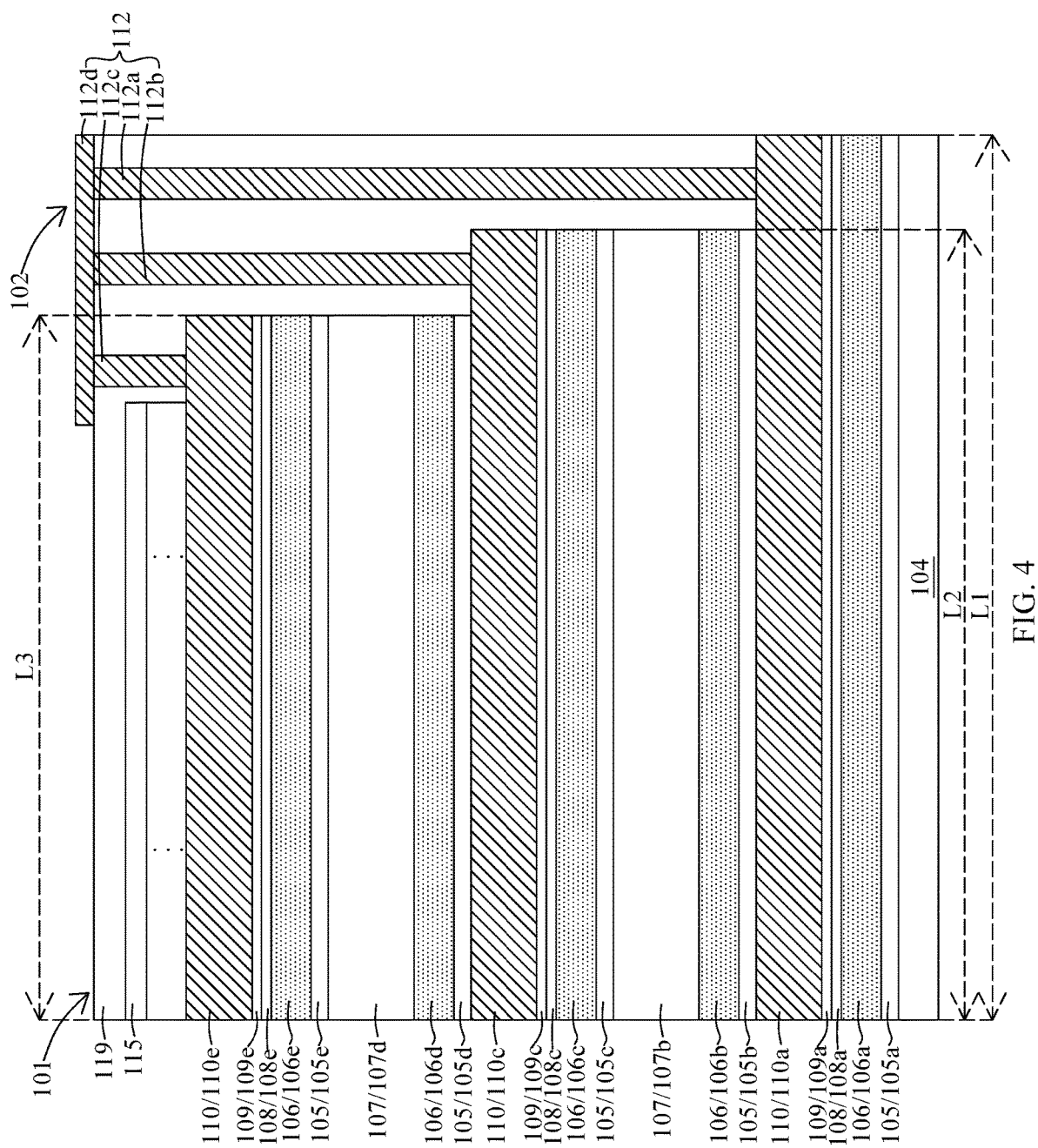
FIG. 4 is a cross-sectional side view of a memory device in accordance with another embodiment of the present disclosure.

In some embodiments, as shown in FIGS. 1, 2, 3 and 5, the memory device 100 has capacitors 111 arranged in three levels. However, it can be understood that the memory device 100 can have more levels and the capacitors 1l can be stacked in additional levels. In some embodiments, as shown in FIG. 4, the memory device 100 has capacitors 111 arranged in five levels. In some embodiments, as shown in FIG. 4, a fourth insulating layer 105d, a fourth bottom electrode 106d, a fourth dielectric layer 107d, a fourth capacitor dielectric (not shown) and a fourth top electrode (not shown), a fifth insulating layer 105e, a fifth bottom electrode 106e, a fifth dielectric layer 107e, a fifth capacitor dielectric (108e and 109e) and a fifth top electrode (110e), are sequentially formed.

In some embodiments, the memory device 100 includes a last insulating layer 115 covering the capacitors 111. In some embodiments, the last insulating layer 115 is formed of a dielectric material, such as silicon oxide or the like. In some embodiments, the last insulating layer 115 is disposed over the third dielectric layer 107c and the third top electrode 110c. In some embodiments, the last insulating layer 115 is disposed over the fifth dielectric layer 107e and the fifth top electrode 110e.

In some embodiments, the last insulating layer 115 is disposed on the first top electrode 110a and the third top electrode 110c at the top electrode pick up region 102. In some embodiments, a length L1 of the first top electrode 110a is substantially greater than a length L2 of the third top electrode 110c. In some embodiments, a part of the memory device 100 at the top electrode pick up region 102 is in a stair configuration. In some embodiments, the third top electrode 110c and the first top electrode 110a are electrically connected in parallel by a first conductive feature 112. In some embodiments, the first conductive feature 112 is disposed at the top electrode pick up region 102 and is at least partially exposed through a dielectric material 119 on the last insulating layer 115. In some embodiments, the first conductive feature 112 includes conductive material such as copper, silver or the like.

In some embodiments, the first conductive feature 112 includes a first conductive via 112a in contact with the first top electrode 110a, a second conductive via 112b in contact with the third top electrode 110c, and a top electrode plate 112d disposed on the dielectric material 119. In some embodiments, the first conductive via 112a and the second conductive via 112b extend through the dielectric material 119. In some embodiments, a height of the first conductive via 112a is substantially greater than a height of the second conductive via 112b.

In some embodiments, as shown in FIG. 4, the last insulating layer 115 is disposed over the first top electrode 110a, the third top electrode 110c and the fifth top electrode 110e at the top electrode pick up region 102. In some embodiments, the length L1 of the first top electrode 110a is substantially greater than the length L2 of the third top electrode 110c, and the length L2 is substantially greater than a length L3 of the fifth top electrode 110e. In some embodiments, a part of the memory device 100 at the top electrode pick up region 102 is in a stair configuration.

In some embodiments, the fifth top electrode 110e, the third top electrode 110c and the first top electrode 110a are electrically connected in parallel by the first conductive feature 112. In some embodiments, the first conductive feature 112 is disposed at the top electrode pick up region 102 and is surrounded by a dielectric material 119 on the last insulating layer 115. In some embodiments, the first conductive feature 112 includes conductive material such as copper, silver or the like.

In some embodiments, the first conductive feature 112 includes the first conductive via 112a in contact with the first top electrode 110a, the second conductive via 112b in contact with the third top electrode 110c, a third conductive via 112c in contact with the fifth top electrode 110e, and a top electrode plate 112d disposed on the dielectric material 119. In some embodiments, the first conductive via 112a, the second conductive via 112b and the third conductive via 112c extend through the dielectric material 119. In some embodiments, the height of the first conductive via 112a is substantially greater than the height of the second conductive via 112b, and the height of the second conductive via 112b is substantially greater than a height of the third conductive via 112c.

In some embodiments, as shown in FIG. 5, the last insulating layer 115 is disposed on the third dielectric layer 107c at the bottom electrodes pick up region 103. In some embodiments, the first bottom electrode 106a, the second bottom electrode 106b and the third bottom electrode 106c are electrically connected in parallel by a second conductive feature 113. In some embodiments, the second conductive feature 113 is disposed at the bottom electrodes pick up region 103 and is at least partially exposed through the last insulating layer 115. In some embodiments, the second conductive feature 113 includes conductive material such as copper, silver or the like.

In some embodiments, the second conductive feature 113 includes a fourth conductive via 113a in contact with the first bottom electrode 106a, a fifth conductive via 113b in contact with the second bottom electrode 106b, a sixth conductive via 113c in contact with the third bottom electrode 106c, and a bottom electrode plate 113d disposed on the last insulating layer 115. In some embodiments, the fourth conductive via 113a extends through the first dielectric layer 107a, the second insulating layer 105b, the second bottom electrode 106b, the second dielectric layer 107b, the third insulating layer 105c, the third bottom electrode 106c, the third dielectric layer 107c and the last insulating layer 115.

In some embodiments, the fifth conductive via 113b extends through the second dielectric layer 107b, the third insulating layer 105c, the third bottom electrode 106c, the third dielectric layer 107c and the last insulating layer 115. In some embodiments, the sixth conductive via 113c extends through the third dielectric layer 107c and the last insulating layer 115. In some embodiments, the bottom electrode plate 113d is disposed over the last insulating layer 115 and is in contact with the fourth conductive via 113a, the fifth conductive via 113b and the sixth conductive via 113c. In some embodiments, a height of the fourth conductive via 113a is substantially greater than a height of the fifth conductive via 113b. In some embodiments, the height of the fifth conductive via 113b is substantially greater than a height of the sixth conductive via 113c.

Figure 6:
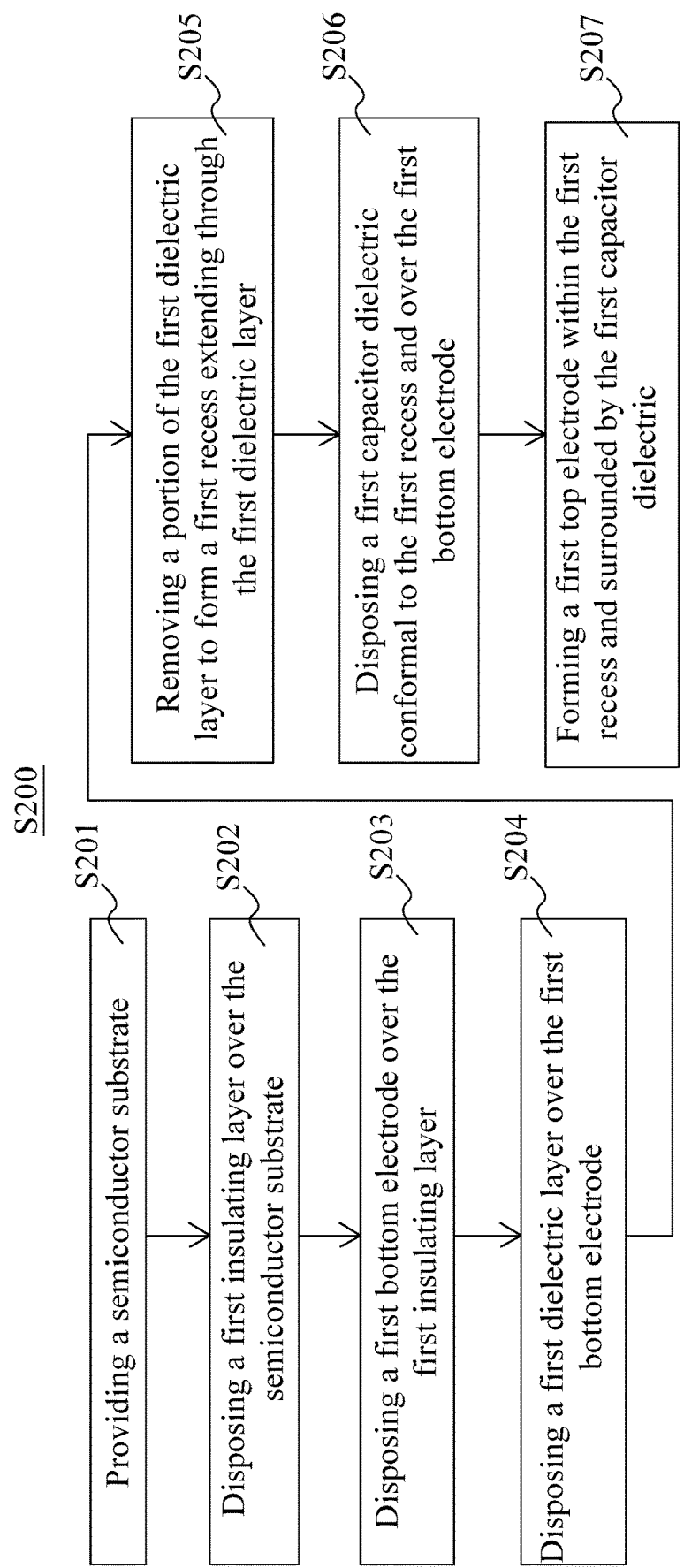
FIG. 6 is a flow diagram illustrating a method of manufacturing the memory device of FIG. 1 in accordance with some embodiments of the present disclosure.

FIG. 6 is a flow diagram illustrating a method S200 of manufacturing an intermediate structure of a memory device 100 in accordance with some embodiments of the present disclosure, and FIGS. 7 to 28 illustrate cross-sectional views of intermediate stages in formation of the intermediate structure of the memory device 100 as shown in FIG. 1 along the line A-A in accordance with some embodiments of the present disclosure.

The stages shown in FIGS. 7 to 28 are also illustrated schematically in the flow diagram in FIG. 6. In following discussion, the fabrication stages shown in FIGS. 7 to 28 are discussed in reference to process steps shown in FIG. 6. The method S200 includes a number of operations, and description and illustration are not deemed as a limitation to a sequence of the operations. The method S200 includes a number of steps (S201, S202, S203, S204, S205, S206 and S207).

Figure 7:
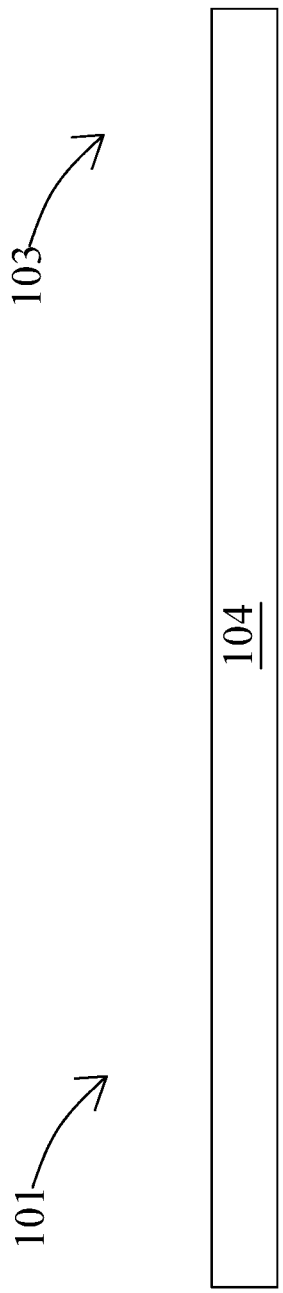
FIGS. 7 to 28 illustrate cross-sectional views of intermediate stages in the formation of the memory device of FIG. 1 along a line A-A in accordance with some embodiments of the present disclosure.

Referring to FIG. 7, a semiconductor substrate 104 is provided according to step S201 in FIG. 6. In some embodiments, the semiconductor substrate 104 is semiconductive in nature. In some embodiments, the semiconductor substrate 104 is a semiconductor wafer (e.g., a silicon wafer) or a semiconductor-on-insulator (SOI) wafer (e.g., a silicon-on-insulator wafer). In some embodiments, the semiconductor substrate 104 is a silicon substrate. In some embodiments, the semiconductor substrate 104 is defined with a peripheral region (not shown) and an array region 101. In some embodiments, a top electrodes pick up region 102 (shown in FIG. 2) and a bottom electrodes pick up region 103 are further defined in the array region 101.

Figure 8:
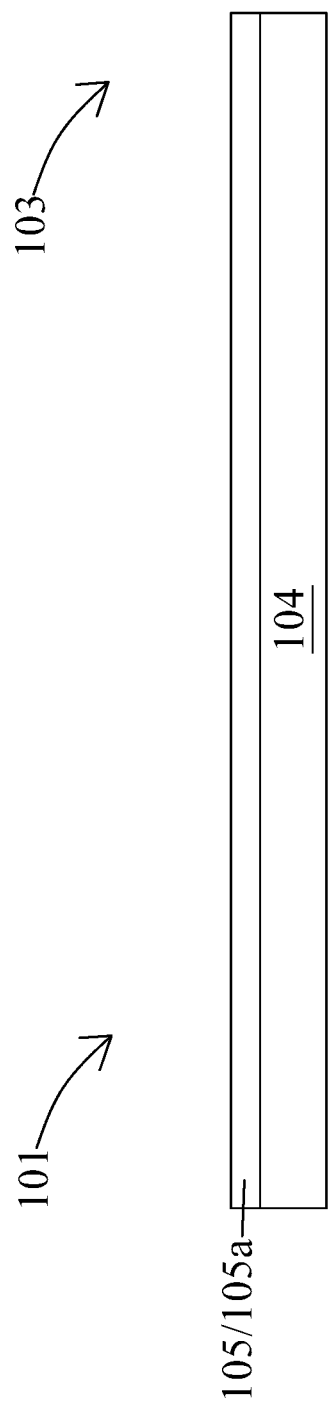

Referring to FIG. 8, a first insulating layer 105a is disposed over the semiconductor substrate 104 according to step S202 in FIG. 6. In some embodiments, the disposing of the first insulating layer 105a includes disposing an insulating material such as oxide over the semiconductor substrate 104 by deposition or any other suitable process.

Figure 9:
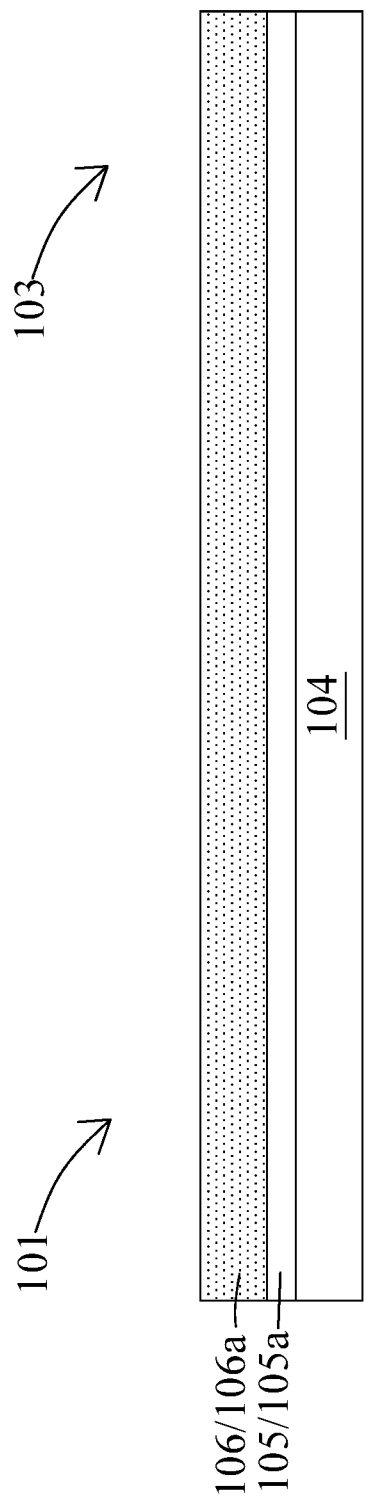

Referring to FIG. 9, a first bottom electrode 106a is disposed over the first insulating layer 105a according to step S203 in FIG. 6. In some embodiments, the disposing of the first bottom electrode 106a includes disposing a conductive material such as tungsten (W) over the first insulating layer 105a by deposition, chemical vapor deposition (CVD) or any other suitable process.

Figure 10:
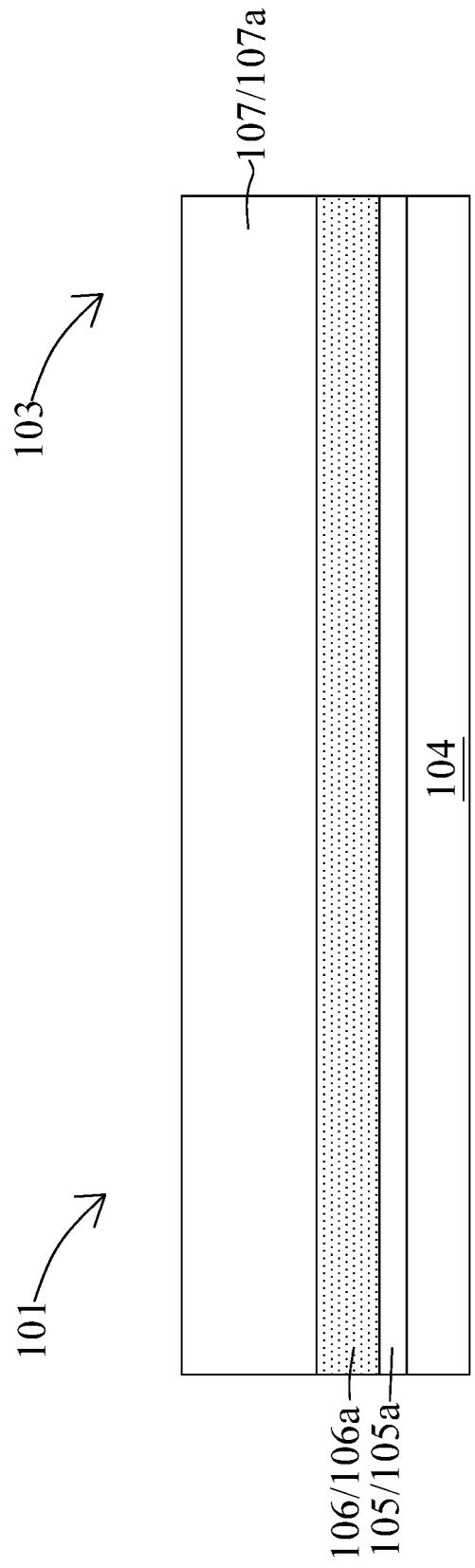

Referring to FIG. 10, a first dielectric layer 107a is disposed over the first bottom electrode 106a according to step S204 in FIG. 6. In some embodiments, the disposing of the first dielectric layer 107a includes disposing an insulating material such as oxide over the first bottom electrode 106a by deposition or any other suitable process.

Figure 11:
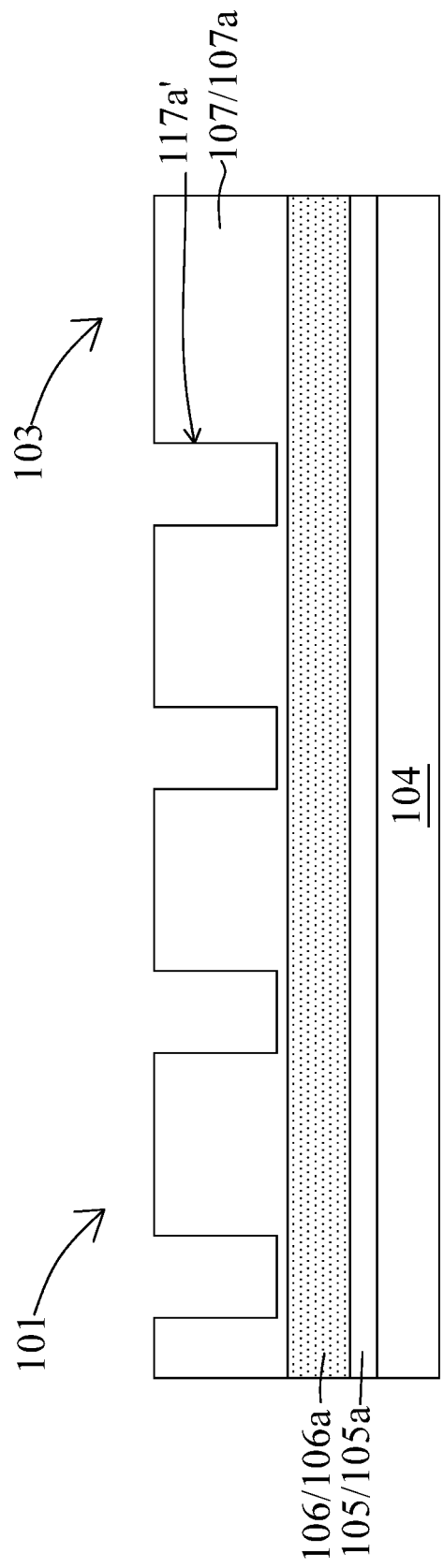
Figure 12:
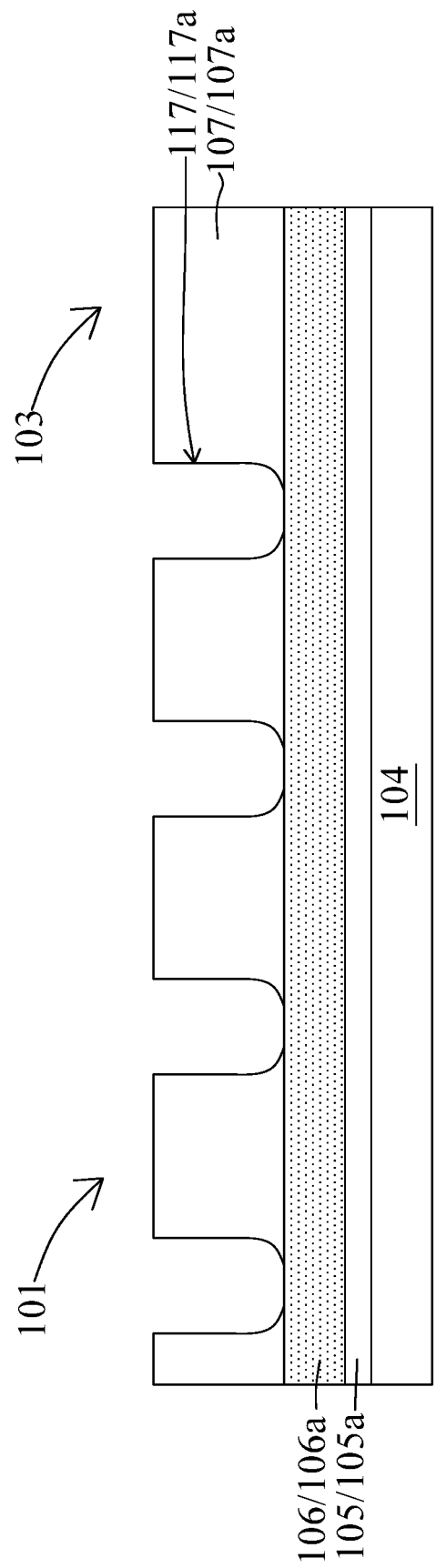

Referring to FIGS. 11 and 12, a portion of the first dielectric layer 107a is removed to form a first recess 117a extending through the first dielectric layer 107a according to step S205 in FIG. 6. In some embodiments, the removal of the portion of the first dielectric layer 107a includes removing a first portion of the first dielectric layer 107a to form an opening 117a' partially through the first dielectric layer 107a as shown in FIG. 11, and then removing a second portion of the first dielectric layer 107a exposed through the opening 117a' to form the first recess 117a at least partially exposing the first bottom electrode 106a as shown in FIG. 12. In some embodiments, the second portion of the first dielectric layer 107a is removed by isotropic wet etching or any other suitable process.

Figure 13:
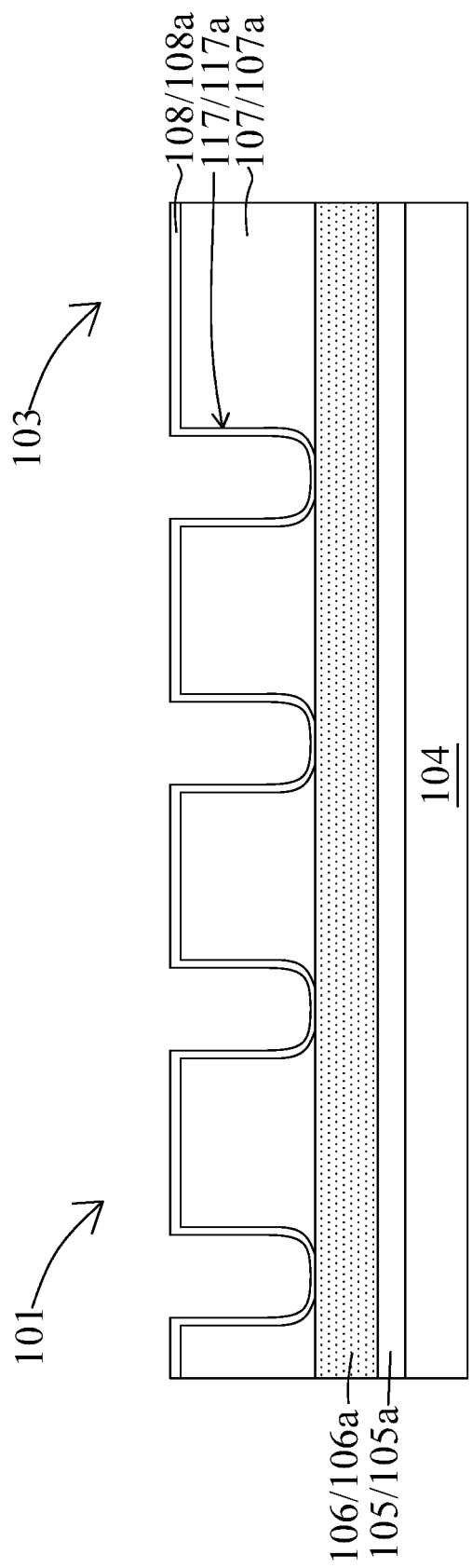
Figure 14:
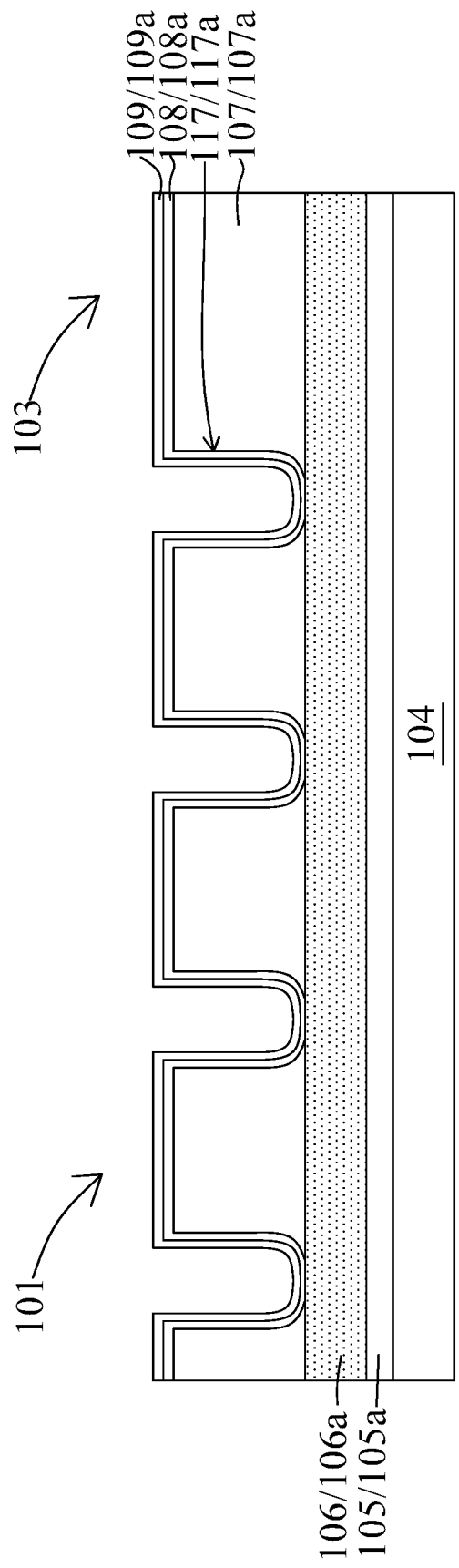

Referring to FIGS. 13 and 14, a first capacitor dielectric (108a and 109a) is disposed conformal to the first recess 117a and over the first bottom electrode 106a according to step S206 in FIG. 6. In some embodiments, the disposing of the first capacitor dielectric (108a and 109a) includes disposing a first nitride liner 108a over the first dielectric layer 107a and conformal to the first recess 117a as shown in FIG. 13, and then disposing a first high-k liner 109a over the first nitride liner 108a as shown in FIG. 14. In some embodiments, the first nitride liner 108a and the first high-k liner 109a are disposed by deposition, CVD or any other suitable process.

In some embodiments, the first nitride liner 108a is in contact with the first bottom electrode 106a exposed through the first dielectric layer 107a. In some embodiments, the first nitride liner 108a includes titanium nitride (TiN) or the like, and the first high-k liner 109a includes high-k dielectric material such as hafnium dioxide ($HfO_2$), zirconium oxide ($ZrO_2$), titanium dioxide ($TiO_2$) or the like.

Figure 15:
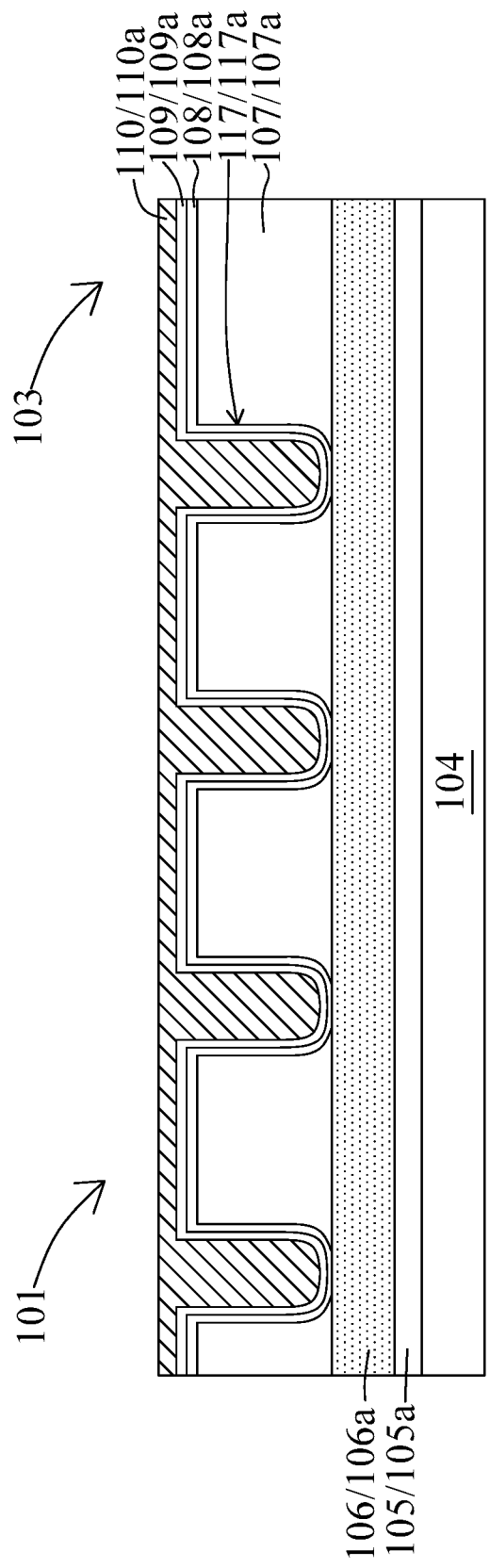
Figure 16:
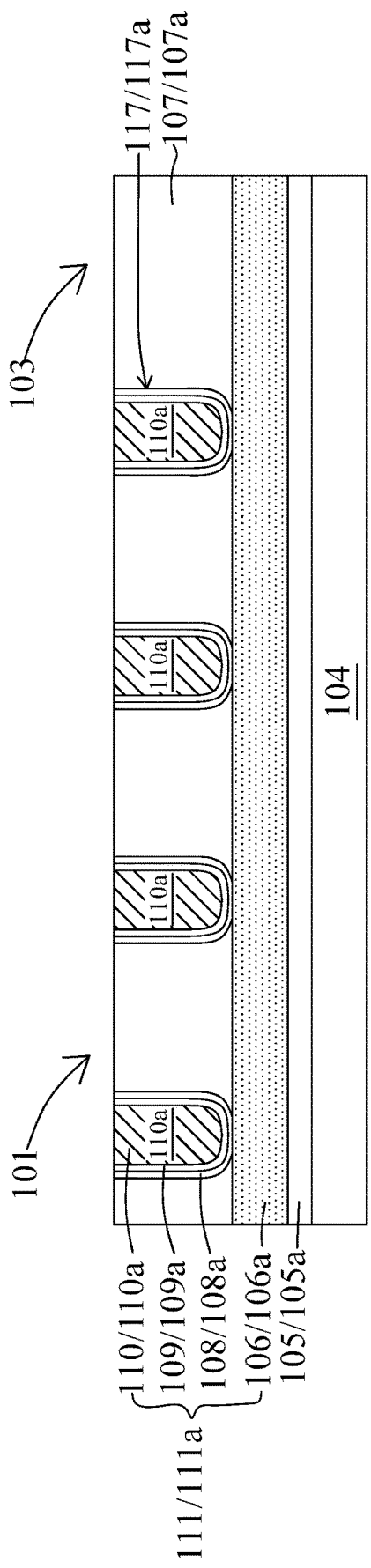

Referring to FIGS. 15 and 16, a first top electrode 110a is formed within the first recess 117a and surrounded by the first capacitor dielectric (108a and 109a) according to step S207 in FIG. 6. In some embodiments, the formation of the first top electrode 110a includes disposing a conductive material such as tungsten (W) over the first high-k liner 109a and within the first recess 117a as shown in FIG. 15, and then removing portions of the conductive material disposed over the first dielectric layer 107a to form the first top electrode 110a as shown in FIG. 16.

In some embodiments, the conductive material is disposed by deposition, CVD or any other suitable process. In some embodiments, the portions of the conductive material are removed by planarization, chemical mechanical polishing (CMP) or any other suitable process. In some embodiments, portions of the first capacitor dielectric (108a and 109a) disposed over the first dielectric layer 107a are also removed. In some embodiments, the first capacitor dielectric (108a and 109a) and the first top electrode 110a extend laterally over the first bottom electrode 106a and the semiconductor substrate 104.

Figure 17:
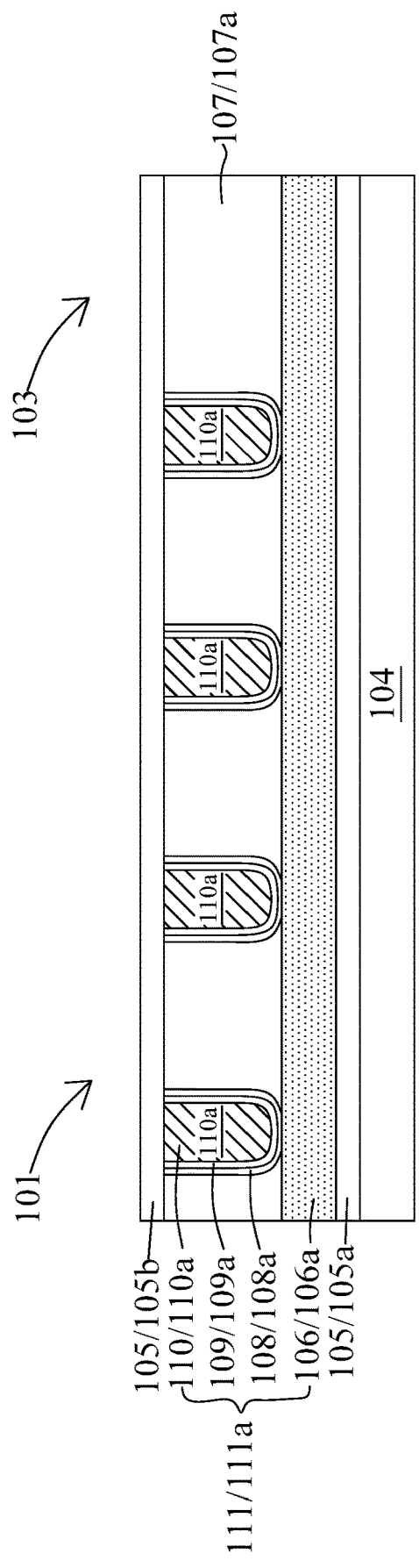

In some embodiments, steps similar to steps S202 to S207 are repeated after the formation of the first top electrode 110a as shown in FIG. 16. In some embodiments, as shown in FIG. 17, a second insulating layer 105b is disposed over the first top electrode 110a and the first dielectric layer 107a. In some embodiments, the disposing of the second insulating layer 105b is similar to step S202.

Figure 18:
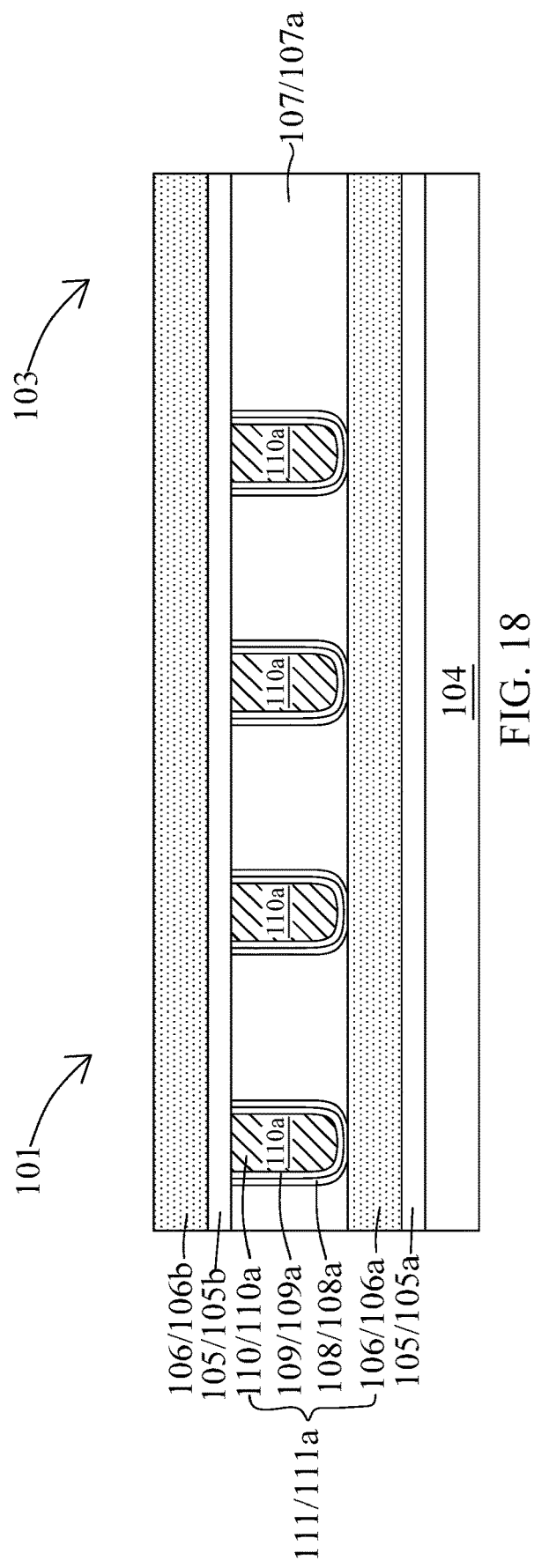
Figure 19:
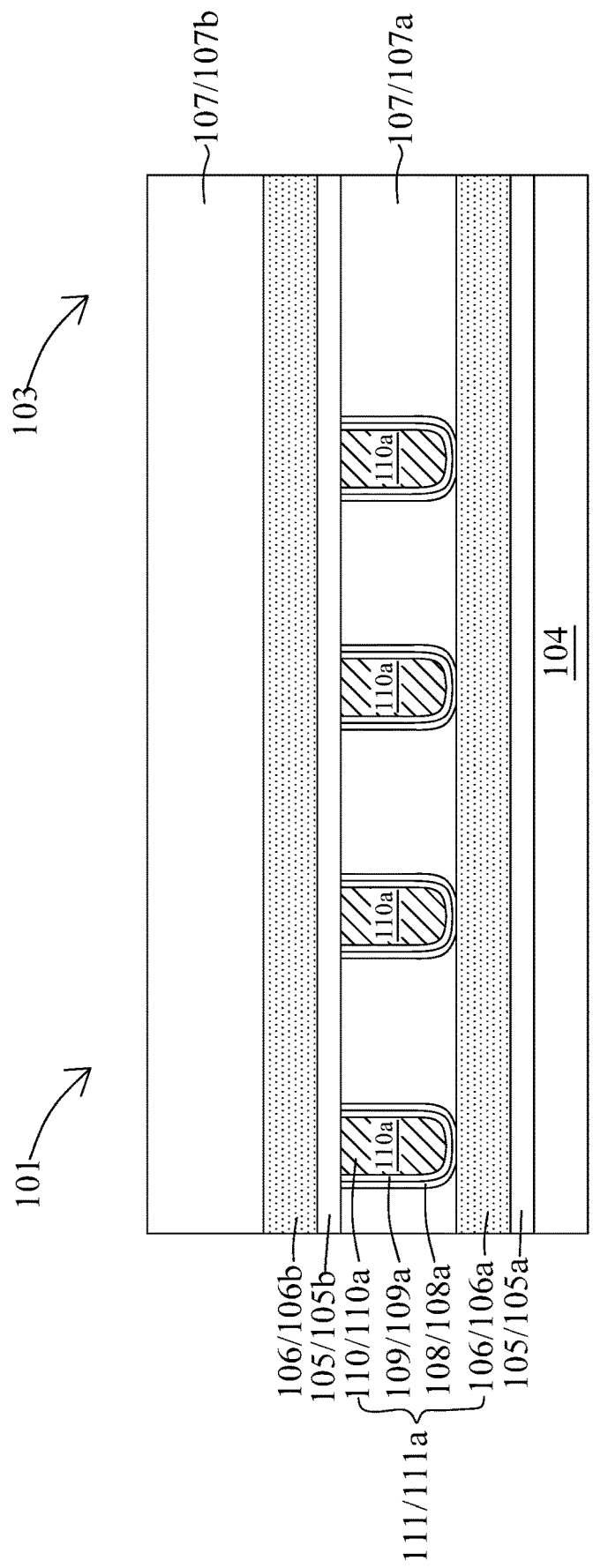

In some embodiments, as shown in FIG. 18, a second bottom electrode 106b is disposed over the second insulating layer 105b. In some embodiments, the disposing of the second bottom electrode 106b is similar to step S203. In some embodiments, as shown in FIG. 19, a second dielectric layer 107b is disposed over the second bottom electrode 106b. In some embodiments, the disposing of the second dielectric layer 107b is similar to step S204.

Figure 20:
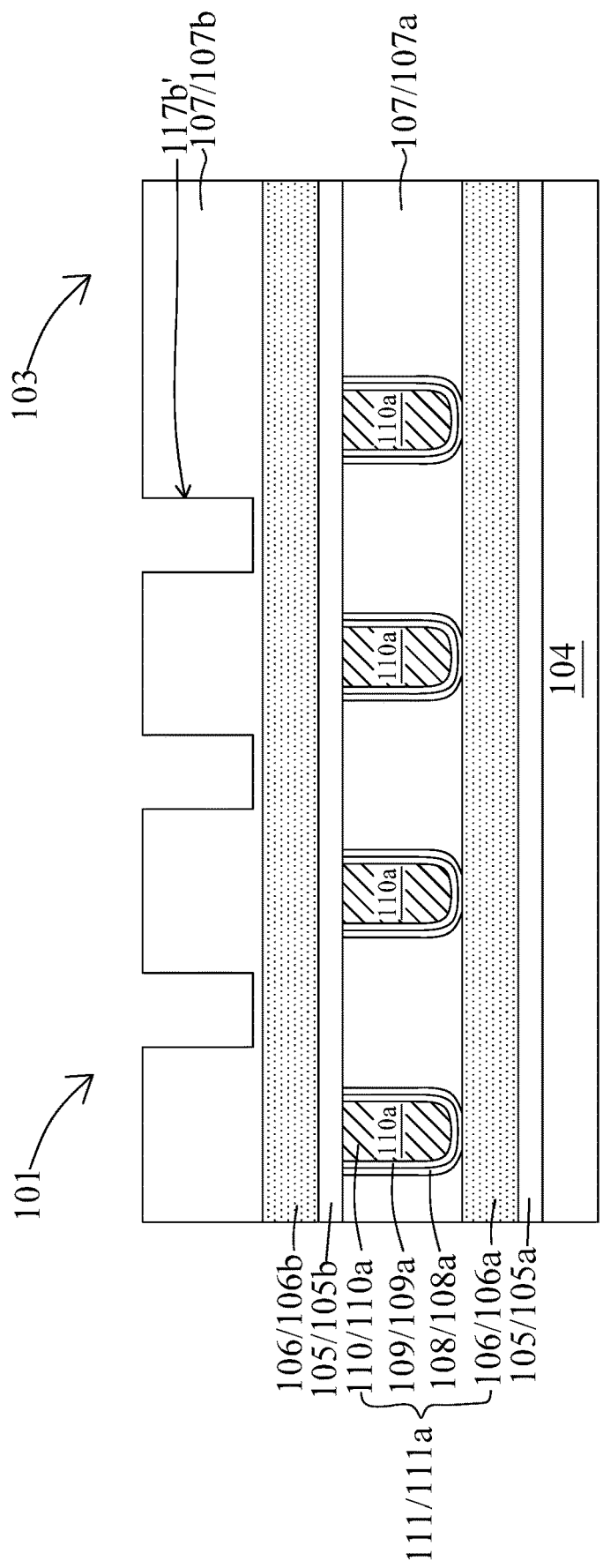
Figure 21:
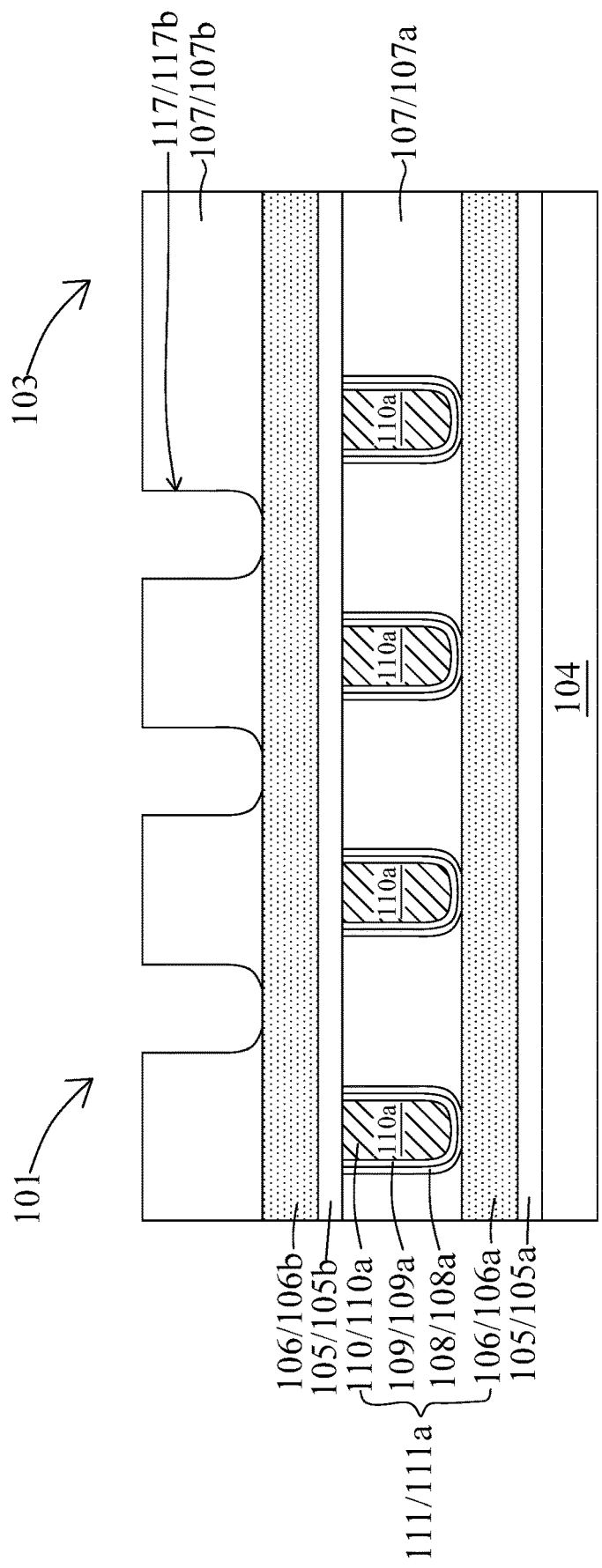

In some embodiments, as shown in FIGS. 20 and 21, a portion of the second dielectric layer 107b is removed to form a second recess 117b extending through the second dielectric layer 107b. In some embodiments, the removal of the portion of the second dielectric layer 107b includes removing a first portion of the second dielectric layer 107b to form an opening 117b' partially through the second dielectric layer 107b as shown in FIG. 20, and then removing a second portion of the second dielectric layer 107b exposed through the opening 117b' to form the second recess 117b at least partially exposing the second bottom electrode 106b as shown in FIG. 21. In some embodiments, the formation of the second recess 117b is similar to step S205.

Figure 22:
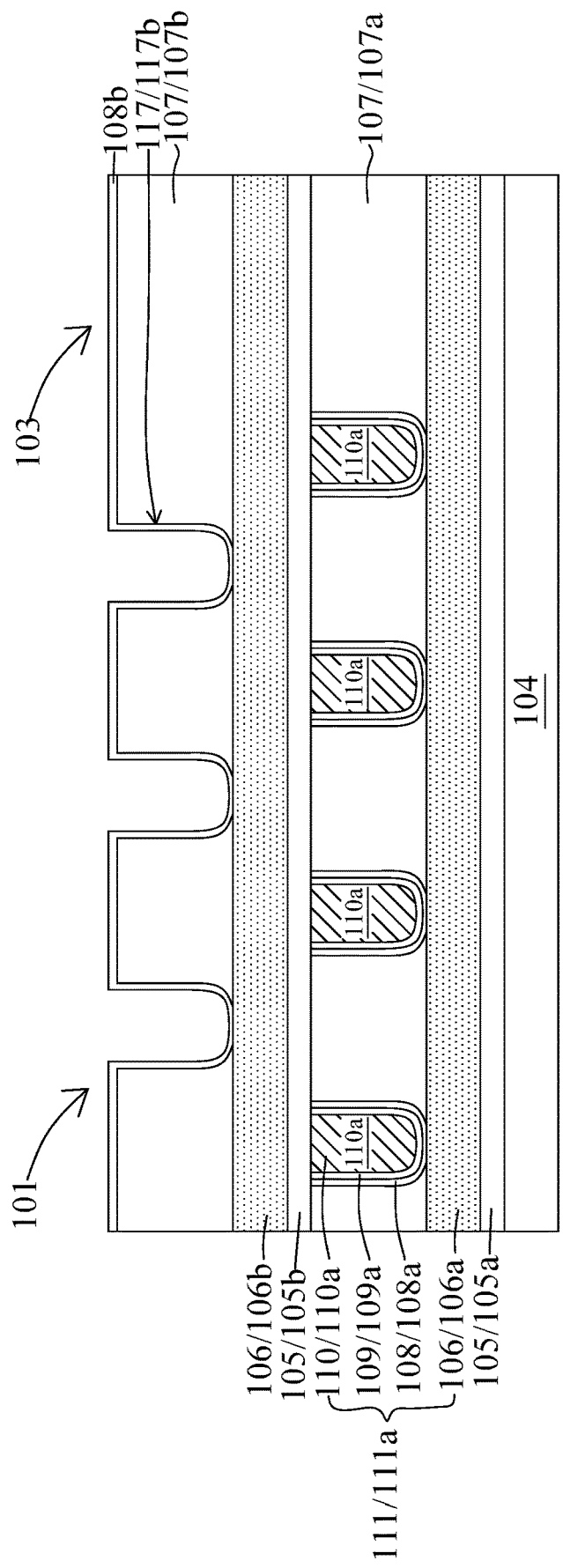
Figure 23:
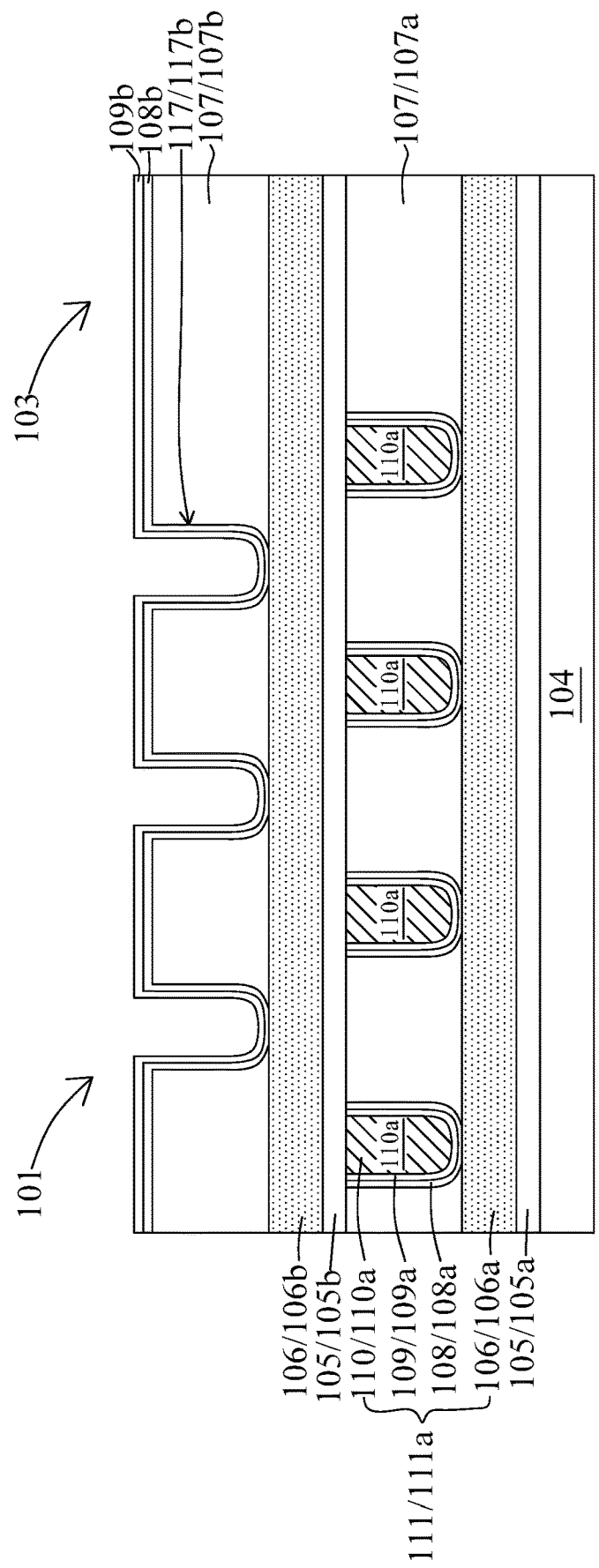

In some embodiments, as shown in FIGS. 22 and 23, a second capacitor dielectric (108b and 109b) is disposed conformal to the second recess 117b and over the second bottom electrode 106b. In some embodiments, the disposing of the second capacitor dielectric (108b and 109b) includes disposing a second nitride liner 108b over the second dielectric layer 107b and conformal to the second recess 117b as shown in FIG. 22, and then disposing a second high-k liner 109b over the second nitride liner 108b as shown in FIG. 23. In some embodiments, the disposing of the second capacitor dielectric (108b and 109b) is similar to step S206.

Figure 24:
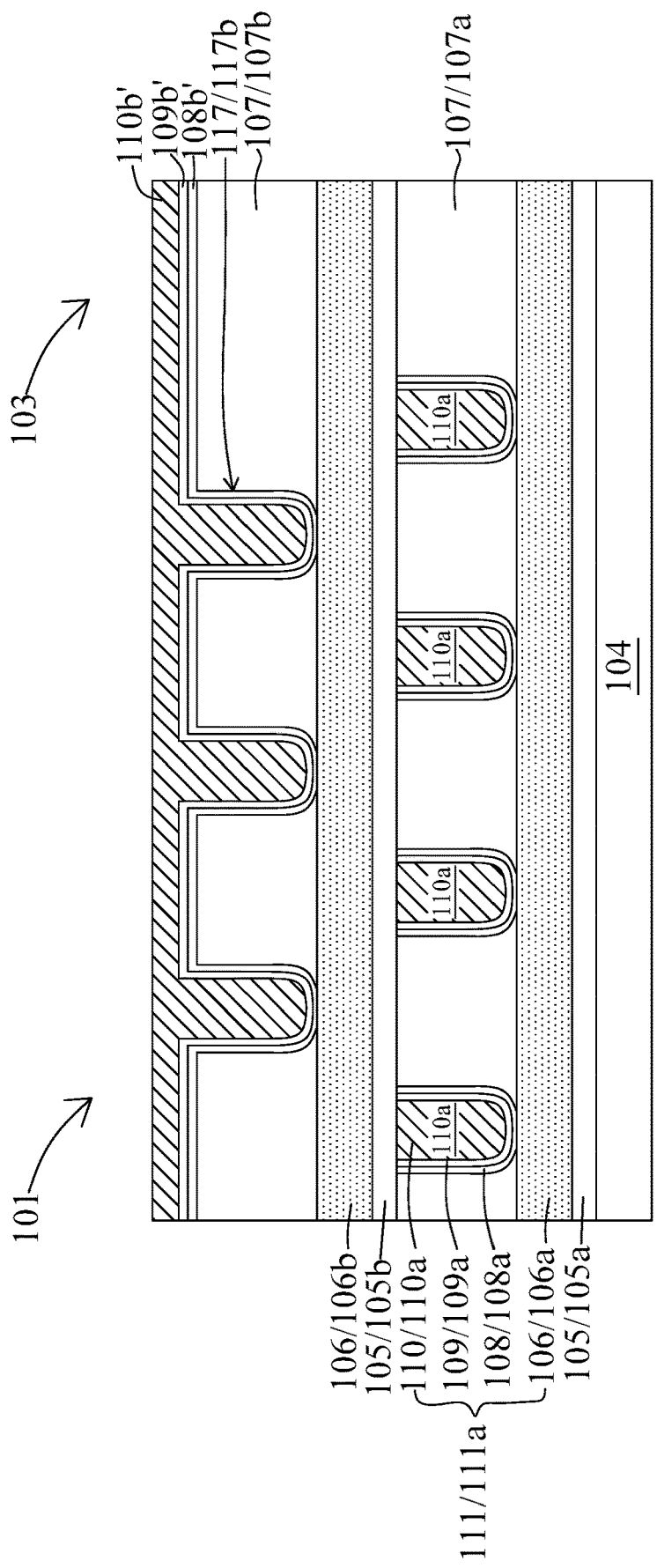
Figure 25:
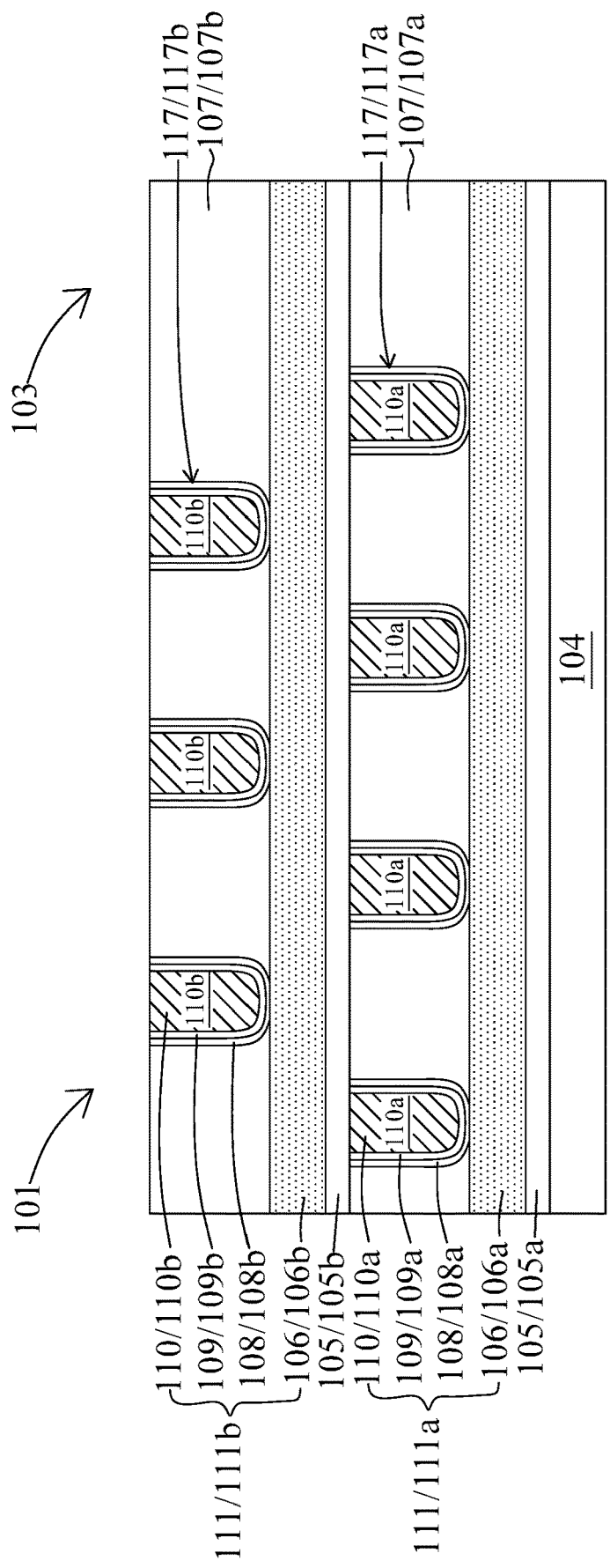

In some embodiments, as shown in FIGS. 24 and 25, a second top electrode 110b is formed within the second recess 117b and surrounded by the second capacitor dielectric (108b and 109b). In some embodiments, the formation of the second top electrode 110b is similar to step S207. In some embodiments, the second capacitor dielectric (108b and 109b) and the second top electrode 110b extend laterally over the second bottom electrode 106b and the semiconductor substrate 104. In some embodiments, as shown in FIG. 25, the first top electrode 110a is offset from the second top electrode 110b, and the first recess 117a is offset from the second recess 117b.

Figure 26:
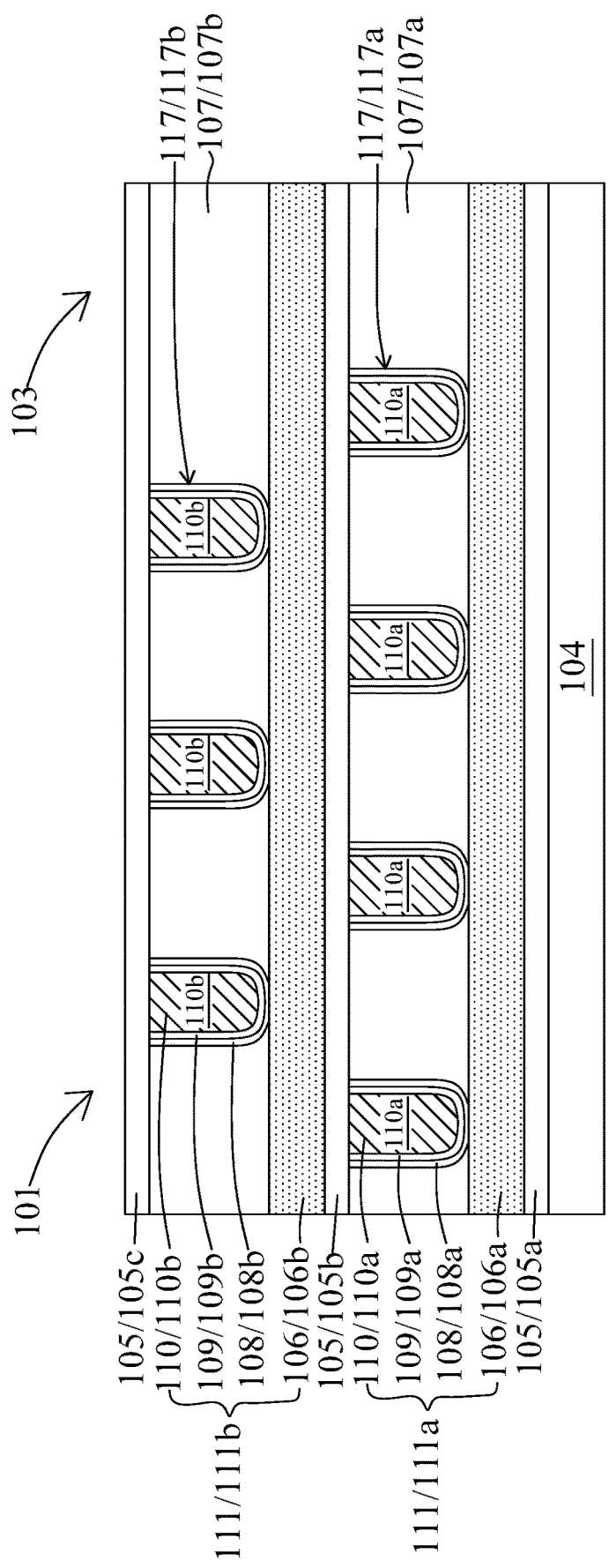

In some embodiments, steps similar to steps S202 to S207 are repeated after the formation of the second top electrode 110b as shown in FIG. 25. In some embodiments, as shown in FIG. 26, a third insulating layer 105c is disposed over the second top electrode 110b and the second dielectric layer 107b. In some embodiments, after the disposing of the third insulating layer 105c, steps similar to steps S203 to S207 are repeated.

Figure 27:
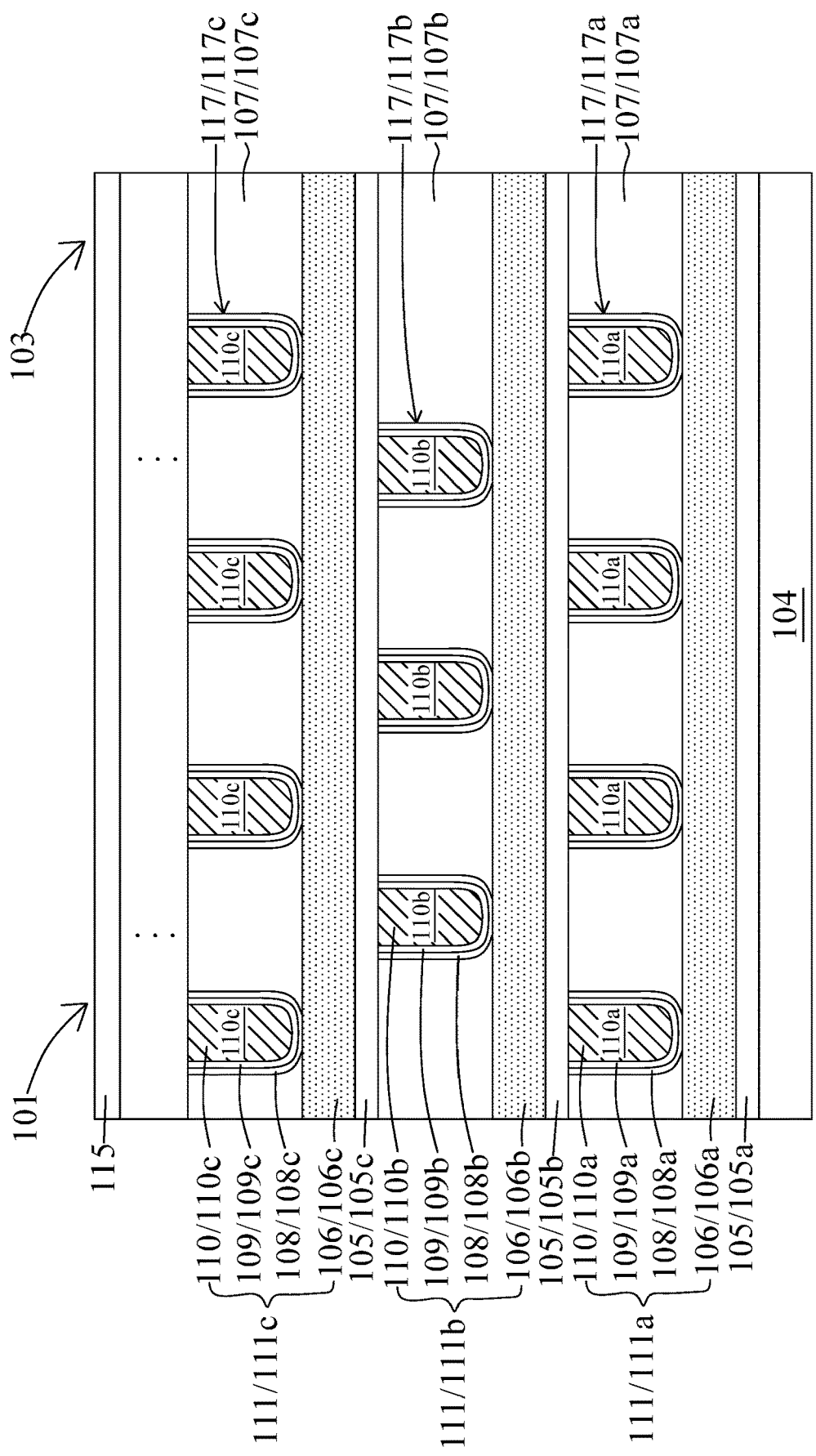
Figure 28:
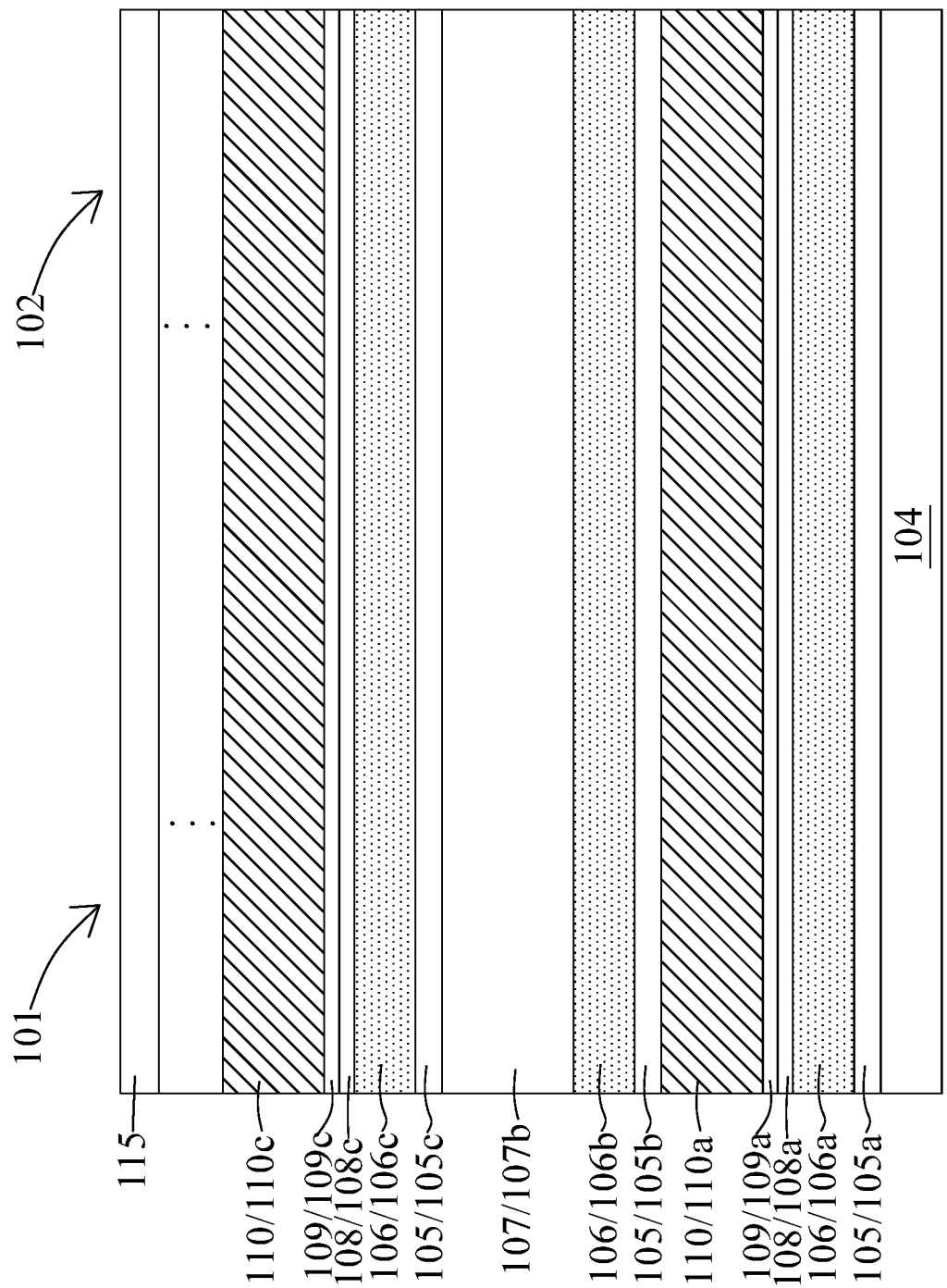

In some embodiments, a last insulating layer 115 is disposed as shown in FIG. 27. In some embodiments, the last insulating layer 115 is formed of a dielectric material, such as silicon oxide or the like. In some embodiments, the last insulating layer 115 is disposed by deposition or any other suitable process. In some embodiments, after the disposing of the last insulating layer 115, an intermediate structure is formed as shown in FIGS. 27 and 28. FIG. 27 illustrates a cross-sectional view of the intermediate structure along the line A-A of FIG. 1, and FIG. 28 illustrates a cross-sectional view of the intermediate structure along the line B-B of FIG. 1.

Figure 29:
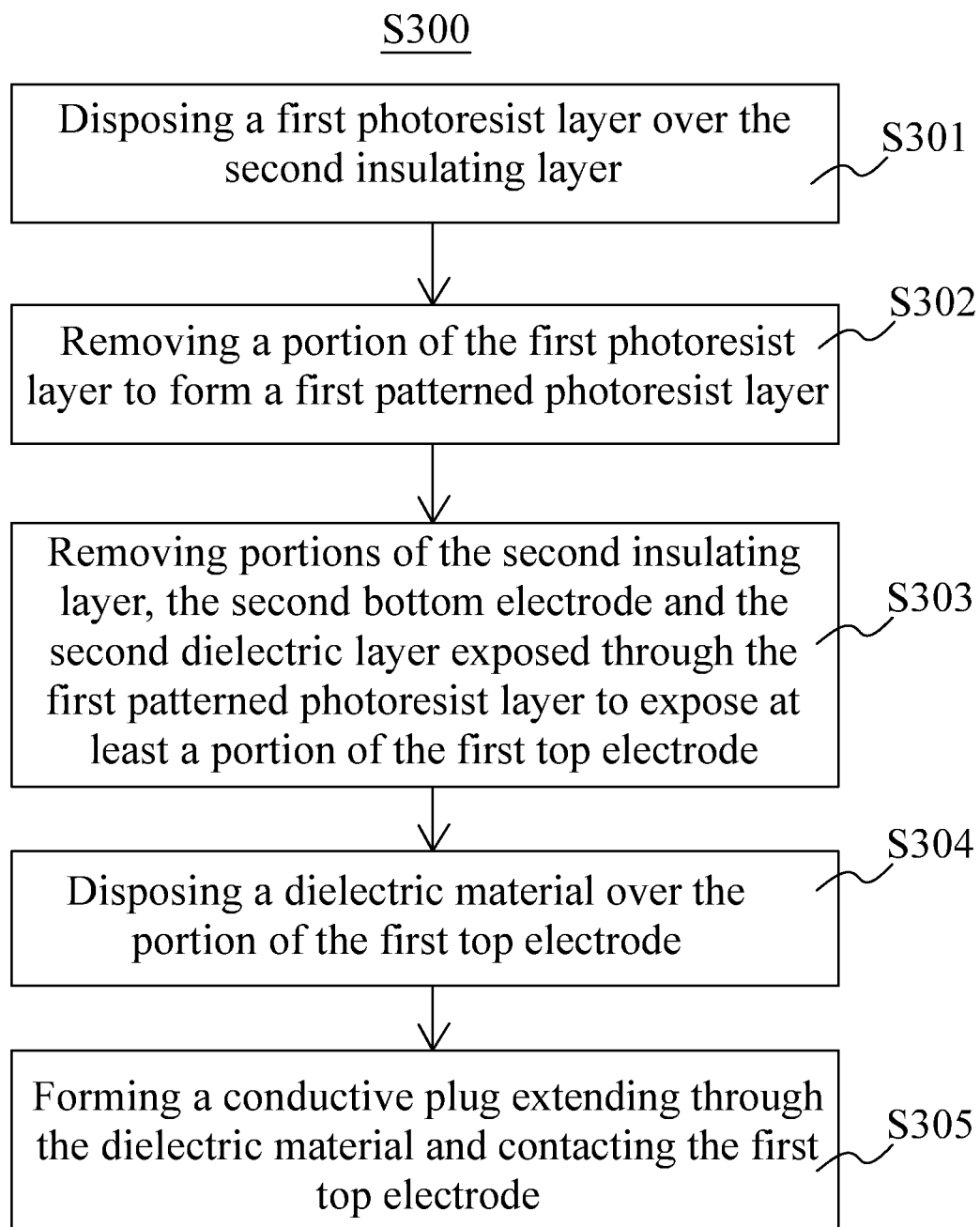
FIG. 29 is a flow diagram illustrating a method of manufacturing the memory device of FIG. 1 in accordance with some embodiments of the present disclosure.

FIG. 29 is a flow diagram illustrating a method S300 of manufacturing an intermediate structure of a memory device 100 in accordance with some embodiments of the present disclosure, and FIGS. 30 to 47 illustrate cross-sectional views of intermediate stages in formation of the intermediate structure of the memory device 100 as shown in FIG. 1 along the line B-B in accordance with some embodiments of the present disclosure.

The stages shown in FIGS. 30 to 47 are also illustrated schematically in the flow diagram in FIG. 29. In following discussion, the fabrication stages shown in FIGS. 30 to 47 are discussed in reference to process steps shown in FIG. 29. The method S300 includes a number of operations, and description and illustration are not deemed as a limitation to a sequence of the operations. The method S300 includes a number of steps (S301, S302, S303, S304 and S305).

Figure 30:
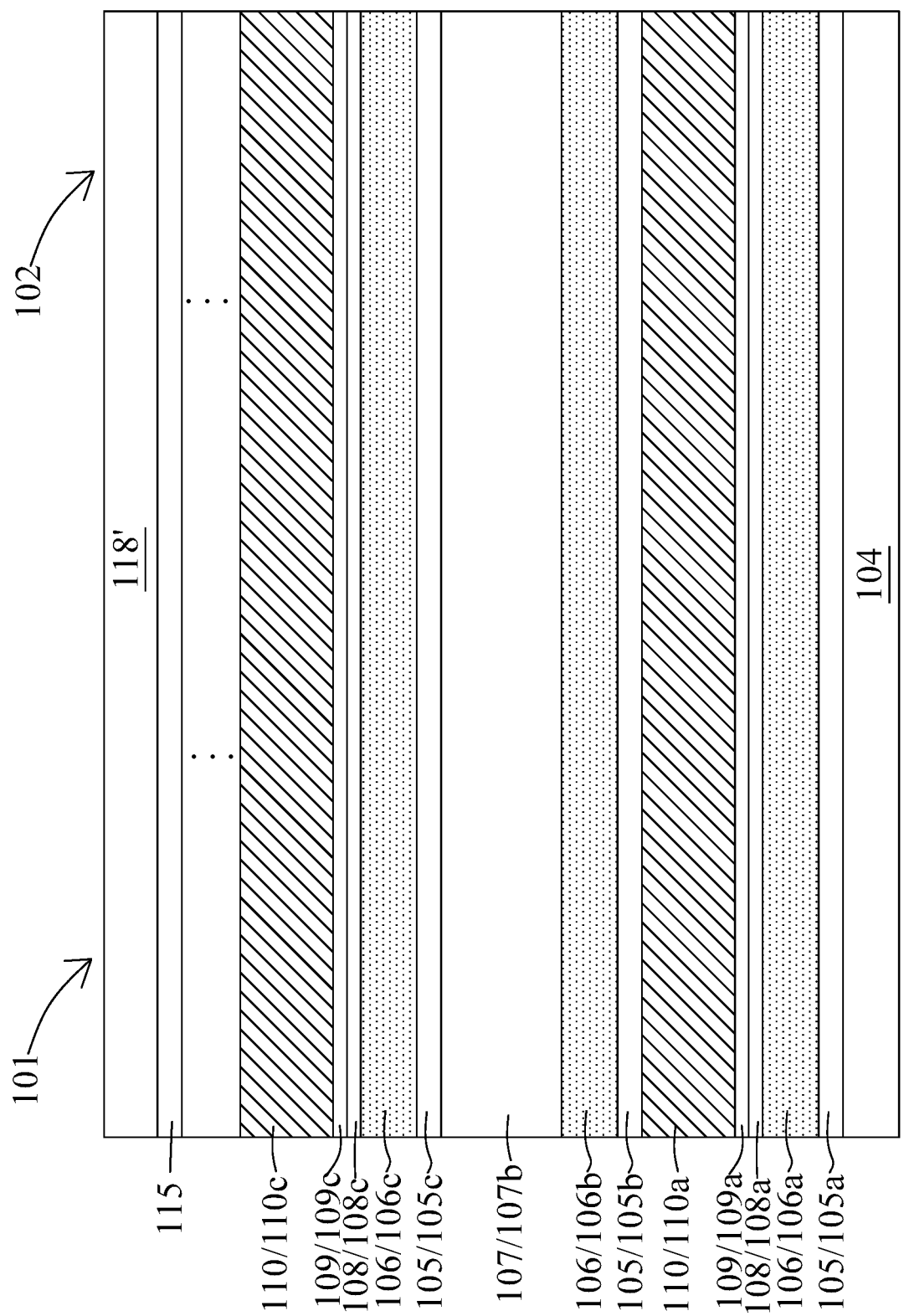
FIGS. 30 to 39 illustrate cross-sectional views of intermediate stages in the formation of the memory device of FIG. 1 along a line B-B in accordance with some embodiments of the present disclosure.
Figure 31:
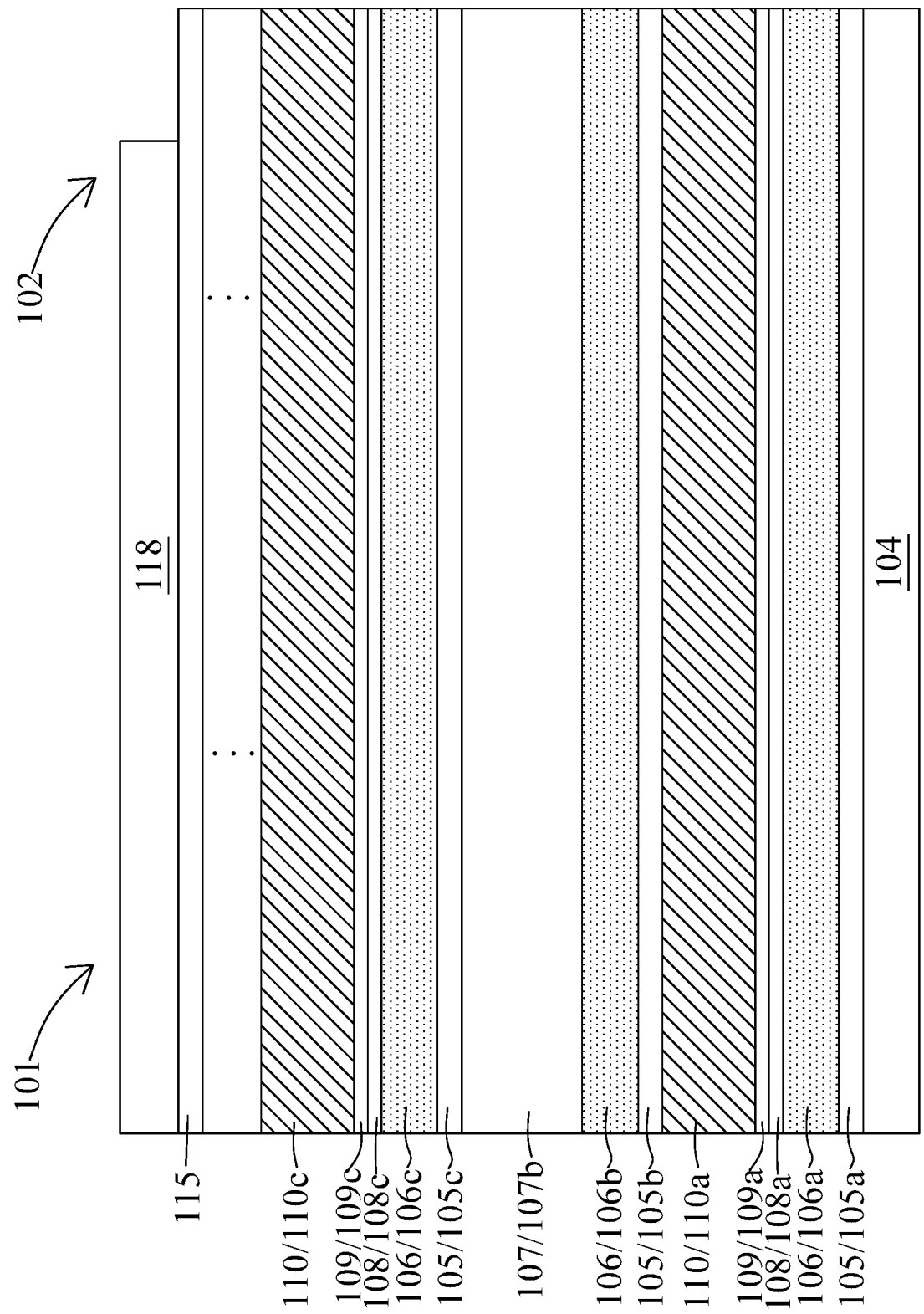

In some embodiments, the method S300 is implemented after the method S200 or after repetition of the method S200 as described above. In some embodiments, the method S300 is implemented after the formation of the intermediate structure as shown in FIG. 28. Referring to FIG. 30, a first photoresist layer 118' is disposed over the second insulating layer 105b and the last insulating layer 115 according to step S301 in FIG. 29. In some embodiments, the first photoresist layer 118' is disposed by spin coating or any other suitable process. Referring to FIG. 31, a portion of the first photoresist layer 118' is removed to form a first patterned photoresist layer 118 according to step S302 in FIG. 29. In some embodiments, the portion of the first photoresist layer 118' is removed by etching or any other suitable process.

Figure 32:
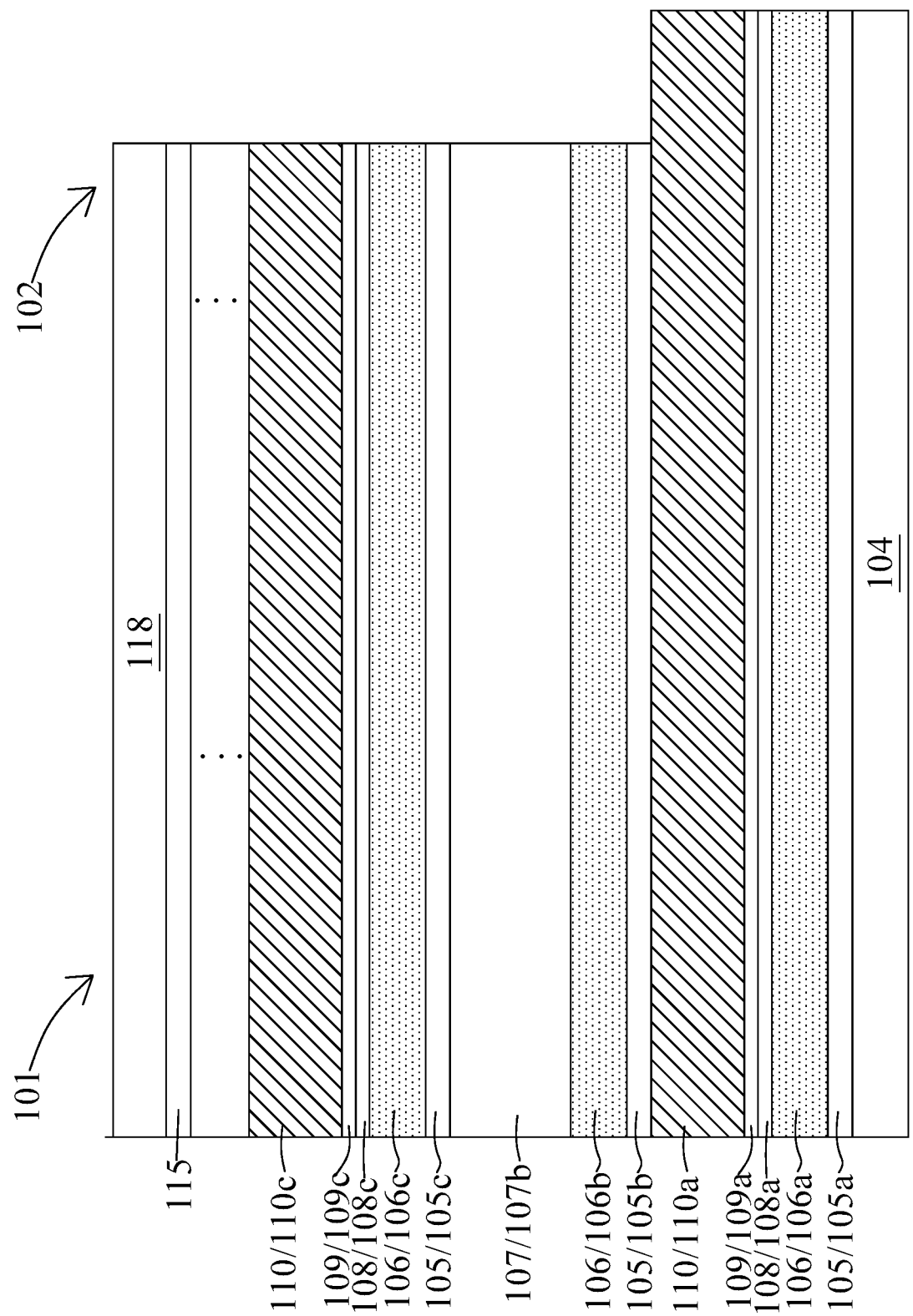

Referring to FIG. 32, portions of the second insulating layer 105b, the second bottom electrode 106b and the second dielectric layer 107b exposed through the first patterned photoresist layer 118 are removed to expose at least a portion of the first top electrode 110a according to step S303 in FIG. 29. In some embodiments, portions of the third insulating layer 105c, the third bottom electrode 106c, the third capacitor dielectric (108c and 109c) and the third top electrode 110c are also removed to expose at least the portion of the first top electrode 110a. In some embodiments, the portions of the second insulating layer 105b, the second bottom electrode 106b and the second dielectric layer 107b, the third insulating layer 105c, the third bottom electrode 106c, the third capacitor dielectric (108c and 109c) and the third top electrode 110c are removed by etching or any other suitable process.

Figure 33:
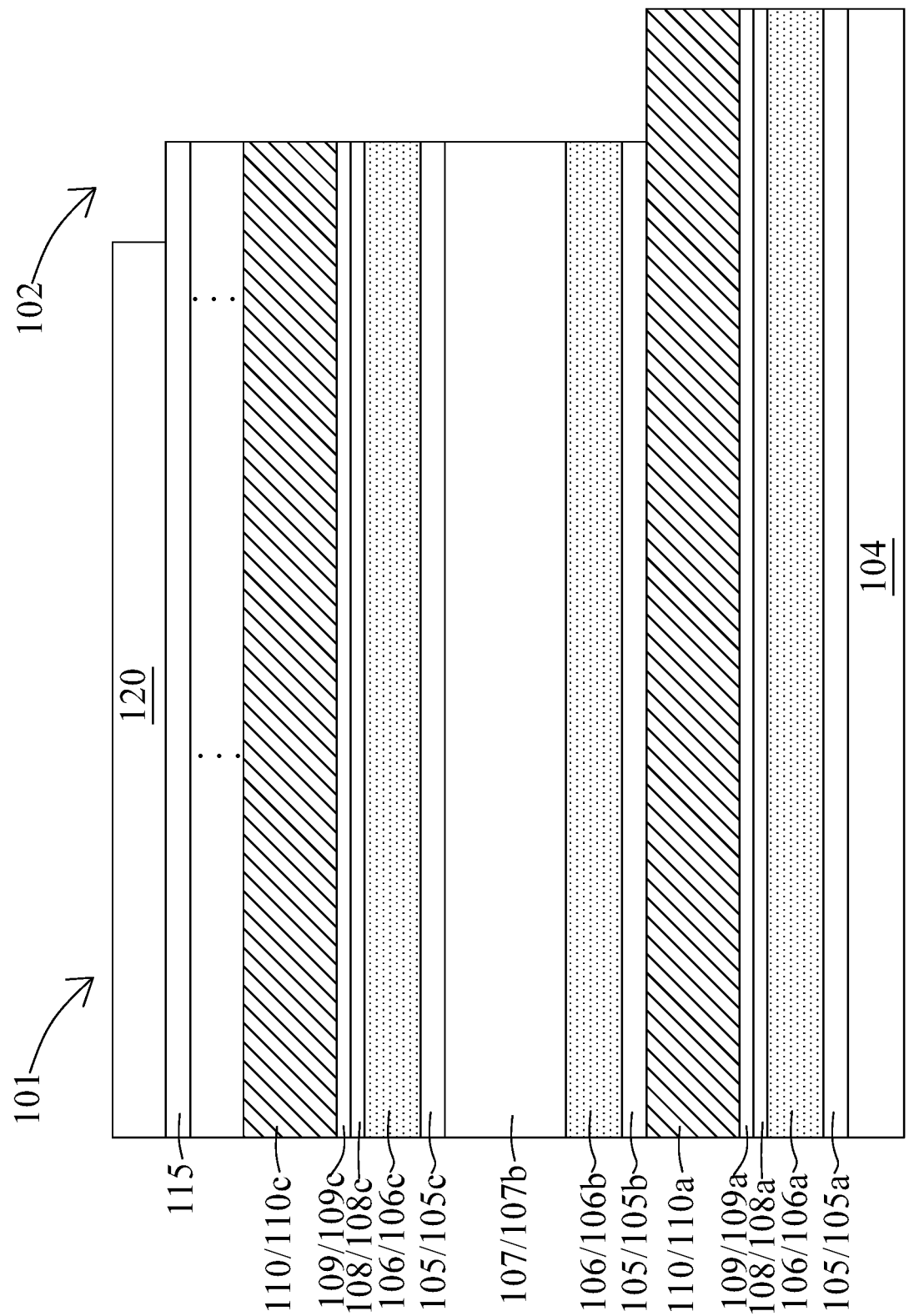
Figure 34:
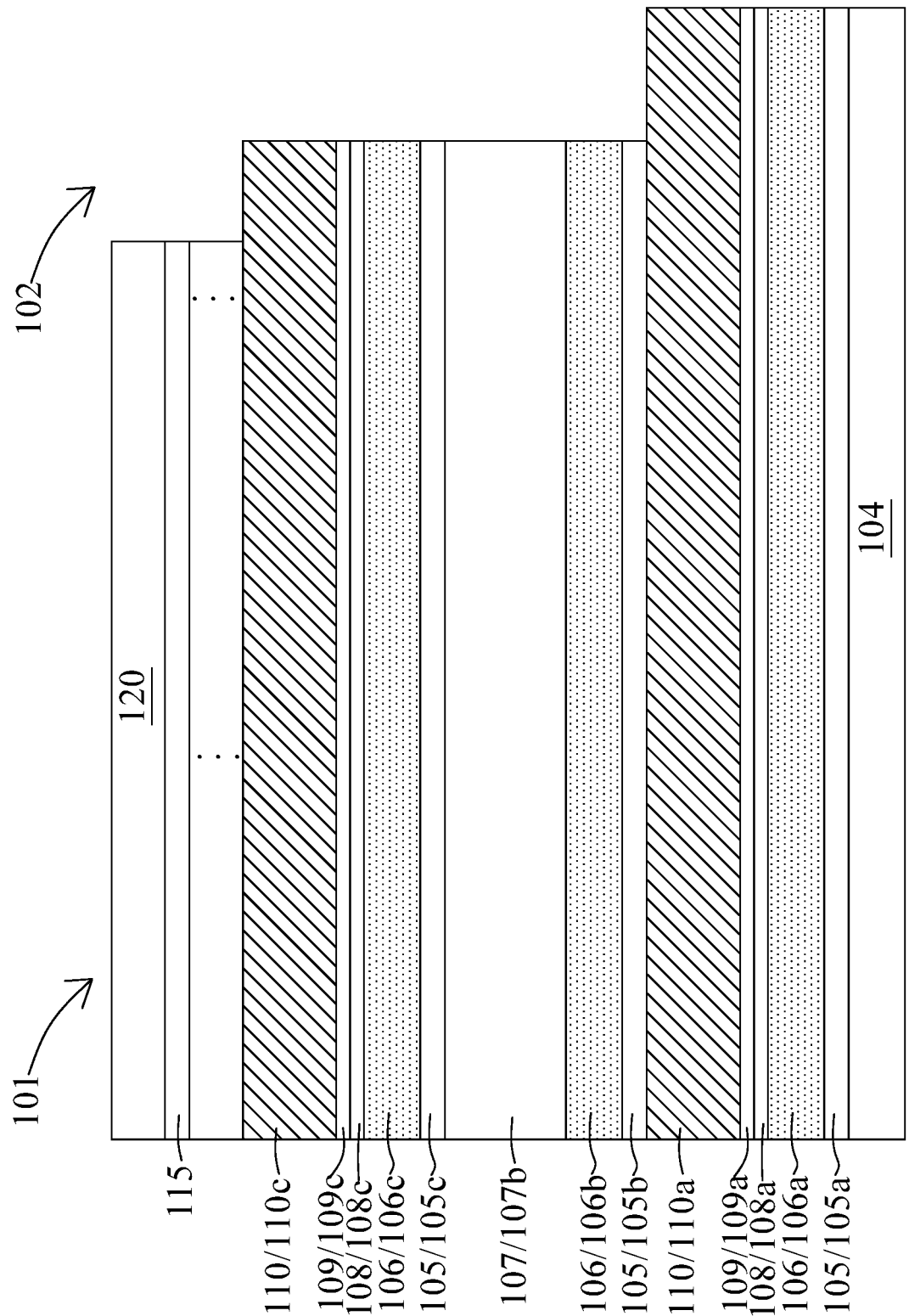
Figure 35:
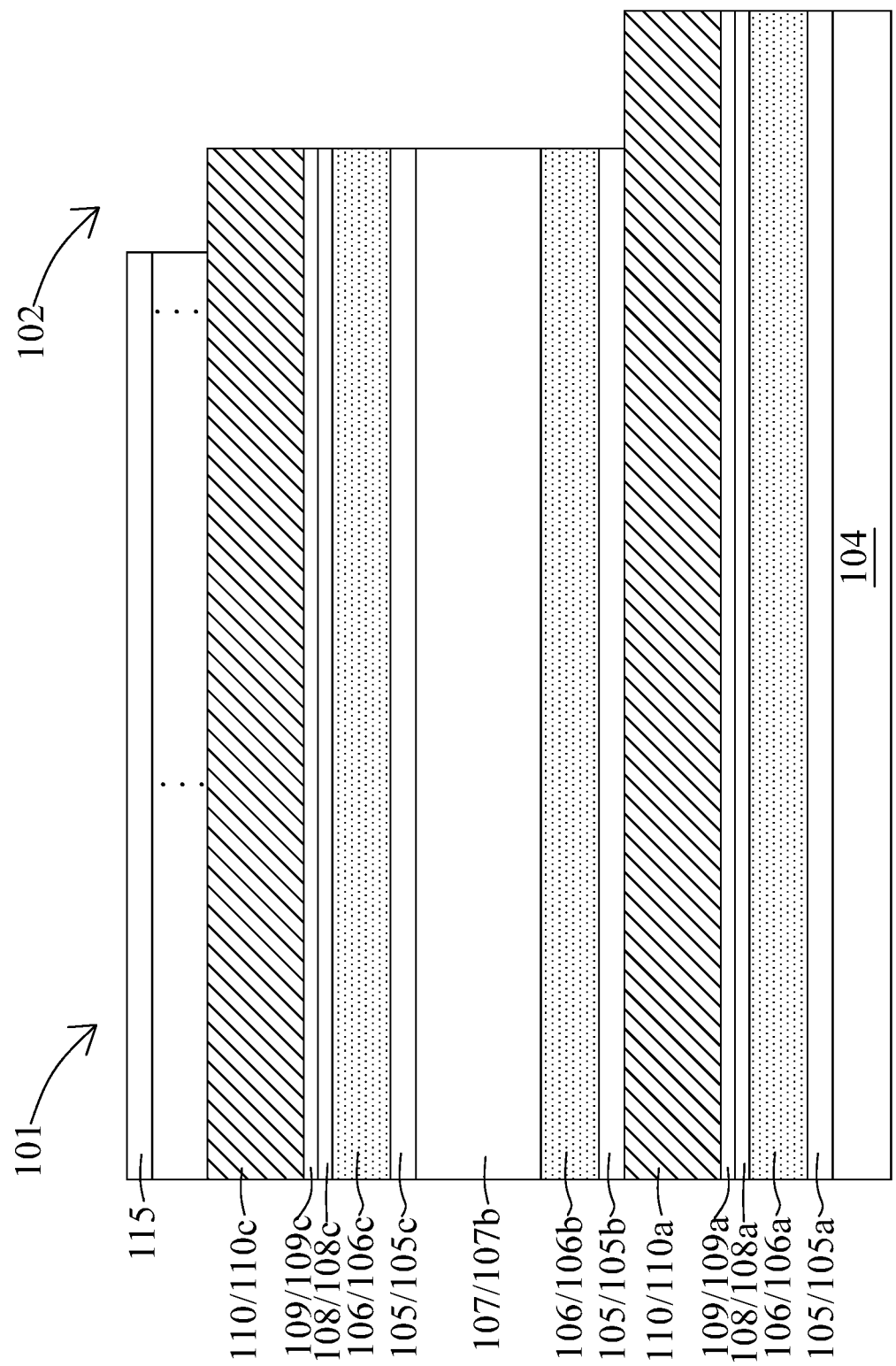

In some embodiments, a portion of the first patterned photoresist layer 118 is removed to form a second patterned photoresist layer 120 as shown in FIG. 33, in a step similar to step S302. In some embodiments, a portion of the last insulating layer 115 exposed through the second patterned photoresist layer 120 is removed to expose at least a portion of the third top electrode 110c as shown in FIG. 34, in a step similar to step S303. In some embodiments, the second patterned photoresist layer 120 is then removed, as shown in FIG. 35. In some embodiments, the second patterned photoresist layer 120 is removed by stripping, etching or any other suitable process.

Figure 36:
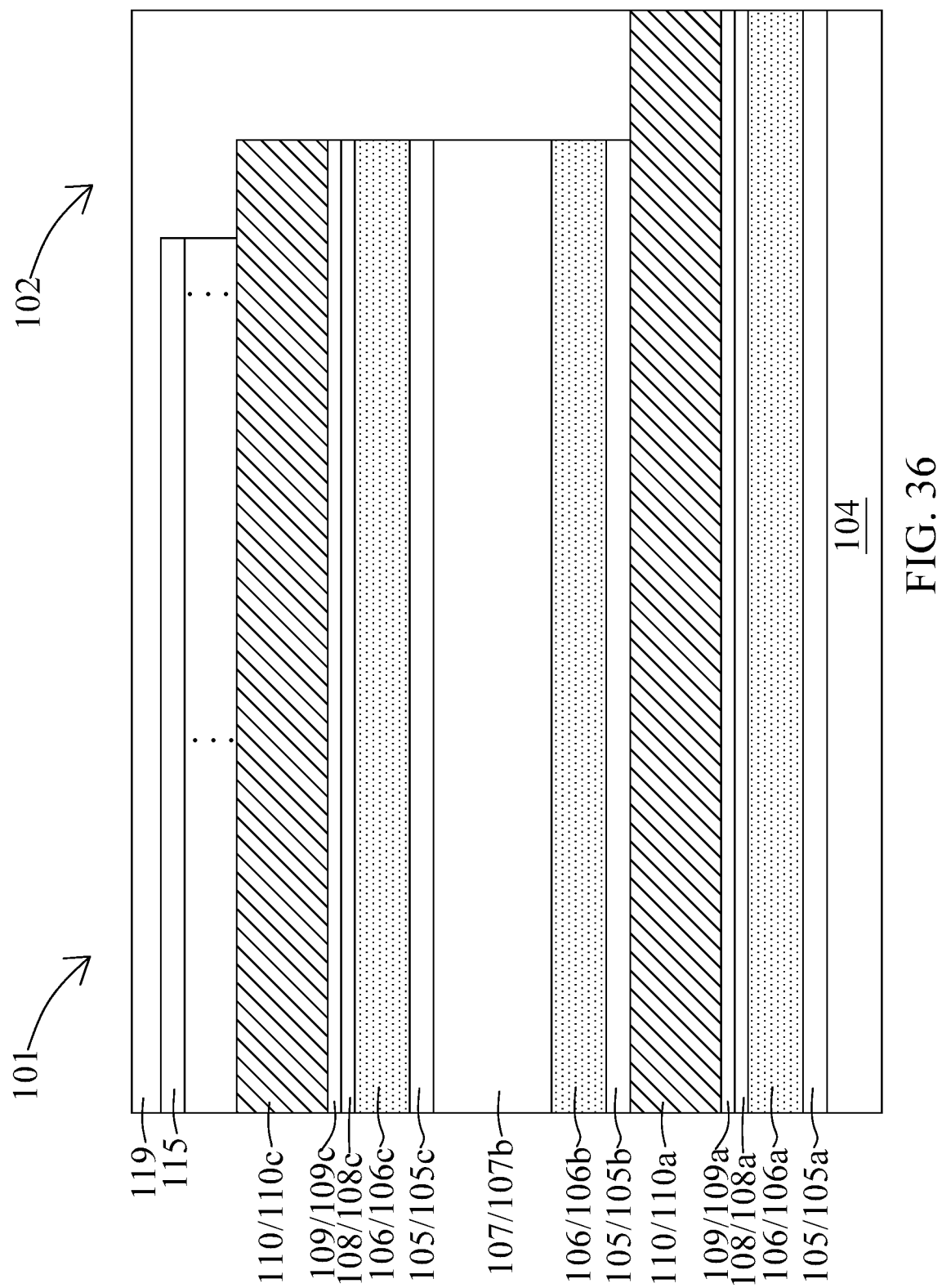

Referring to FIG. 36, a dielectric material 119 is disposed over the portion of the first top electrode 110a, the portion of the third top electrode 110c and the last insulating layer 115 according to step S304 in FIG. 29. In some embodiments, the dielectric material 119 is formed of a dielectric material, such as silicon oxide or the like. In some embodiments, the dielectric material 119 and the last insulating layer 115 include a same material. In some embodiments, the dielectric material 119 is disposed by deposition or any other suitable process.

Figure 37:
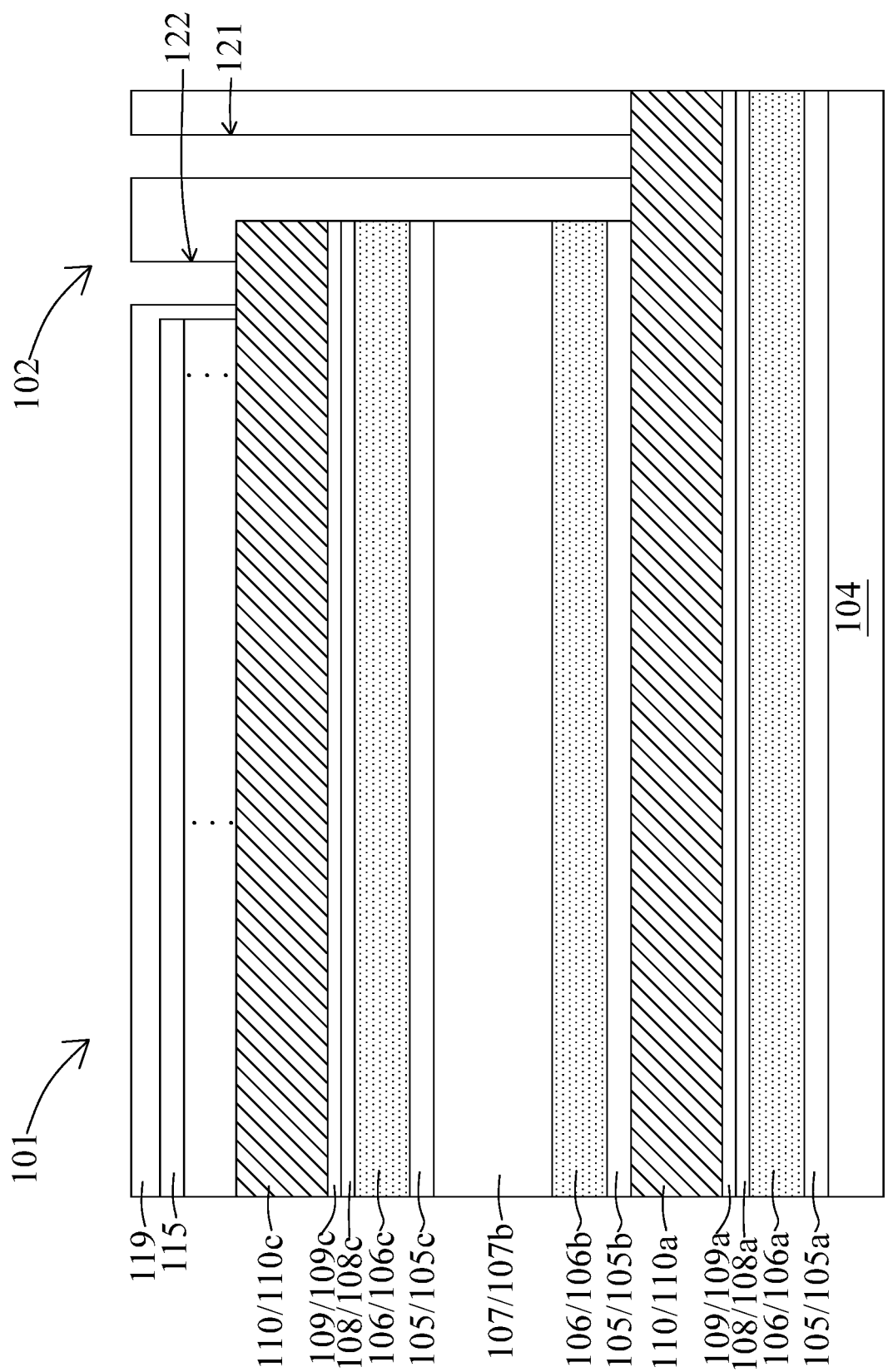

In some embodiments, portions of the dielectric material 119 are removed to form a first trench 121 and a second trench 122 as shown in FIG. 37. In some embodiments, the first trench 121 extends through the dielectric material 119 and exposes at least a portion of the first top electrode 110a, and the second trench 122 extends through the dielectric material 119 and exposes at least a portion of the third top electrode 110c. In some embodiments, the portions of the dielectric material 119 are removed by etching or any other suitable process.

Figure 38:
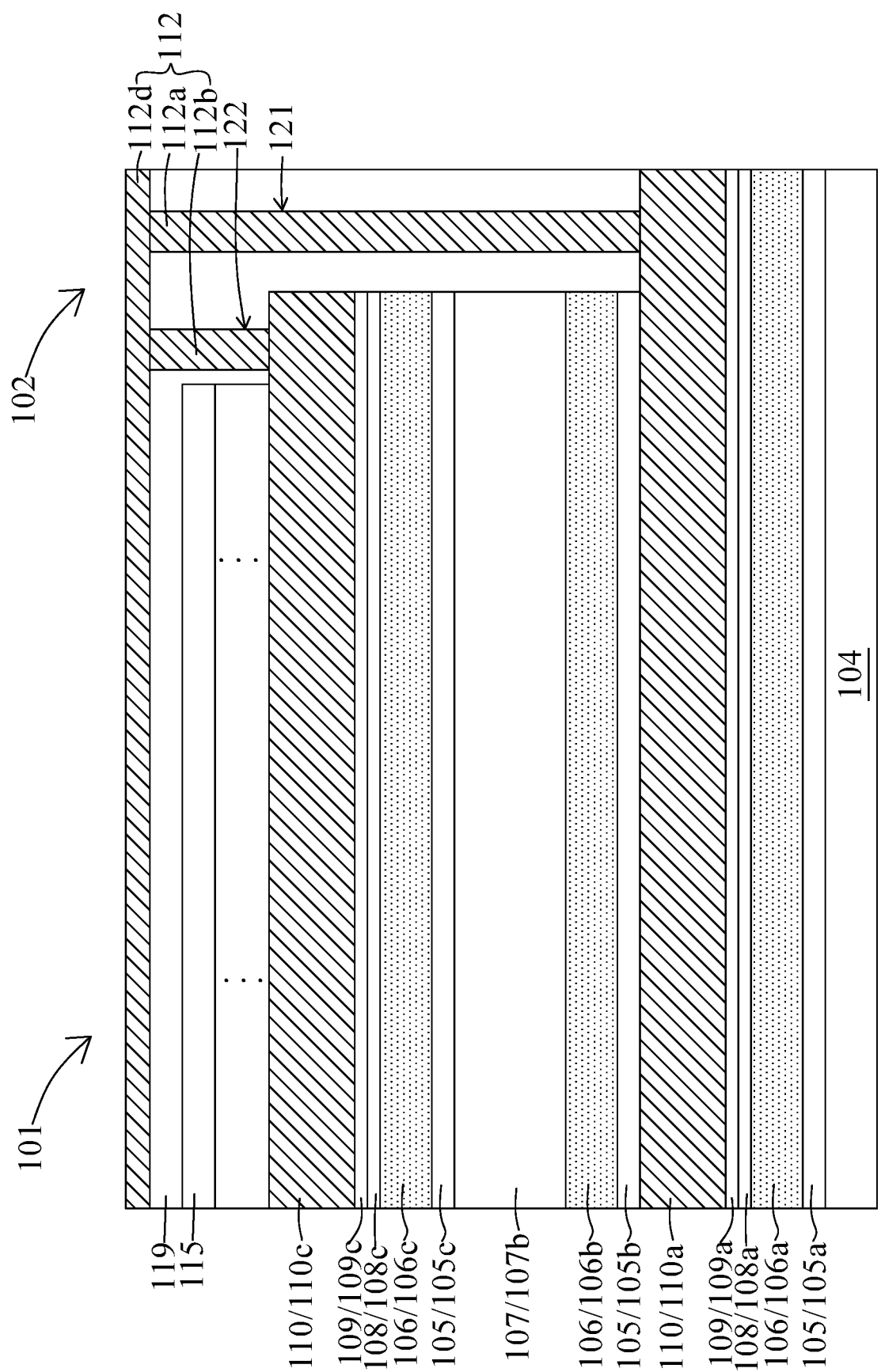
Figure 39:
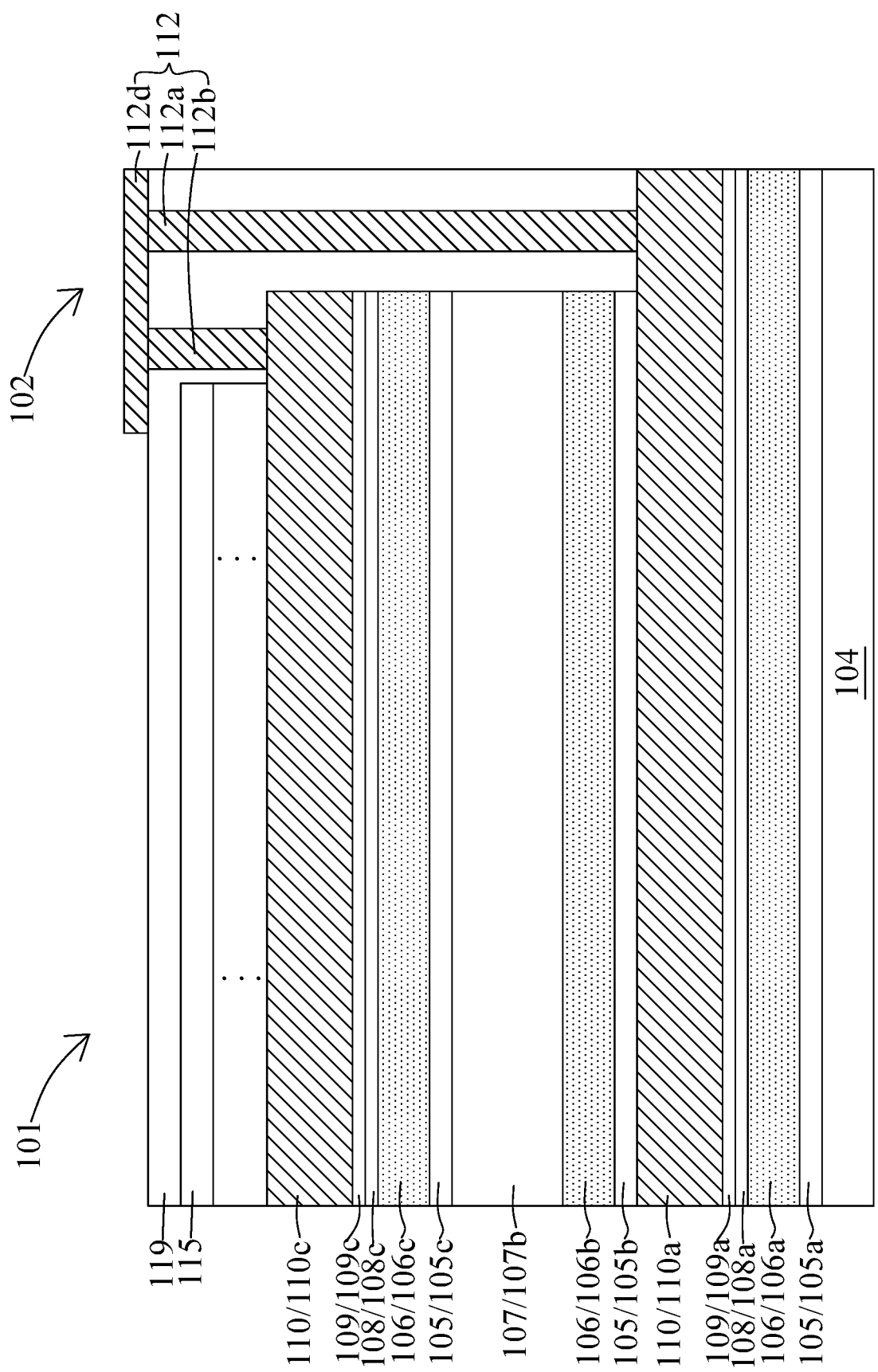

Referring to FIGS. 38 and 39, a first conductive plug 112a extending through the dielectric material 119 and contacting the first top electrode 110a is formed according to step S305 in FIG. 29. In some embodiments, a second conductive plug 112b extending through the dielectric material 119 and contacting the third top electrode 110c is also formed. In some embodiments, the first conductive plug 112a and the second conductive plug 112b are formed by disposing a conductive material into the first trench 121 and the second trench 122. In some embodiments, a top electrode plate 112d is also formed on the first conductive plug 112a and the second conductive plug 112b.

In some embodiments, the top electrode plate 112d is formed by disposing the conductive material over the dielectric material 119 as shown in FIG. 38, and then removing some portions of the conductive material as shown in FIG. 39. In some embodiments, the conductive material includes copper or the like. In some embodiments, the conductive material is disposed by electroplating or any other suitable process. In some embodiments, the top electrode plate 112d is electrically connected to the first top electrode 110a and the third top electrode 110c through the first conductive plug 112a and the second conductive plug 112b, respectively. In some embodiments, a memory device 100 as shown in FIG. 3 is formed as shown in FIG. 39, which is a cross-sectional view of the memory device 100 along the line B-B of FIG. 1.

Figure 40:
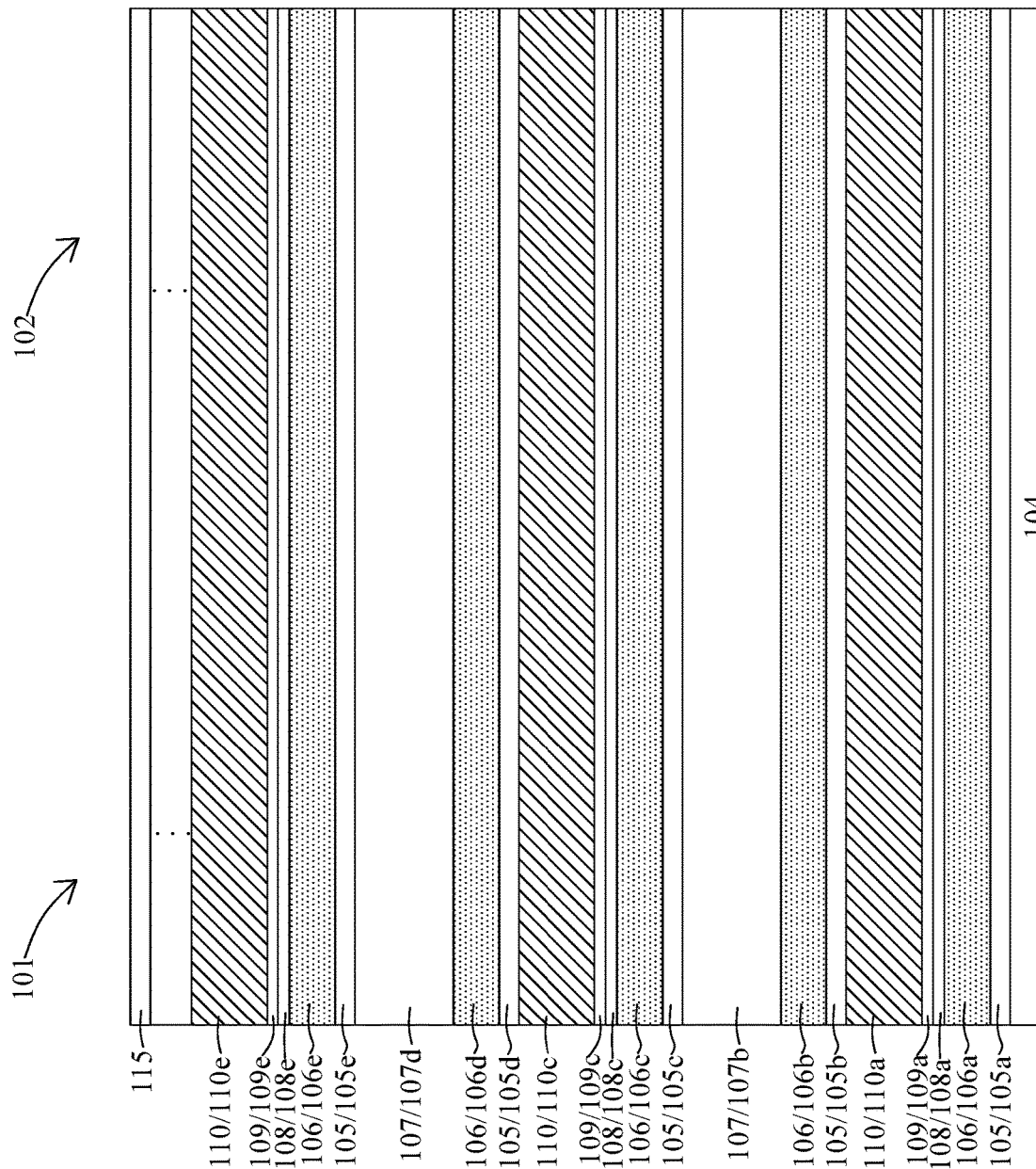
FIGS. 40 to 47 illustrate cross-sectional views of intermediate stages in formation of the memory device of FIG. 4 in accordance with some embodiments of the present disclosure.
Figure 41:
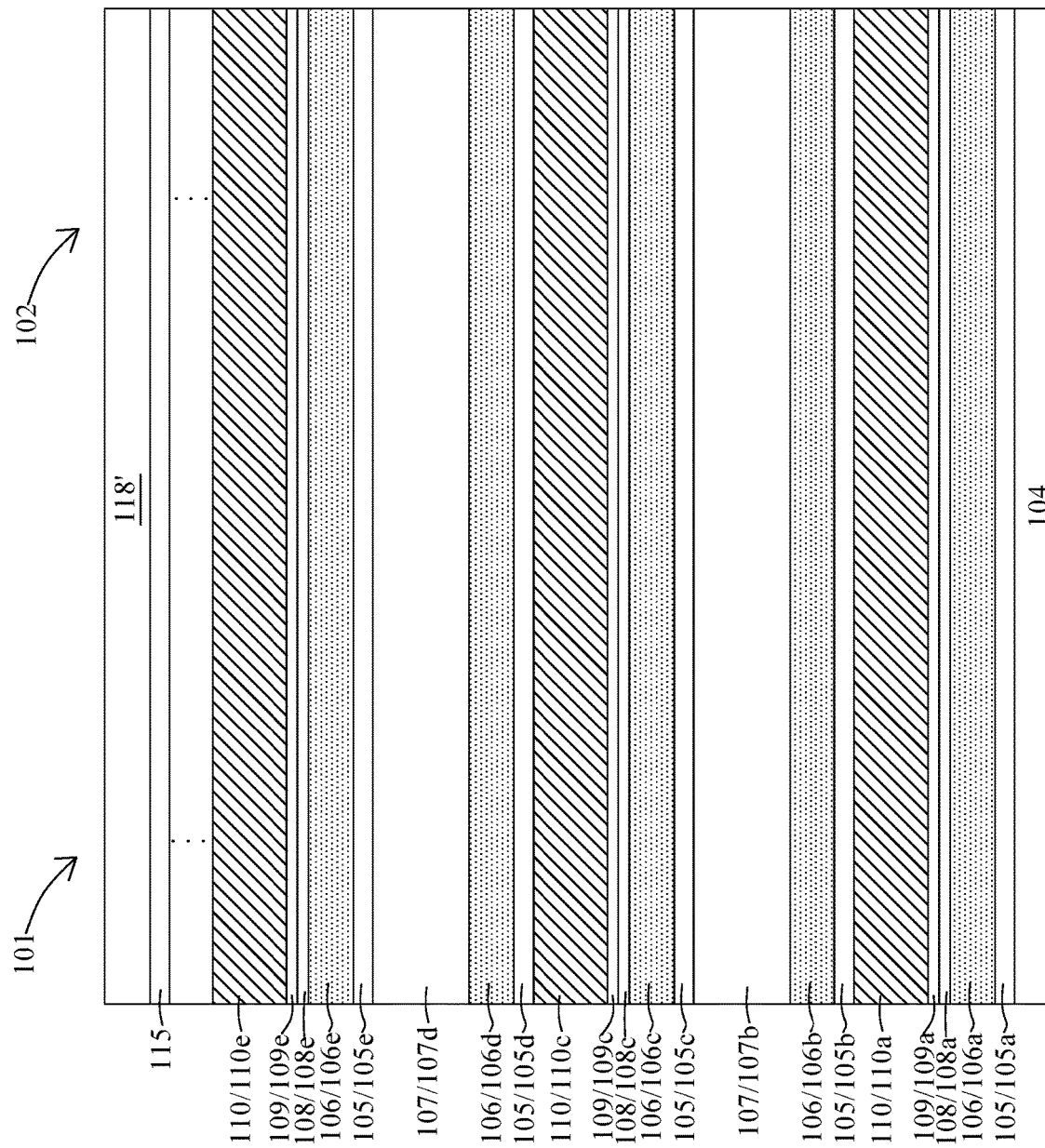
Figure 42:
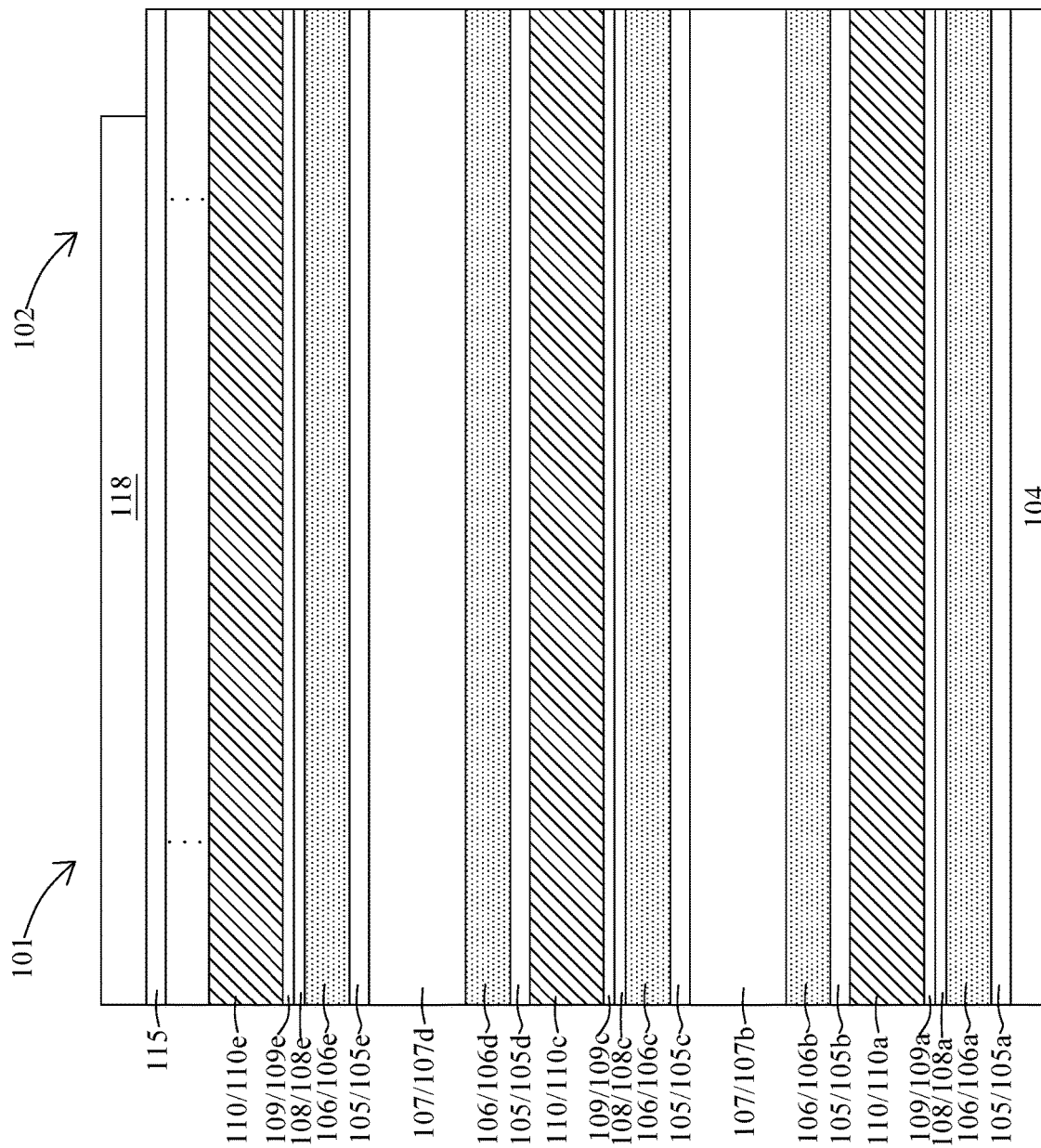

Referring to FIGS. 40 to 47, steps for forming the memory device 100 as shown in FIG. 4 are similar to steps S301 to S305 of the method S300. In some embodiments, after the implementation of the method S200, an intermediate structure as shown in FIG. 40 is formed. FIG. 40 illustrates a cross-sectional view of the intermediate structure along the line B-B of FIG. 1. Referring to FIG. 41, a first photoresist layer 118' is disposed over the last insulating layer 115, in a step similar to step S301. Referring to FIG. 42, a first patterned photoresist layer 118 is formed, in a step similar to step S302.

Figure 43:
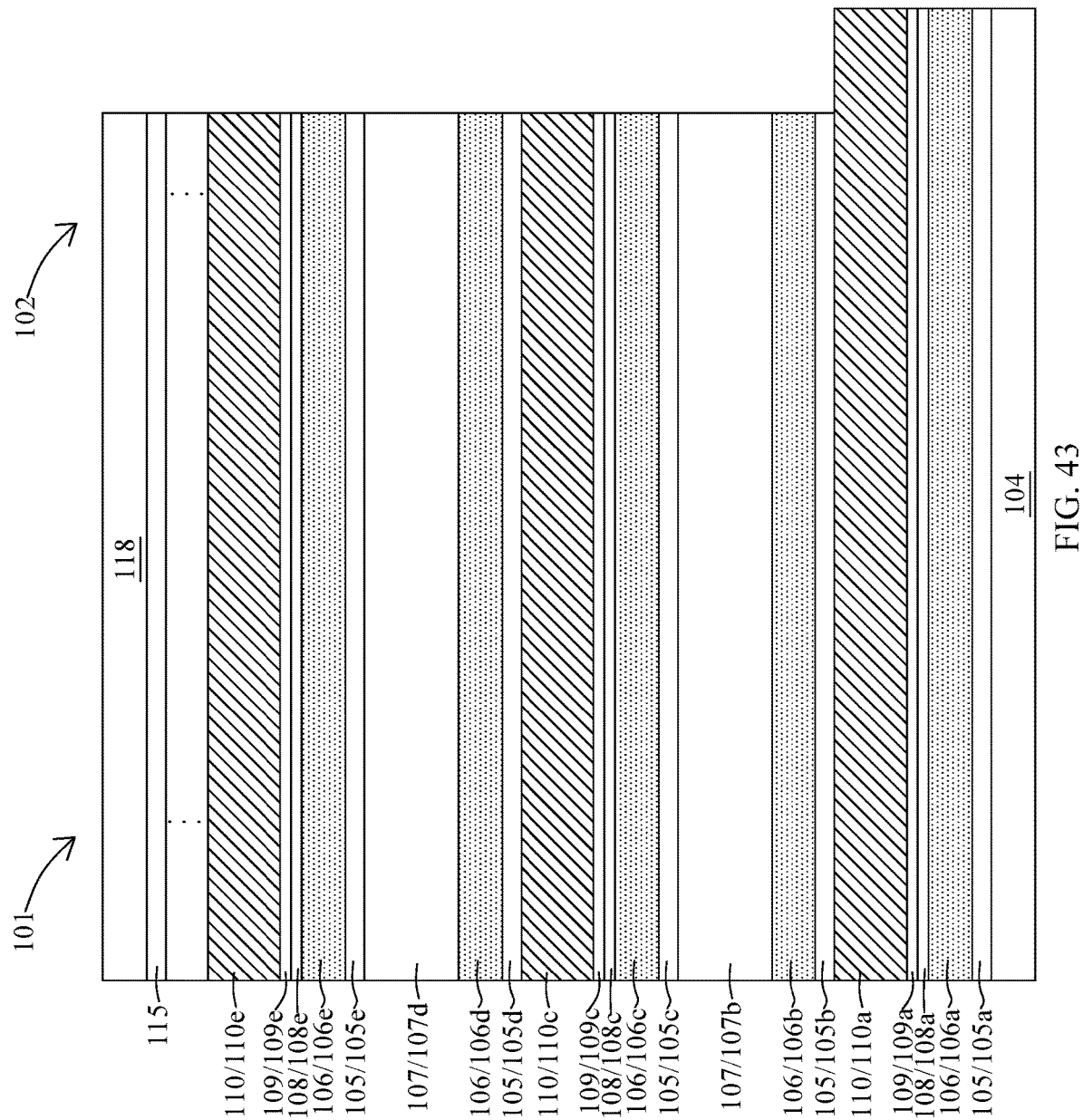
Figure 44:
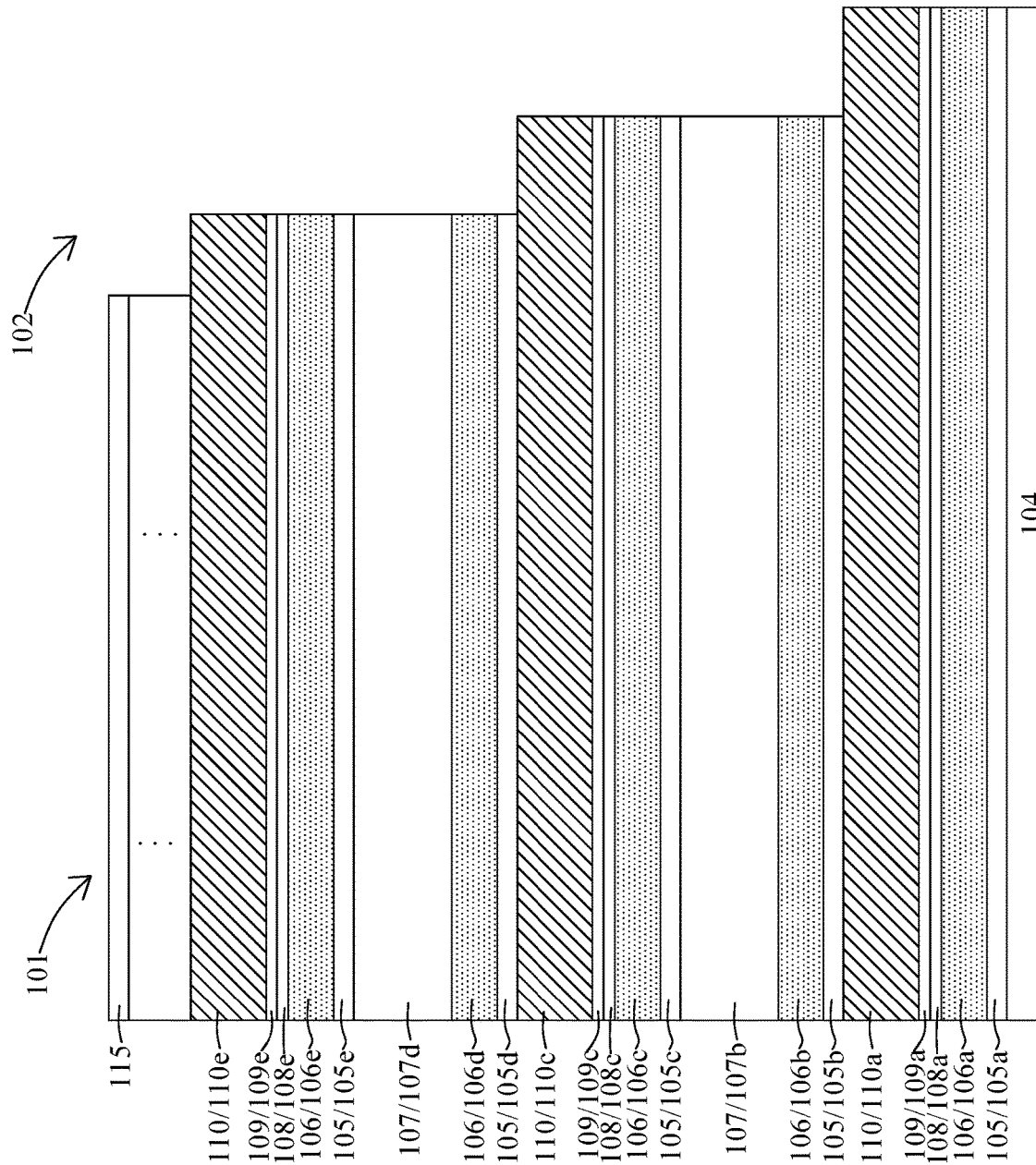

Referring to FIG. 43, portions of the second insulating layer 105b, the second bottom electrode 106b and the second dielectric layer 107b exposed through the first patterned photoresist layer 118 are removed to expose at least a portion of the first top electrode 110a, in a step similar to step S303. In some embodiments, steps similar to step S303 are repeated to form an intermediate structure as shown in FIG. 44. In some embodiments, the first top electrode 110a, the third top electrode 110c and the fifth top electrode 110e are at least partially exposed.

Figure 45:
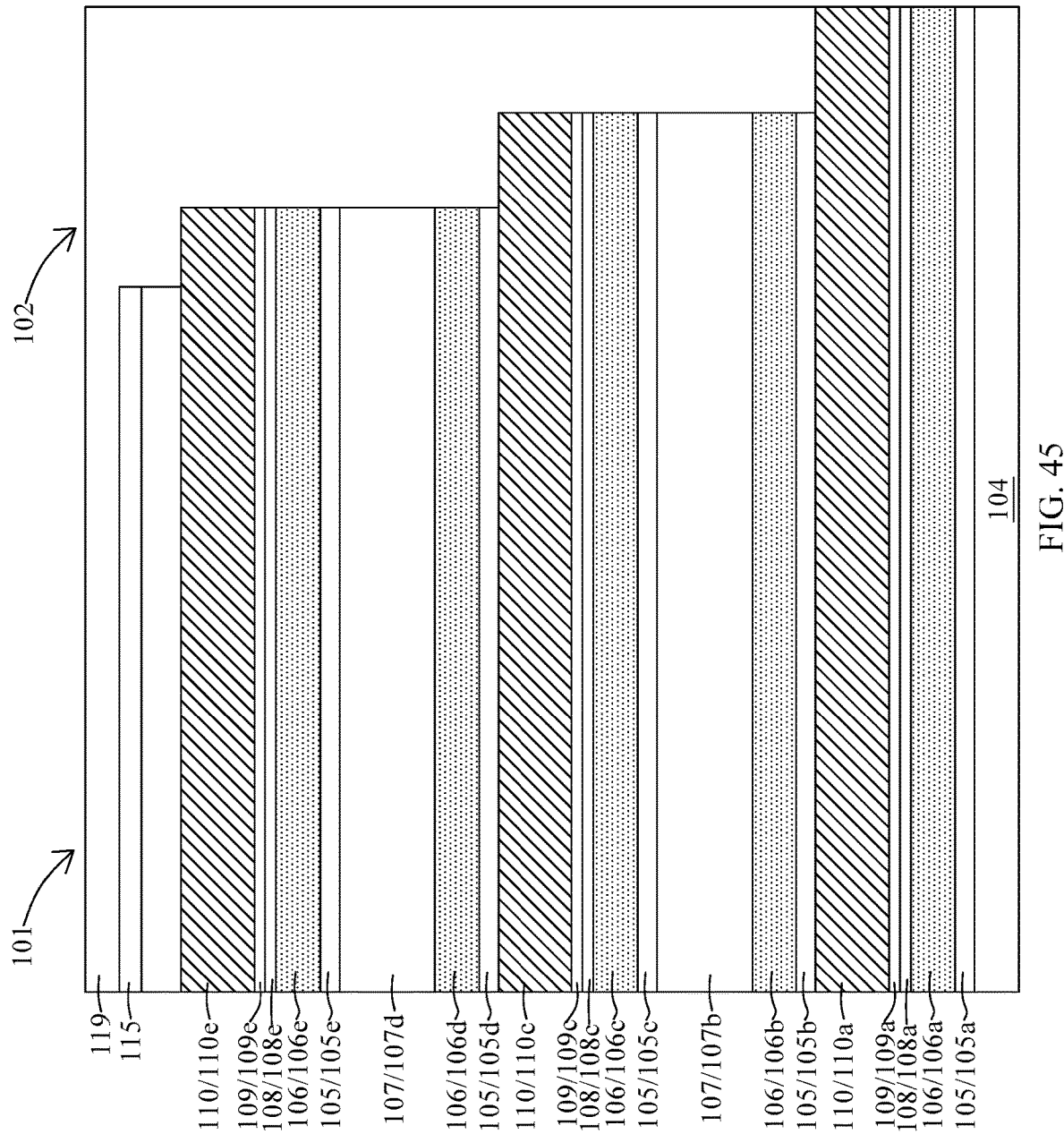
Figure 46:
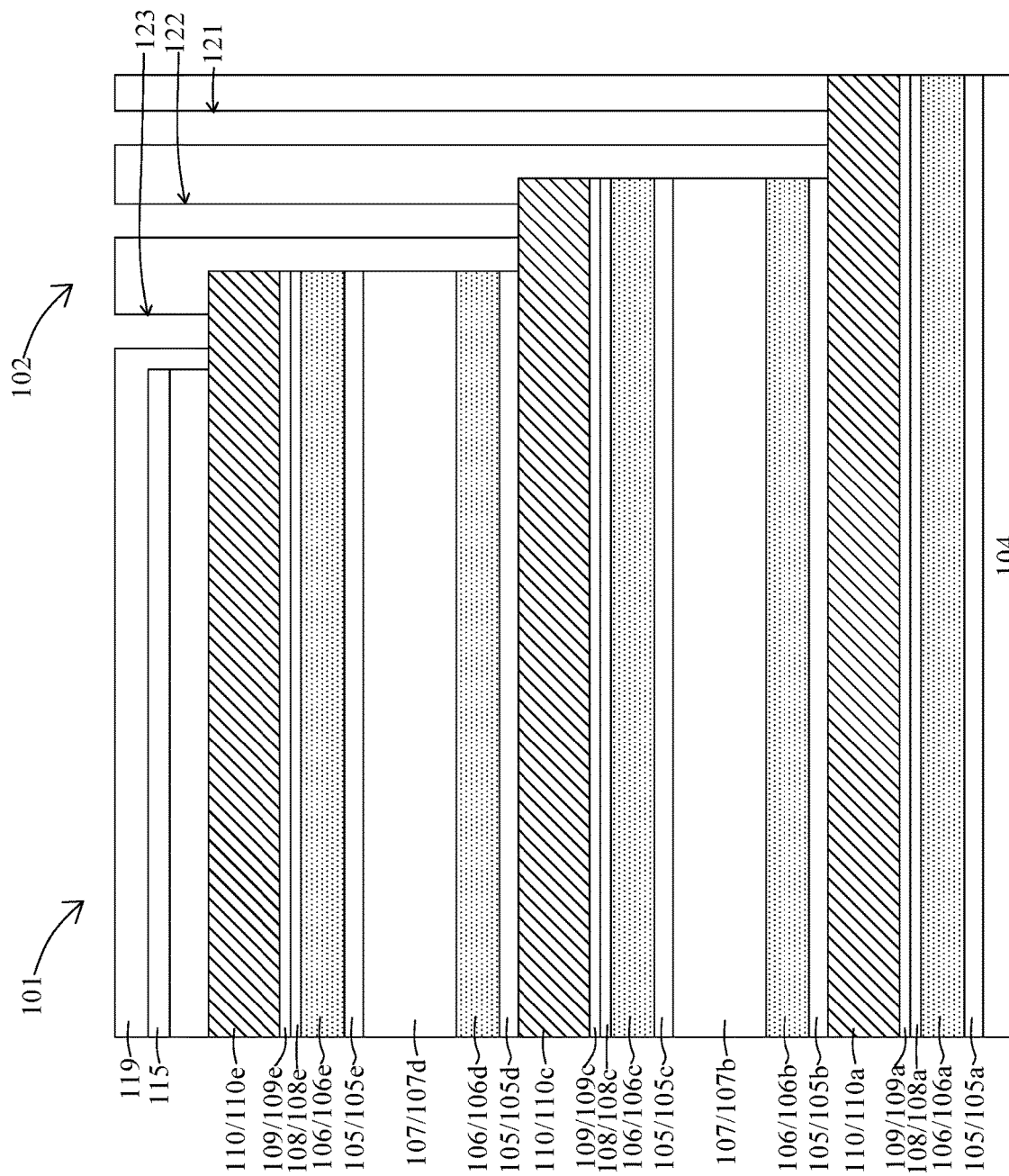
Figure 47:
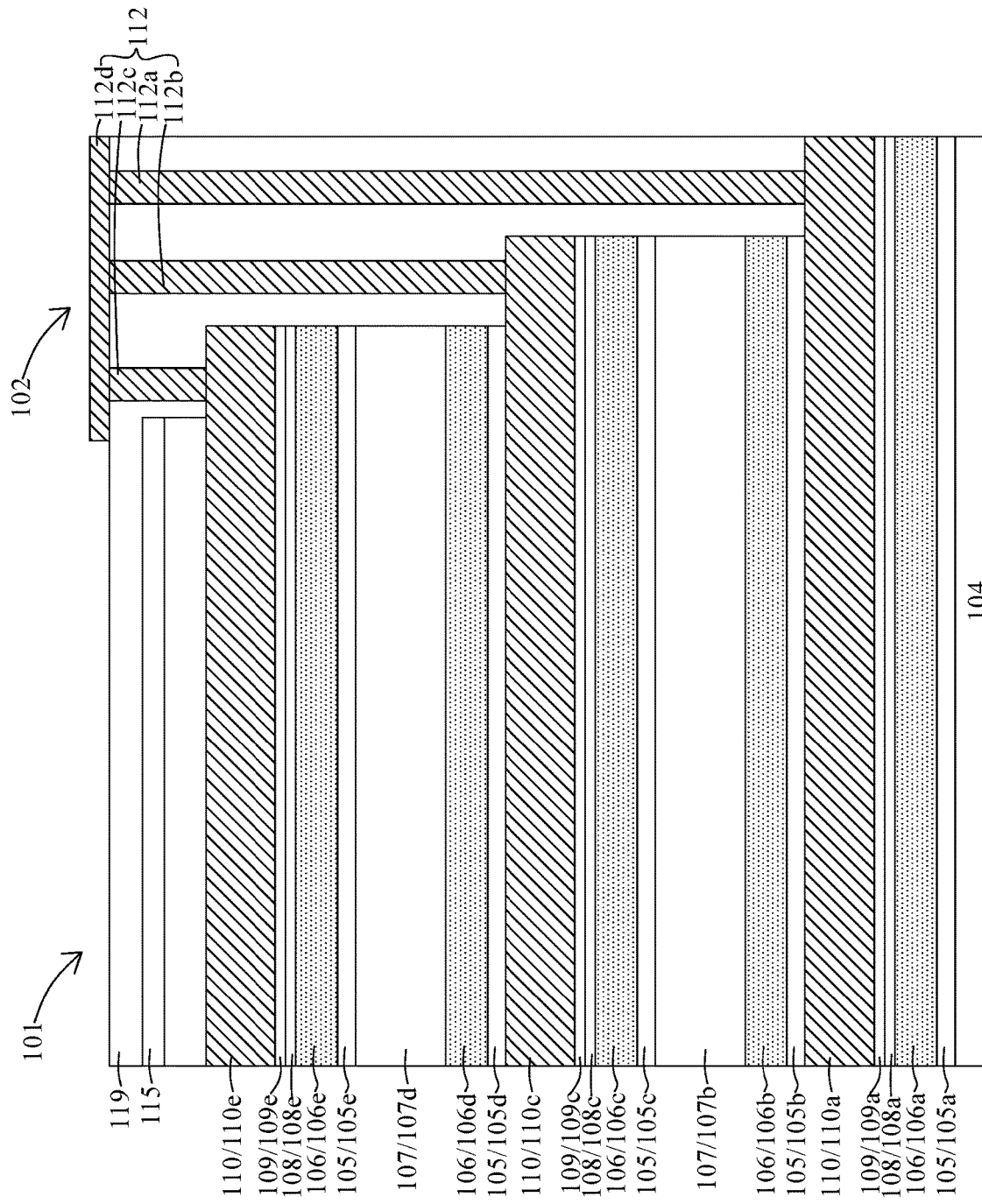

Referring to FIG. 45, a dielectric material 119 is disposed over the last insulating layer 115, the first top electrode 110a, the third top electrode 110c and the fifth top electrode 110e, in a step similar to step S304. Referring to FIG. 46, portions of the dielectric material 119 are removed to form a first trench 121, a second trench 122 and a third trench 123 extending through the dielectric material 119. Referring to FIG. 47, a first conductive plug 112a extending through the dielectric material 119 and contacting the first top electrode 110a is formed, in a step similar to step S305.

In some embodiments, the second conductive plug 112b extending through the dielectric material 119 and contacting the third top electrode 110c and the third conductive plug 112c extending through the dielectric material 119 and contacting the fifth top electrode 110e are also formed. In some embodiments, a top electrode plate 112d contacting the first conductive plug 112a, the second conductive plug 112b and the third conductive plug 112c is formed over the dielectric material 119. In some embodiments, an intermediate structure of FIG. 4 is formed as shown in FIG. 47.

Figure 48:
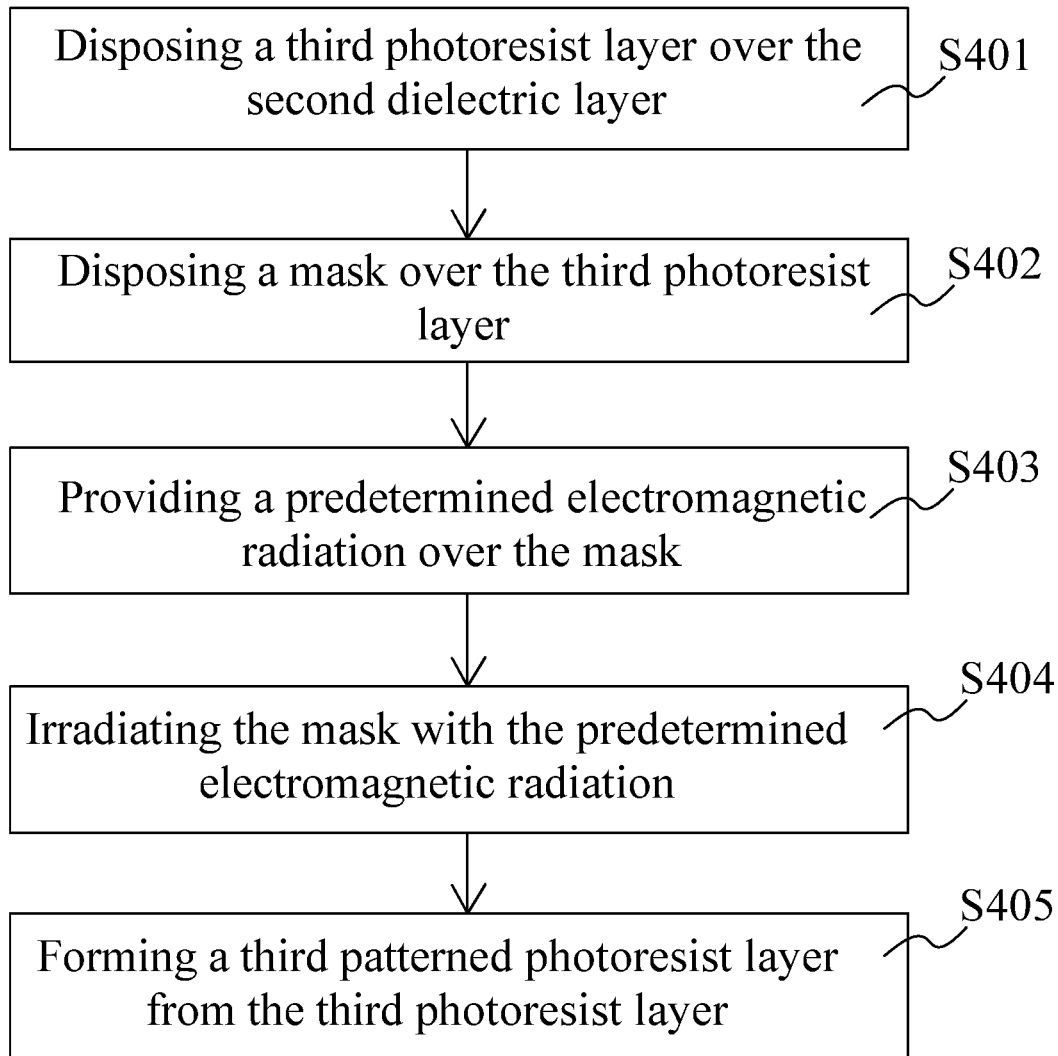
FIG. 48 is a flow diagram illustrating a method of manufacturing the memory device of FIG. 1 in accordance with some embodiments of the present disclosure.

FIG. 48 is a flow diagram illustrating a method S400 of manufacturing an intermediate structure of a memory device 100 in accordance with some embodiments of the present disclosure, and FIGS. 49 to 56 illustrate cross-sectional views of intermediate stages in formation of the intermediate structure of the memory device 100 as shown in FIG. 5, which is a cross-sectional side view of the memory device of FIG. 1 along the line C-C in accordance with some embodiments of the present disclosure.

The stages shown in FIGS. 49 to 56 are also illustrated schematically in the flow diagram in FIG. 48. In following discussion, the fabrication stages shown in FIGS. 49 to 56 are discussed in reference to process steps shown in FIG. 48. The method S400 includes a number of operations, and description and illustration are not deemed as a limitation to a sequence of the operations. The method S400 includes a number of steps (S401, S402, S403, S404 and S405).

Figure 49:
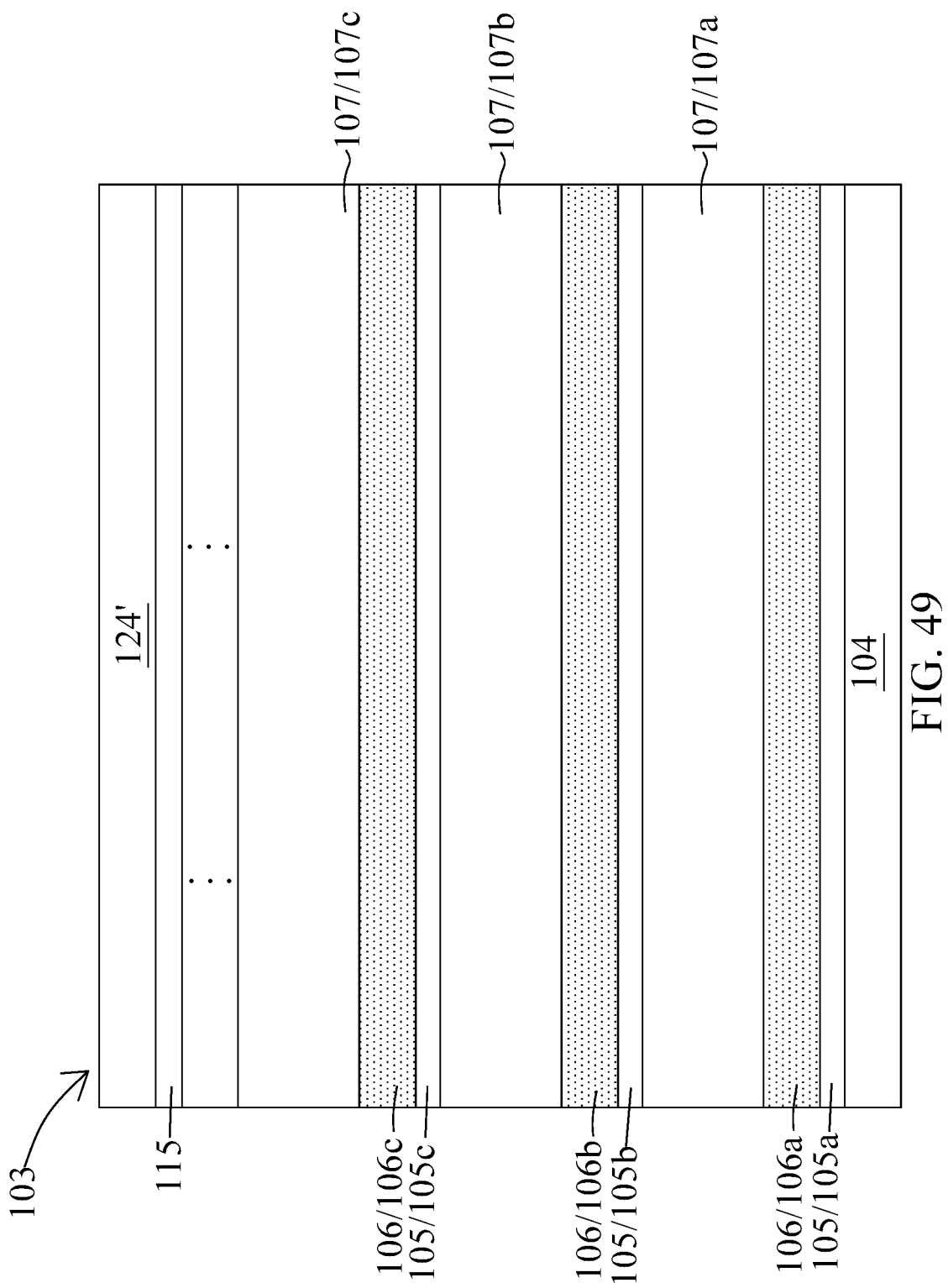
FIGS. 49 to 56 illustrate cross-sectional views of intermediate stages in the formation of the memory device of FIG. 1 along a line C-C in accordance with some embodiments of the present disclosure.

In some embodiments, the method S400 is implemented after the method S200 or after repetition of the method S200 as described above. In some embodiments, the method S400 is implemented after the formation of the intermediate structure as shown in FIGS. 27 and 28. Referring to FIG. 49, a third photoresist layer 124' is disposed over the second dielectric layer 107b, the second insulating layer 105b and the last insulating layer 115 according to step S401 in FIG. 48. In some embodiments, the third photoresist layer 124' is disposed by spin coating or any other suitable process.

Figure 50:
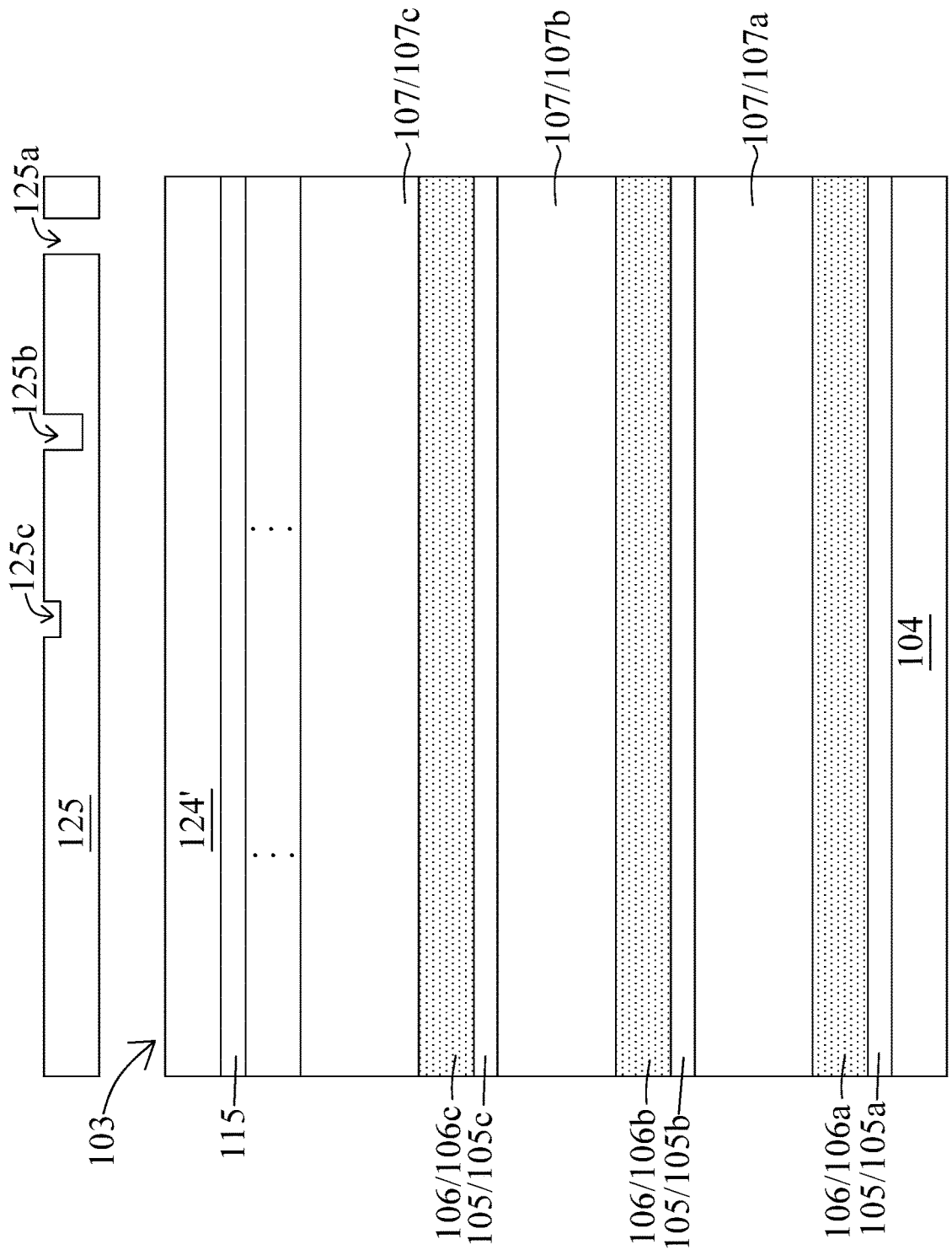

Referring to FIG. 50, a mask 125 is disposed over the third photoresist layer 124' according to step S402 in FIG. 48. In some embodiments, an exposure process and a develop process are applied to the third photoresist layer 124' with the use of the mask 125.

Figure 51:
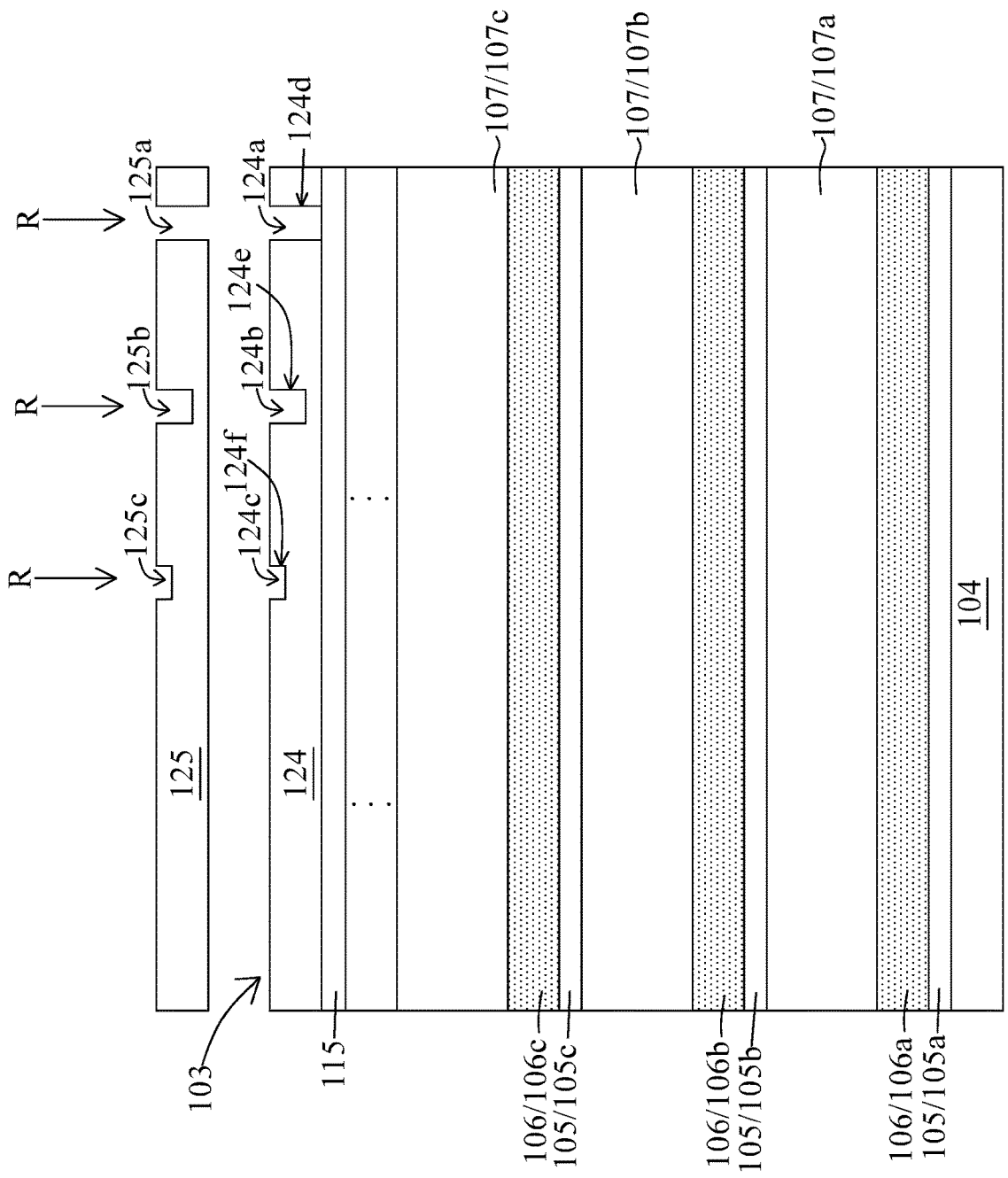

In some embodiments, the mask 125 includes a first region 125a, a second region 125b and a third region 125c. In some embodiments, the first region 125a has a first transmission rate equal to an amount of a predetermined electromagnetic radiation R (as shown in FIG. 51) allowed to pass through the first region 125a. In some embodiments, the second region 125b has a second transmission rate equal to an amount of the predetermined electromagnetic radiation R (as shown in FIG. 51) allowed to pass through the second region 125b. In some embodiments, the third region 125c has a third transmission rate equal to an amount of the predetermined electromagnetic radiation R (as shown in FIG. 51) allowed to pass through the third region 125c.

In some embodiments, the first transmission rate is substantially different from the second transmission rate. In some embodiments, the first transmission rate is substantially different from the third transmission rate. In some embodiments, the first transmission rate is substantially greater than the second transmission rate. In some embodiments, the first transmission rate is substantially greater than the third transmission rate. In some embodiments, the second transmission rate is substantially greater than the third transmission rate.

In some embodiments, the first transmission rate is about 100%. That is, the predetermined electromagnetic radiation R can completely pass through the mask 125 via the first region 125a. In some embodiments, the second transmission rate and the third transmission rate are less than 100%. That is, the predetermined electromagnetic radiation R can only partially pass through the mask 125 via the second region 125b and the third region 125c. In some embodiments, the first region 125a is a through hole, while the second region 125b and the third region 125c are partial through holes.

Referring to FIG. 51, the predetermined electromagnetic radiation R is provided over the mask 125 according to step S403. In some embodiments, the predetermined electromagnetic radiation R is ultraviolet (UV) light, light or the like. Referring to FIG. 51, the mask 125 is irradiated with the predetermined electromagnetic radiation R according to step S404. In some embodiments, different portions of the third photoresist layer 124' are exposed to different amount of the predetermined electromagnetic radiation R. In some embodiments, a fourth region 124a of the third photoresist layer 124' vertically aligned with the first region 125a of the mask 125 receives the predetermined electromagnetic radiation R completely passing through the first region 125a. In some embodiments, the fourth region 124a of the third photoresist layer 124' is exposed to 100% or nearly 100% of the predetermined electromagnetic radiation R.

In some embodiments, a fifth region 124b of the third photoresist layer 124' vertically aligned with the second region 125b of the mask 125 receives the predetermined electromagnetic radiation R partially passing through the second region 125b. In some embodiments, the fifth region 124b of the third photoresist layer 124' is exposed to less than 100% of the predetermined electromagnetic radiation R.

In some embodiments, a sixth region 124c of the third photoresist layer 124' vertically aligned with the third region 125c of the mask 125 receives the predetermined electromagnetic radiation R partially passing through the third region 125c. In some embodiments, the sixth region 124c of the third photoresist layer 124' is exposed to less than 100% of the predetermined electromagnetic radiation R.

In some embodiments, a remaining portion of the third photoresist layer 124' does not receive any predetermined electromagnetic radiation R. In some embodiments, the remaining portion of the third photoresist layer 124' is exposed to 0%, or substantially none, of the predetermined electromagnetic radiation R.

Figure 52:
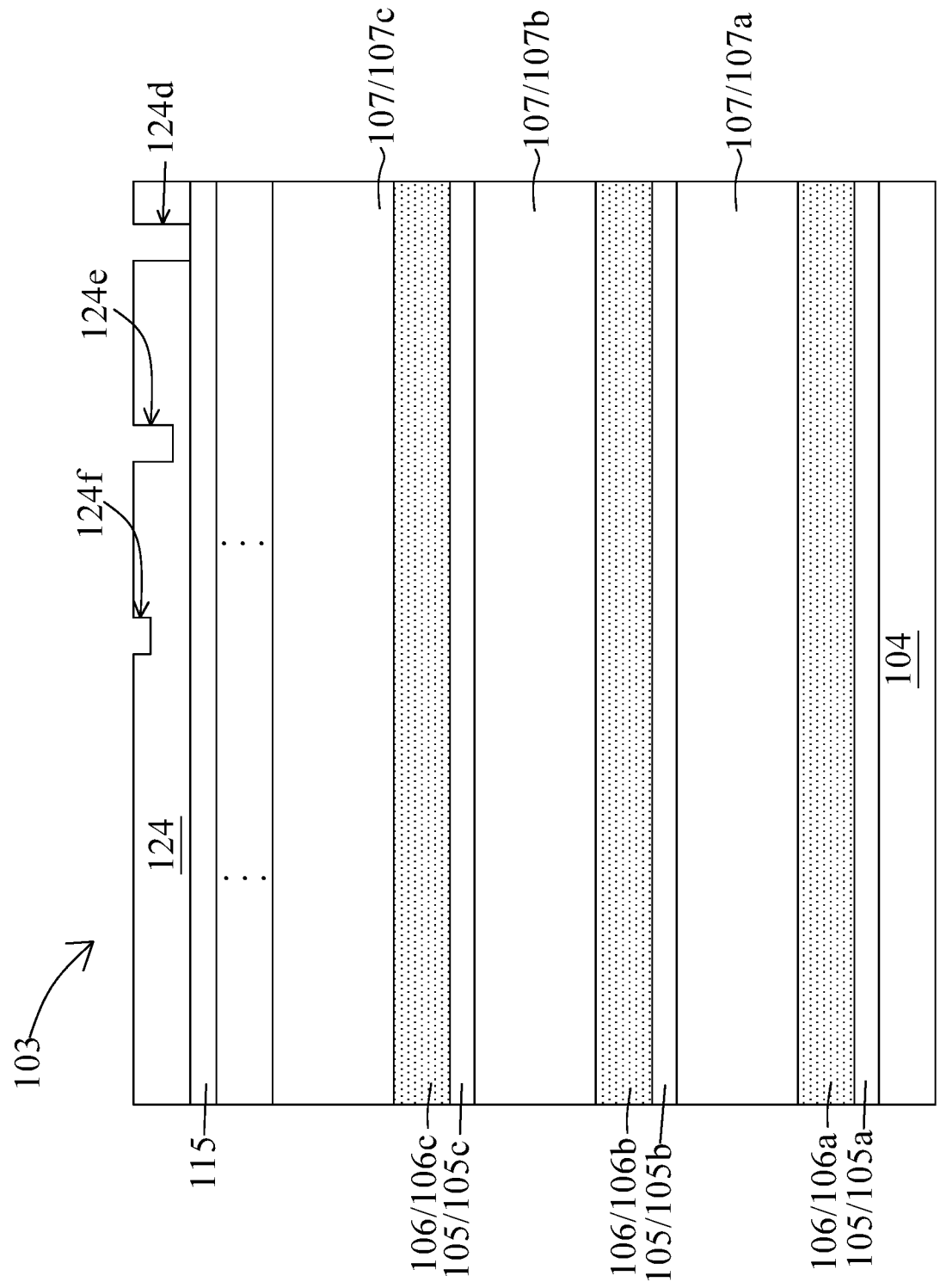

Referring to FIG. 51, a third patterned photoresist layer 124 is formed from the third photoresist layer 124' according to step S405. In some embodiments, after the irradiation of the mask 125 with the predetermined electromagnetic radiation R, the portions of the third photoresist layer 124' exposed to the predetermined electromagnetic radiation R are removed to form the third patterned photoresist layer 124. In some embodiments, the portions of the third photoresist layer 124' are removed by etching or any other suitable process. In some embodiments, after the removal, the third patterned photoresist layer 124 having a fourth recess 124d, a fifth recess 124e and a sixth recess 124f is formed as shown in FIG. 51. In some embodiments, the mask 125 is removed after the formation of the third patterned photoresist layer 124 as shown in FIG. 52.

Figure 53:
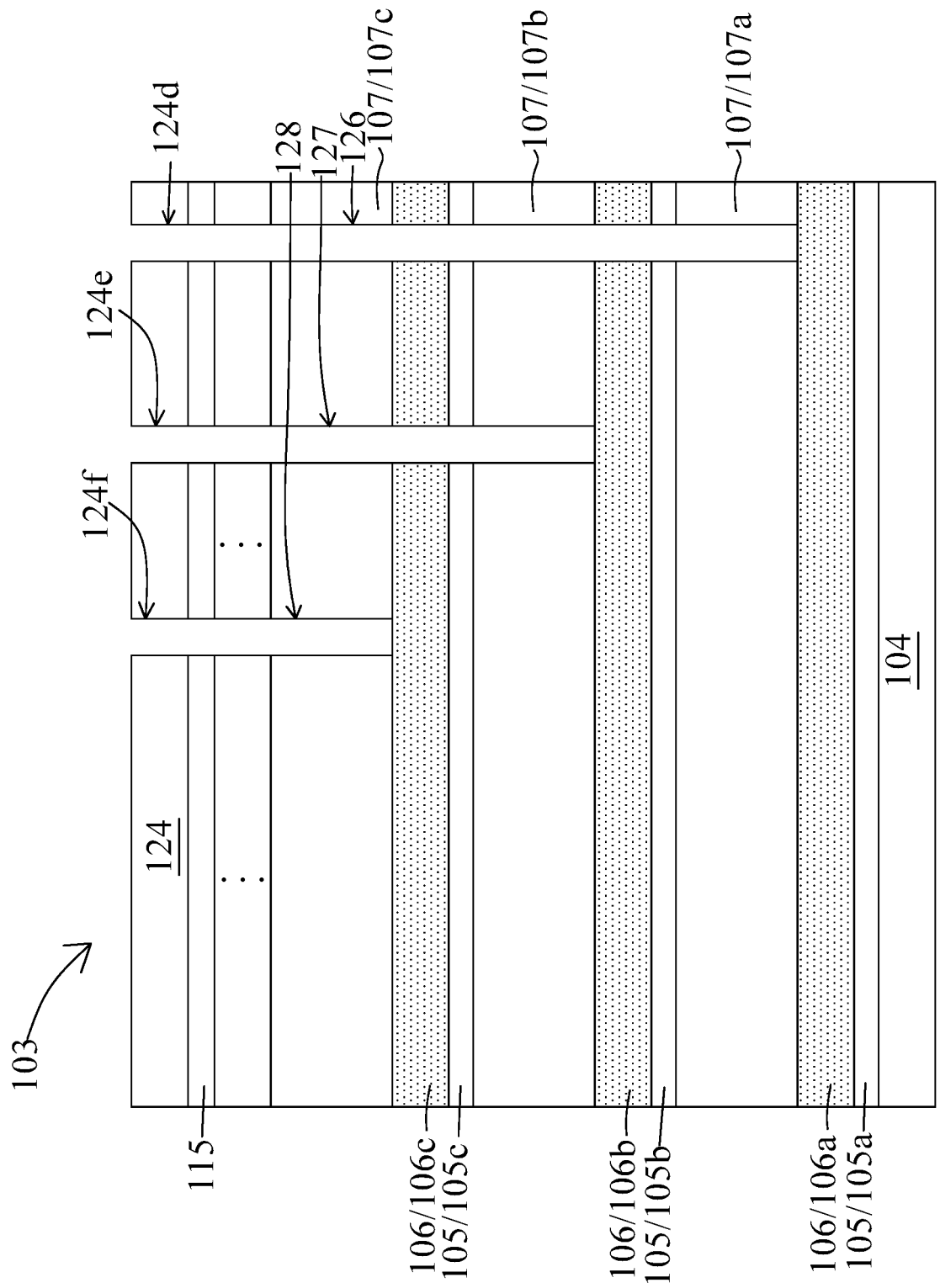

Referring to FIG. 53, portions of the first dielectric layer 107a, the second insulating layer 105b, the second bottom electrode 106b, the second dielectric layer 107b, the third insulating layer 105c, the third bottom electrode 106c, the third dielectric layer 107c and the last insulating layer 115 under the fourth recess 124d are removed to form a fourth trench 126 exposing a portion of the first bottom electrode 106a.

Figure 54:
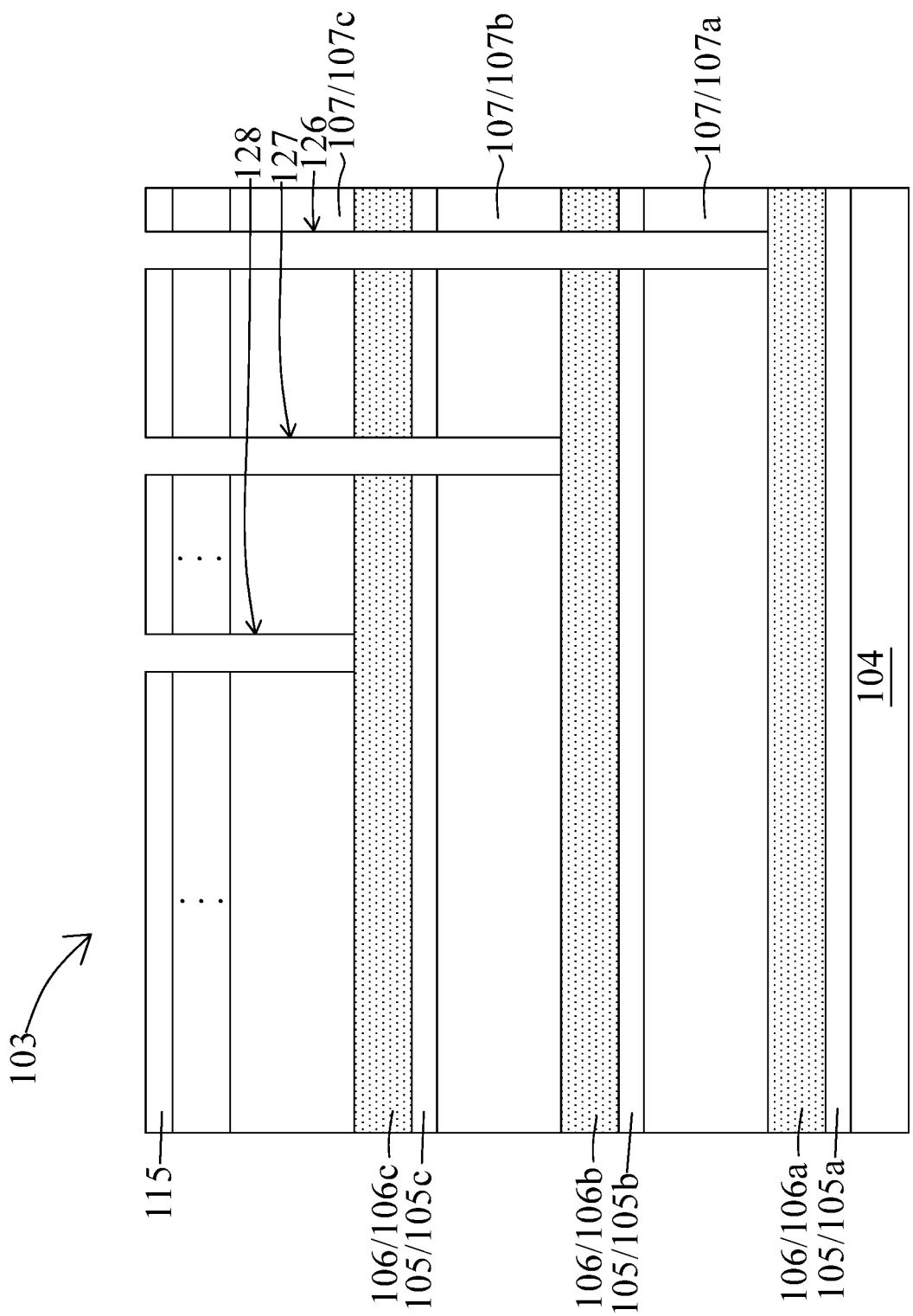

In some embodiments, portions of the second dielectric layer 107b, the third insulating layer 105c, the third bottom electrode 106c, the third dielectric layer 107c and the last insulating layer 115 under the fifth recess 124e are removed to form a fifth trench 127 exposing a portion of the second bottom electrode 106b. In some embodiments, portions of the third dielectric layer 107c and the last insulating layer 115 under the sixth recess 124f are removed to form a sixth trench 128 exposing a portion of the third bottom electrode 106c. Referring to FIG. 54, after the formation of the fourth trench 126, the fifth trench 127 and the sixth trench 128, the third patterned photoresist layer 124 is removed by stripping, etching or any other suitable process.

Figure 55:
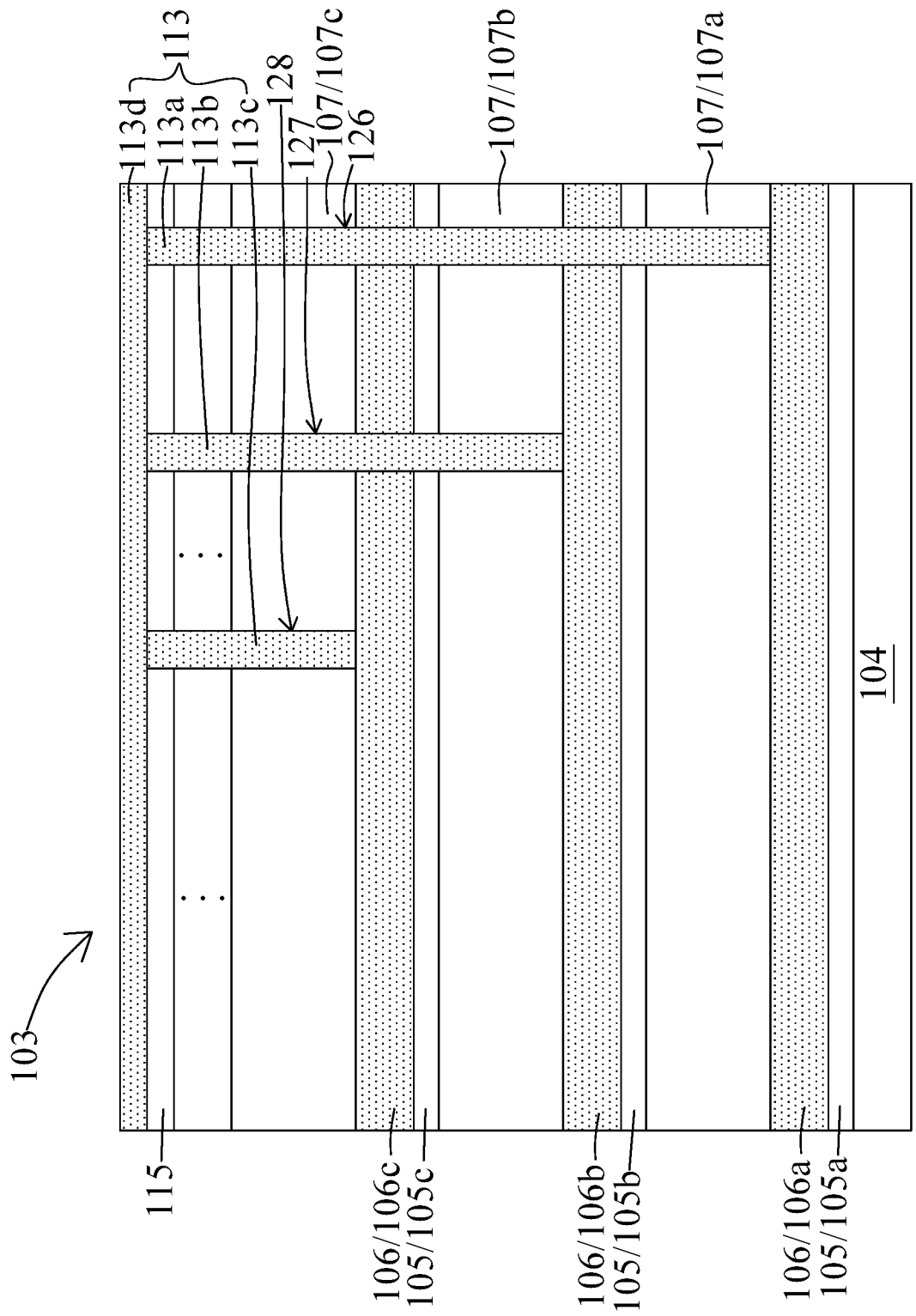
Figure 56:
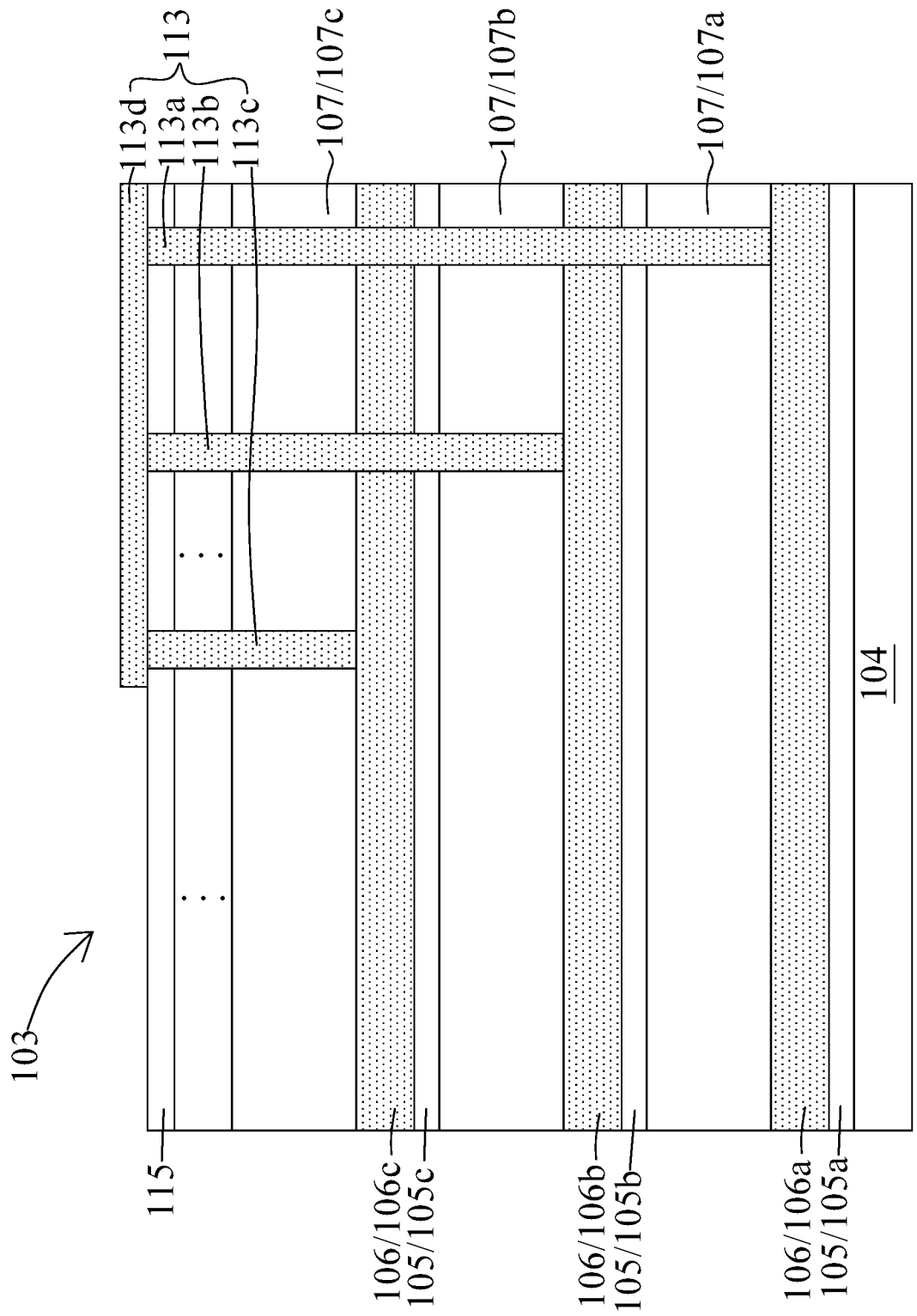

Referring to FIGS. 55 and 56, a conductive material is disposed within the fourth trench 126, the fifth trench 127 and the sixth trench 128 to form a fourth conductive plug 113a, a fifth conductive plug 113b and a sixth conductive plug 113c, respectively. In some embodiments, the conductive material is disposed by electroplating or any other suitable process. In some embodiments, the conductive material includes copper or the like.

In some embodiments, the conductive material is also disposed over the last insulating layer 115 as shown in FIG. 55, and then a portion of the conductive material disposed over the last insulating layer 115 is removed to form a bottom electrode plate 113d as shown in FIG. 56. In some embodiments, the bottom electrode plate 113d is formed on the fourth conductive plug 113a, the fifth conductive plug 113b and the sixth conductive plug 113c. In some embodiments, the bottom electrode plate 113d is electrically connected to the first bottom electrode 106a, the second bottom electrode 106b and the third bottom electrode 106c through the fourth conductive plug 113a, the fifth conductive plug 113b and the sixth conductive plug 113c. In some embodiments, a memory device 100 as shown in FIG. 5 is formed as shown in FIG. 56, which illustrates a cross-sectional view of the memory device 100 along the line C-C of FIG. 1.

In an aspect of the present disclosure, a memory device is provided. The memory device includes a semiconductor substrate; a first insulating layer disposed over the semiconductor substrate; a first bottom electrode disposed over the first insulating layer; a first dielectric layer disposed over the first bottom electrode; a first recess extending through the first dielectric layer; a first capacitor dielectric conformal to the first recess and in contact with the first bottom electrode; and a first top electrode disposed within the first recess and surrounded by the first capacitor dielectric, wherein the first capacitor dielectric and the first top electrode extend laterally over the first bottom electrode and the semiconductor substrate.

In another aspect of the present disclosure, a memory device is provided. The memory device includes a semiconductor substrate; a first insulating layer disposed over the semiconductor substrate; a first bottom electrode disposed over the first insulating layer; a first dielectric layer disposed over the first bottom electrode; a first recess extending through the first dielectric layer; a second recess extending through the first dielectric layer; a first capacitor dielectric conformal to the first recess and in contact with the first bottom electrode; a second capacitor dielectric conformal to the second recess and in contact with the first bottom electrode; a first top electrode disposed within the first recess and surrounded by the first capacitor dielectric; and a second top electrode disposed within the second recess and surrounded by the second capacitor dielectric, wherein the first capacitor dielectric, the first top electrode, the second capacitor dielectric and the second top electrode extend laterally over the first bottom electrode and the semiconductor substrate.

In another aspect of the present disclosure, a method of manufacturing a memory device is provided. The method includes steps of providing a semiconductor substrate; disposing a first insulating layer over the semiconductor substrate; disposing a first bottom electrode over the first insulating layer; disposing a first dielectric layer over the first bottom electrode; removing a portion of the first dielectric layer to form a first recess extending through the first dielectric layer; disposing a first capacitor dielectric conformal to the first recess and over the first bottom electrode; and forming a first top electrode within the first recess and surrounded by the first capacitor dielectric, wherein the first capacitor dielectric and the first top electrode extend laterally over the first bottom electrode and the semiconductor substrate.

In conclusion, because each capacitor of the present disclosure extends laterally over a semiconductor substrate instead of standing upright above the semiconductor substrate, collapse of the capacitors can be prevented. Further, top electrodes of the capacitors arranged in different levels and vertically aligned with each other are configured in different lengths, and bottom electrodes of the capacitors extend over the semiconductor substrate and are configured in planar shapes. As such, all of the capacitors can be electrically connected in parallel instead of in series. Performance of a memory device and a process of manufacturing the memory device are thereby improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
    providing a semiconductor substrate;
    disposing a first insulating layer over the semiconductor substrate;
    disposing a first bottom electrode over the first insulating layer;
    disposing a first dielectric layer over the first bottom electrode;
    removing a portion of the first dielectric layer to form a first recess extending through the first dielectric layer;
    disposing a first capacitor dielectric conformal to the first recess and over the first bottom electrode; and
    forming a first top electrode within the first recess and surrounded by the first capacitor dielectric;
    disposing a second insulating layer over the first top electrode and the first dielectric layer;
    disposing a second bottom electrode over the second insulating layer;
    disposing a second dielectric layer over the second bottom electrode;
    removing a portion of the second dielectric layer to form a second recess extending through the second dielectric layer;
    disposing a second capacitor dielectric conformal to the second recess and over the second bottom electrode; and forming a second top electrode within the second recess and surrounded by the second capacitor dielectric, wherein the second capacitor dielectric and the second top electrode extend laterally over the second bottom electrode and the semiconductor substrate;

wherein the first capacitor dielectric and the first top electrode extend laterally over the first bottom electrode and the semiconductor substrate.

2. The method according to claim 1, wherein the disposing of the first capacitor dielectric includes disposing a first nitride liner conformal to the first recess, and then disposing a first high-k liner over the first nitride liner.

3. The method according to claim 1, wherein the removal of the portion of the first dielectric layer includes removing a first portion of the first dielectric layer to form an opening partially through the first dielectric layer, and then removing a second portion of the first dielectric layer exposed through the opening to form the first recess.

4. The method according to claim 1, wherein the second portion of the first dielectric layer is removed by an isotropic wet etching process.

5. The method according to claim 1, wherein at least a portion of the first bottom electrode is exposed through the first dielectric layer after the formation of the first recess.

6. The method according to claim 1, wherein the portion of the second dielectric layer is offset from the portion of the first dielectric layer, and the first recess is offset from the second recess.

7. The method according to claim 1, further comprising disposing a first patterned photoresist layer over the second insulating layer, and removing portions of the second insulating layer, the second bottom electrode and the second dielectric layer exposed through the first patterned photoresist layer to expose at least a portion of the first top electrode.

8. The method according to claim 7, further comprising:
disposing a dielectric material over the portion of the first top electrode;
forming a conductive plug extending through the dielectric material and contacting the first top electrode.

9. The method according to claim 1, further comprising:
disposing a second photoresist layer over the second dielectric layer;
disposing a mask over the second photoresist layer;
providing a predetermined electromagnetic radiation over the mask;
irradiating the mask with the predetermined electromagnetic radiation;
forming a second patterned photoresist layer from the second photoresist layer.

10. The method according to claim 9, wherein the predetermined electromagnetic radiation is ultraviolet (UV).

11. The method according to claim 9, wherein the mask includes a first region having a first transmission rate equal to an amount of the predetermined electromagnetic radiation allowed to pass through the first region, and a second region having a second transmission rate equal to an amount of the predetermined electromagnetic radiation allowed to pass through the second region, wherein the first transmission rate is substantially different from the second transmission rate.

12. The method according to claim 11, wherein the first transmission rate is substantially greater than the second transmission rate.

13. The method according to claim 11, wherein the formation of the second patterned photoresist layer includes removing a portion of the second photoresist layer under the first region of the mask to form a third recess and removing another portion of the second photoresist layer under the second region of the mask to form a fourth recess.

14. The method according to claim 13, further comprising removing portions of the first dielectric layer, the second bottom electrode and the second dielectric layer under the third recess to form a first trench exposing a portion of the first bottom electrode, and removing a portion of the second dielectric layer under the fourth recess to form a second trench exposing a portion of the second bottom electrode.

* * * * *